US011869981B2

(12) United States Patent
Yamazaki et al.

(10) Patent No.: US 11,869,981 B2
(45) Date of Patent: Jan. 9, 2024

(54) SEMICONDUCTOR DEVICE, MANUFACTURING METHOD THEREOF, AND DISPLAY DEVICE INCLUDING THE SEMICONDUCTOR DEVICE

(71) Applicant: Semiconductor Energy Laboratory Co., Ltd., Atsugi (JP)

(72) Inventors: Shunpei Yamazaki, Setagaya (JP); Junichi Koezuka, Tochigi (JP); Kenichi Okazaki, Tochigi (JP); Yasutaka Nakazawa, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 2 days.

(21) Appl. No.: 17/579,857

(22) Filed: Jan. 20, 2022

(65) Prior Publication Data

US 2022/0140152 A1 May 5, 2022

Related U.S. Application Data

(60) Continuation of application No. 16/787,624, filed on Feb. 11, 2020, now Pat. No. 11,437,524, which is a
(Continued)

(30) Foreign Application Priority Data

Mar. 4, 2016 (JP) .................................. 2016-041739
Mar. 11, 2016 (JP) .................................. 2016-048706
(Continued)

(51) Int. Cl.
*H01L 29/786* (2006.01)
*G06F 3/041* (2006.01)
(Continued)

(52) U.S. Cl.
CPC ...... *H01L 29/78696* (2013.01); *G02F 1/1368* (2013.01); *G02F 1/13439* (2013.01);
(Continued)

(58) Field of Classification Search
CPC ..................... H01L 29/7869; H01L 29/78693
See application file for complete search history.

(56) References Cited

U.S. PATENT DOCUMENTS 5,731,856 A   3/1998  Kim et al.
5,744,864 A   4/1998  Cillessen et al.
(Continued)

FOREIGN PATENT DOCUMENTS

CN   101826559 A   9/2010
CN   103887345 A   6/2014
(Continued)

OTHER PUBLICATIONS

Taiwanese Office Action (Application No. 110146438) dated Jan. 25, 2022.
(Continued)

*Primary Examiner* — Peter M Albrecht
(74) *Attorney, Agent, or Firm* — ROBINSON INTELLECTUAL PROPERTY LAW OFFICE, P.C.; Eric J. Robinson

(57) ABSTRACT

The field-effect mobility and reliability of a transistor including an oxide semiconductor film are improved. One embodiment of the present invention is a semiconductor device which includes a gate electrode, an insulating film over the gate electrode, an oxide semiconductor film over the insulating film, and a pair of electrodes over the oxide semiconductor film. The oxide semiconductor film includes a first oxide semiconductor film, a second oxide semiconductor film over the first oxide semiconductor film, and a third oxide semiconductor film over the second oxide semi-
(Continued)

conductor film. The first oxide semiconductor film, the second oxide semiconductor film, and the third oxide semiconductor film include the same element. The second oxide semiconductor film includes a region having lower crystallinity than one or both of the first oxide semiconductor film and the third oxide semiconductor film.

18 Claims, 46 Drawing Sheets

Related U.S. Application Data division of application No. 15/444,703, filed on Feb. 28, 2017, now abandoned.

(30) Foreign Application Priority Data

| Jun. 24, 2016 | (JP) | ................................ | 2016-125377 |
|---|---|---|---|
| Jun. 24, 2016 | (JP) | ................................ | 2016-125381 |

(51) Int. Cl.
| | |
|---|---|
| *G06F 1/16* | (2006.01) |
| *H10K 59/00* | (2023.01) |
| *G02F 1/1343* | (2006.01) |
| *G02F 1/1368* | (2006.01) |
| *H01L 27/12* | (2006.01) |
| *H01L 29/04* | (2006.01) |
| *H01L 29/24* | (2006.01) |
| *H01L 29/66* | (2006.01) |
| *G02F 1/1345* | (2006.01) |
| *G02B 27/01* | (2006.01) |
| *G06F 3/044* | (2006.01) |
| *H10K 59/40* | (2023.01) |
| *H10K 59/121* | (2023.01) |
| *G02F 1/1333* | (2006.01) |

(52) U.S. Cl.
CPC .......... *G06F 1/1643* (2013.01); *G06F 1/1652* (2013.01); *G06F 3/0412* (2013.01); *H01L 27/1225* (2013.01); *H01L 29/045* (2013.01); *H01L 29/24* (2013.01); *H01L 29/66969* (2013.01); *H01L 29/786* (2013.01); *H01L 29/7869* (2013.01); *H01L 29/78648* (2013.01); *H10K 59/00* (2023.02); *G02B 27/017* (2013.01); *G02F 1/1345* (2013.01); *G02F 1/13338* (2013.01); *G02F 1/13454* (2013.01); *G02F 1/134381* (2021.01); *G02F 2202/10* (2013.01); *G06F 3/0445* (2019.05); *G06F 2203/04103* (2013.01); *H10K 59/1213* (2023.02); *H10K 59/40* (2023.02)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,203,143 B2 | 6/2012 | Imai |
| 8,367,489 B2 | 2/2013 | Yamazaki |
| 8,664,036 B2 | 3/2014 | Yamazaki et al. |
| 8,704,216 B2 | 4/2014 | Godo et al. |
| 9,064,899 B2 | 6/2015 | Godo et al. |
| 9,064,966 B2 | 6/2015 | Yamazaki et al. |
| 9,136,388 B2 | 9/2015 | Yamazaki et al. |
| 9,184,245 B2 | 11/2015 | Yamazaki |
| 9,190,527 B2 | 11/2015 | Tezuka et al. |
| 9,245,958 B2 | 1/2016 | Yamazaki |
| 9,496,408 B2 | 11/2016 | Yamazaki et al. |
| 9,660,102 B2 | 5/2017 | Godo et al. |
| 10,153,378 B2 | 12/2018 | Yamazaki et al. |
| 10,991,829 B2 | 4/2021 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |

(56) References Cited

U.S. PATENT DOCUMENTS

| | | |
|---|---|---|
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189153 A1 | 7/2009 | Iwasaki et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0102313 A1 | 4/2010 | Miyairi et al. |
| 2010/0109002 A1 | 5/2010 | Itagaki et al. |
| 2010/0219410 A1 | 9/2010 | Godo et al. |
| 2010/0309538 A1 | 12/2010 | Tatsuura et al. |
| 2011/0175080 A1* | 7/2011 | Kim .................. H01L 29/7869 257/43 |
| 2011/0215328 A1 | 9/2011 | Morosawa et al. |
| 2011/0240987 A1 | 10/2011 | Lee et al. |
| 2013/0063675 A1 | 3/2013 | Misaki |
| 2013/0161611 A1 | 6/2013 | Yamazaki et al. |
| 2013/0187151 A1 | 7/2013 | Yamazaki |
| 2013/0334523 A1 | 12/2013 | Yamazaki |
| 2014/0001467 A1 | 1/2014 | Yamazaki et al. |
| 2014/0034946 A1 | 2/2014 | Yamazaki et al. |
| 2014/0042435 A1 | 2/2014 | Yamazaki |
| 2014/0054582 A1 | 2/2014 | Yamazaki et al. |
| 2014/0084283 A1 | 3/2014 | Lim et al. |
| 2014/0103337 A1 | 4/2014 | Yamazaki et al. |
| 2014/0113405 A1 | 4/2014 | Tsubuku et al. |
| 2014/0183527 A1 | 7/2014 | Yamazaki et al. |
| 2015/0034949 A1 | 2/2015 | Yamazaki |
| 2015/0064840 A1* | 3/2015 | Shimomura ........ H01L 29/7869 438/104 |
| 2015/0084043 A1 | 3/2015 | Ishihara et al. |
| 2015/0084045 A1 | 3/2015 | Yamazaki et al. |
| 2015/0171227 A1* | 6/2015 | Ahmed ............. H01L 29/78693 257/43 |
| 2015/0179810 A1 | 6/2015 | Yamazaki et al. |
| 2015/0214328 A1 | 7/2015 | Tanaka |
| 2015/0236162 A1 | 8/2015 | Yamazaki |
| 2015/0243738 A1 | 8/2015 | Shimomura et al. |
| 2015/0287831 A1 | 10/2015 | Tanaka et al. |
| 2015/0303309 A1 | 10/2015 | Koezuka et al. |
| 2015/0349133 A1 | 12/2015 | Yamazaki et al. |
| 2015/0372022 A1* | 12/2015 | Okazaki ............. H01L 27/1225 257/43 |
| 2016/0020329 A1 | 1/2016 | Koezuka et al. |
| 2016/0042696 A1 | 2/2016 | Hirakata et al. |
| 2016/0056043 A1 | 2/2016 | Tanaka et al. |
| 2016/0079430 A1 | 3/2016 | Yamazaki |
| 2016/0117045 A1 | 4/2016 | Yamazaki et al. |
| 2016/0118254 A1 | 4/2016 | Yamazaki |
| 2016/0190346 A1 | 6/2016 | Kawata et al. |
| 2016/0233340 A1 | 8/2016 | Shimomura et al. |
| 2016/0254291 A1 | 9/2016 | Yamazaki et al. |
| 2016/0260837 A1 | 9/2016 | Koezuka et al. |
| 2016/0268261 A1 | 9/2016 | Miyairi et al. |
| 2016/0300951 A1* | 10/2016 | Yeh .................... H01L 29/7869 |
| 2017/0025548 A1 | 1/2017 | Yamazaki |
| 2017/0256572 A1 | 9/2017 | Yamazaki |
| 2017/0263773 A1 | 9/2017 | Yamazaki |
| 2017/0263783 A1 | 9/2017 | Yamazaki et al. |
| 2018/0219097 A1 | 8/2018 | Orui |
| 2021/0184041 A1 | 6/2021 | Yamazaki et al. |

FOREIGN PATENT DOCUMENTS

| | | |
|---|---|---|
| CN | 104867981 A | 8/2015 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-067954 A | 3/2010 |
| JP | 2010-226101 A | 10/2010 |
| JP | 2011-187506 A | 9/2011 |
| JP | 2013-041944 A | 2/2013 |
| JP | 2013-048216 A | 3/2013 |
| JP | 2014-007399 A | 1/2014 |
| JP | 2015-053477 A | 3/2015 |
| JP | 2016-074580 A | 5/2016 |
| KR | 2010-0098306 A | 9/2010 |
| KR | 2015-0099467 A | 8/2015 |
| TW | 201101490 | 1/2011 |
| TW | 201544458 | 12/2015 |
| WO | WO-2004/114391 | 12/2004 |
| WO | WO-2013/024646 | 2/2013 |

OTHER PUBLICATIONS

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-

(56) References Cited

OTHER PUBLICATIONS

FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges To, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

(56) References Cited

OTHER PUBLICATIONS

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, p. 262106-1-262106-3.
Park.S et al., "Challenge to Future Displays: Transparent AM-OLED Driven by PEALD Grown ZnO TFT", IMID '07 Digest, 2007, pp. 1249-1252.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
International Search Report (Application No. PCT/IB2017/051122) dated Jun. 13, 2017.
Written Opinion (Application No. PCT/IB2017/051122) dated Jun. 13, 2017.
Taiwanese Office Action (Application No. 106107073) dated Jul. 29, 2020.
Chinese Office Action (Application No. 201780014556.8) dated Apr. 1, 2021.
Taiwanese Office Action (Application No. 109146507) dated May 31, 2021.

* cited by examiner

FIG. 18A  Sample X1:170°C, $O_2$=30%
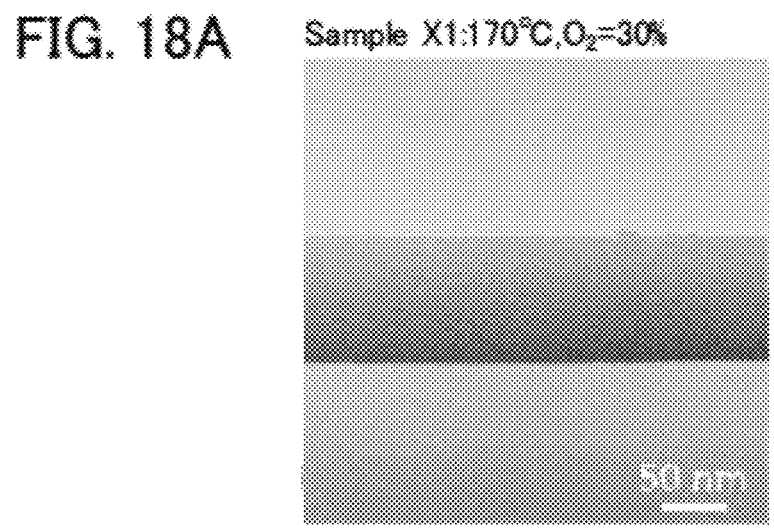
FIG. 18B  Sample X1:170°C, $O_2$=30%
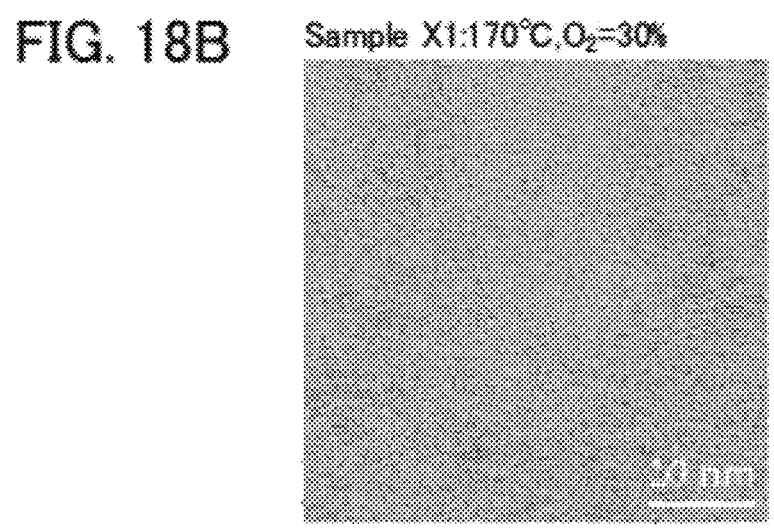
FIG. 18C  Sample X1:170°C, $O_2$=30%
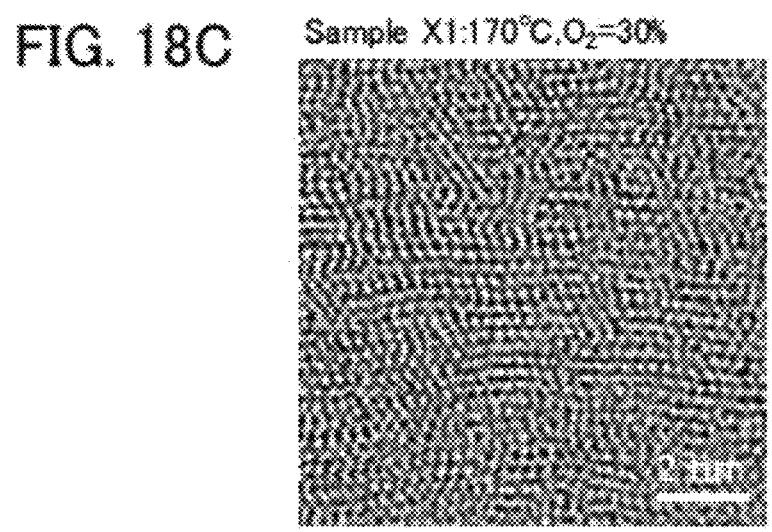

FIG. 22A  Sample X2: 130°C, O$_2$=10%
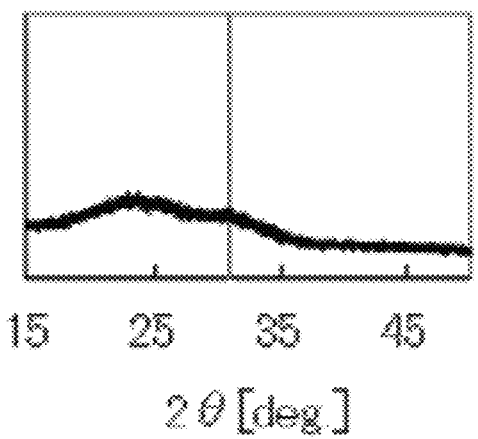
FIG. 22B  Sample X2: 130°C, O$_2$=10%
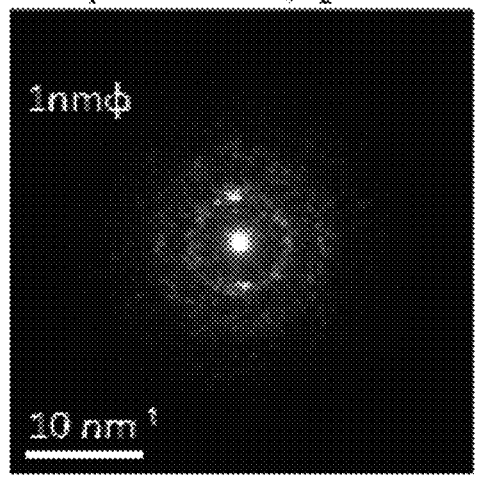
FIG. 22C  Sample X2: 130°C, O$_2$=10%
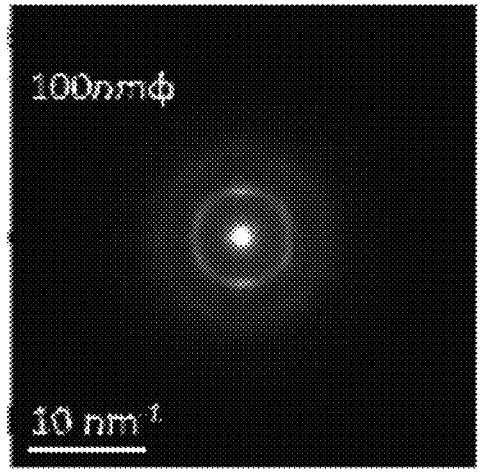

FIG. 23A  Sample X3: R.T.,O₂=10%
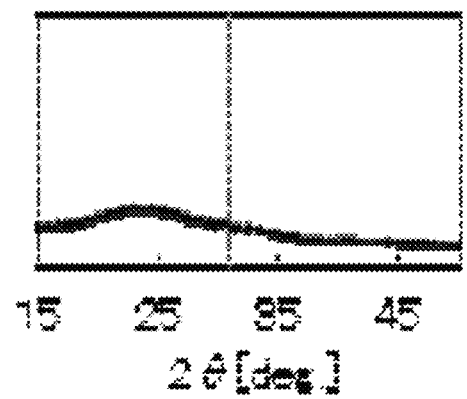
FIG. 23B  Sample X3: R.T.,O₂=10%
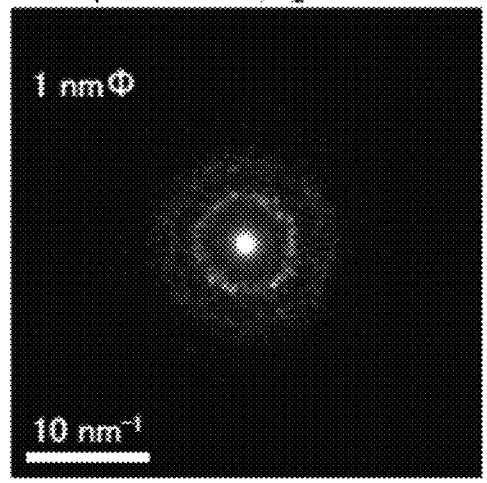
FIG. 23C  Sample X3: R.T.,O₂=10%
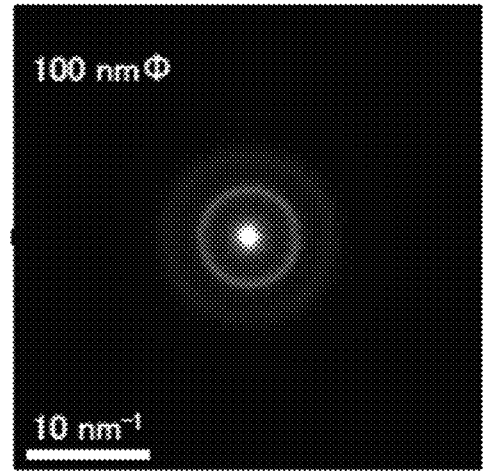

Raw Image

Contrast Controlled

FIG. 26

| | Line Profile | | $R = \dfrac{A - A'}{B - B', C - C'}$ | FWHM |
|---|---|---|---|---|
| | A–A' | B–B', C–C' | | |
| Single Crystal | (00ī), (001) peaks | single peak | $R \gg 1$ | Small |
| only CAAC | (00ī), (001) peaks | single peak | $R \gg 1$ | Relatively Small |
| CAAC + Nano-crystal | (00ī), (001) peaks | nc, nc side peaks | $R > 1$ | Middle |
| Nano-crystal | nc, nc peaks | nc, nc peaks | $R = 1$ | Relatively Large |
| Amorphous | halo, halo | halo, halo | $R = 1$ or low intensity | Large |

FIG. 27A1
Sample X1 .170°C,O₂=30%
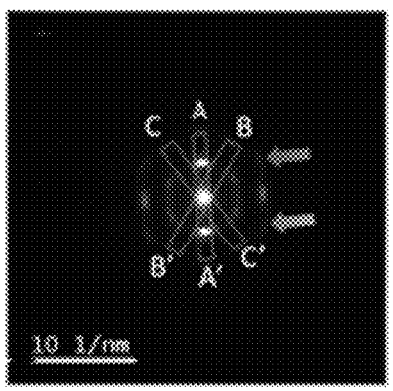
FIG. 27A2
Sample X1 .170°C,O₂=30%
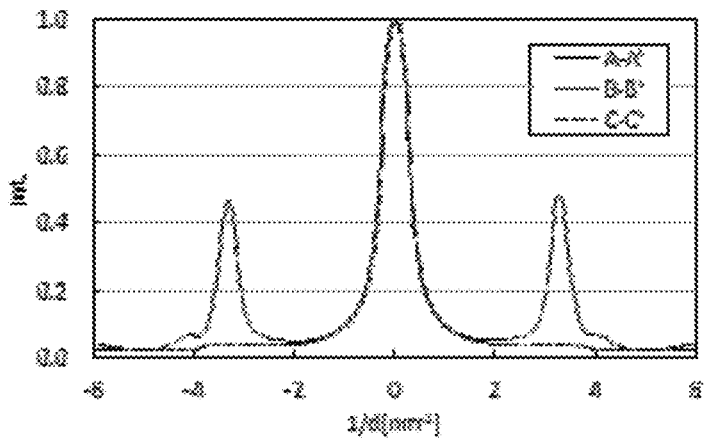
FIG. 27B1
Sample X2 .130°C,O₂=10%
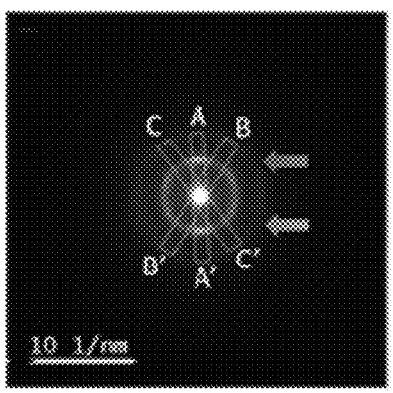
FIG. 27B2
Sample X2 .130°C,O₂=10%
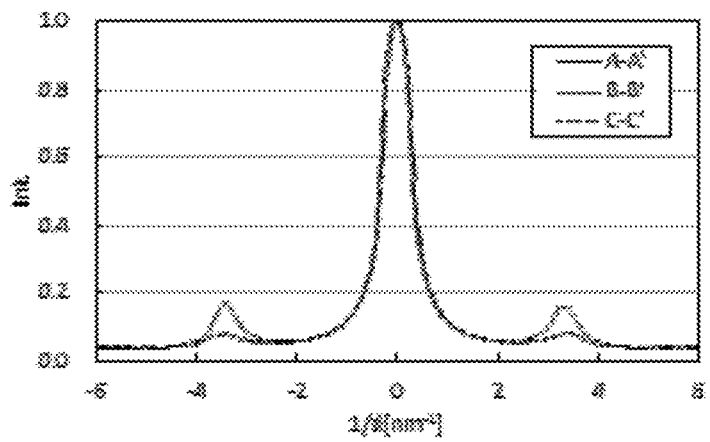
FIG. 27C1
Sample X3 .R.T.,O₂=10%
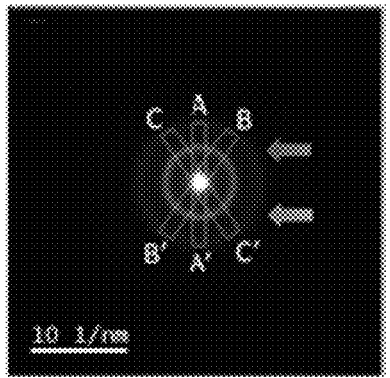
FIG. 27C2
Sample X3 .R.T.,O₂=10%
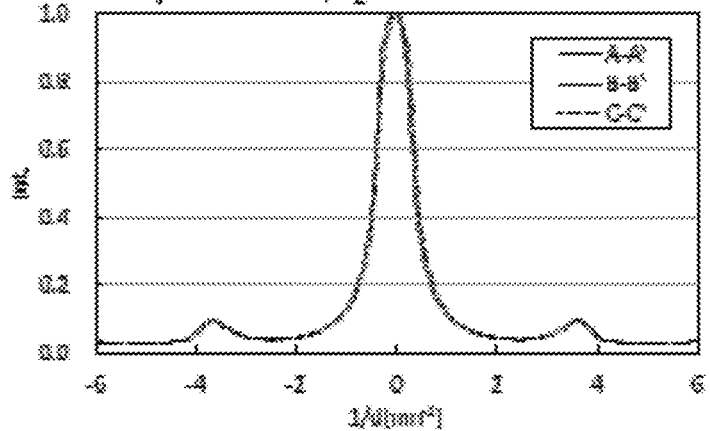

FIG. 29A1
Sample X1:170°C,O$_2$=30%
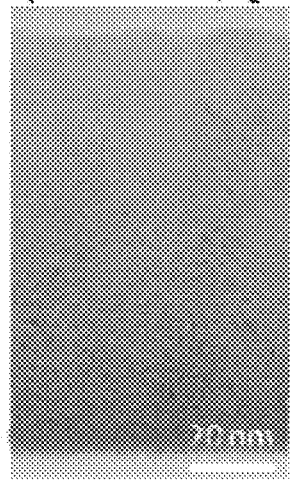
FIG. 29A2
Sample X1:170°C,O$_2$=30%
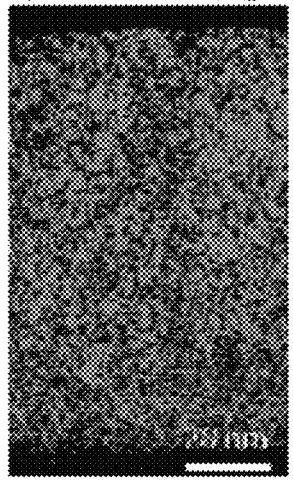
FIG. 29B1
Sample X2:130°C,O$_2$=10%
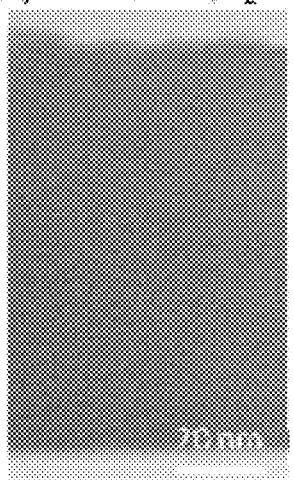
FIG. 29B2
Sample X2:130°C,O$_2$=10%
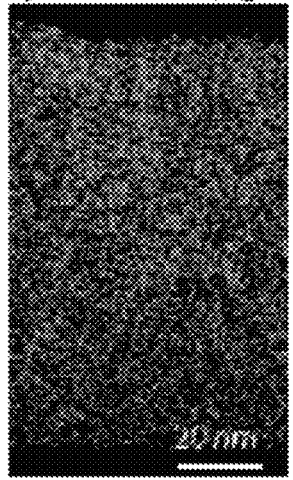
FIG. 29C1
Sample X3:R.T.,O$_2$=10%
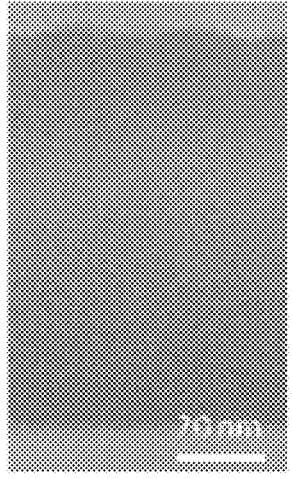
FIG. 29C2
Sample X3:R.T.,O$_2$=10%
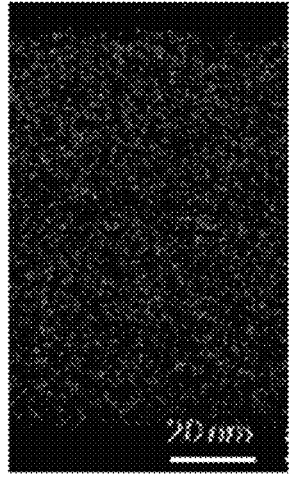

SEMICONDUCTOR DEVICE, MANUFACTURING METHOD THEREOF, AND DISPLAY DEVICE INCLUDING THE SEMICONDUCTOR DEVICE

TECHNICAL FIELD

One embodiment of the present invention relates to a semiconductor device including an oxide semiconductor film and a method for manufacturing the semiconductor device. Another embodiment of the present invention relates to a display device including the semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

As a semiconductor material that can be used in a transistor, an oxide semiconductor has been attracting attention. For example, Patent Document 1 discloses a semiconductor device whose field-effect mobility (in some cases, simply referred to as mobility or μFE) is improved by stacking a plurality of oxide semiconductor layers, among which the oxide semiconductor layer serving as a channel contains indium and gallium where the proportion of indium is higher than the proportion of gallium.

Non-Patent Document 1 discloses that an oxide semiconductor containing indium, gallium, and zinc has a homologous series represented by $In_{1-x}Ga_{1+x}O_3(ZnO)_m$ (x is a number which satisfies $-1 \leq x \leq 1$, and m is a natural number). Furthermore, Non-Patent Document 1 discloses a solid solution range of a homologous series. For example, in the solid solution range of the homologous series in the case where m=1, x ranges from −0.33 to 0.08, and in the solid solution range of the homologous series in the case where m=2, x ranges from −0.68 to 0.32.

REFERENCE

Patent Document

[Patent Document 1] Japanese Published Patent Application No. 2014-007399

Non-Patent Document

[Non-Patent Document 1] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315.

DISCLOSURE OF INVENTION

The field-effect mobility of a transistor that uses an oxide semiconductor film as a channel region is preferably as high as possible. However, when the field-effect mobility is increased, the transistor has a problem with its characteristics, that is, the transistor tends to be normally on. Note that "normally on" means a state where a channel exists without application of a voltage to a gate electrode and a current flows through the transistor.

Furthermore, in a transistor that uses an oxide semiconductor film in a channel region, oxygen vacancies which are formed in the oxide semiconductor film adversely affect the transistor characteristics. For example, oxygen vacancies formed in the oxide semiconductor film are bonded with hydrogen to serve as carrier supply sources. The carrier supply sources generated in the oxide semiconductor film cause a change in the electrical characteristics, typically, shift in the threshold voltage, of the transistor including the oxide semiconductor film.

When the amount of oxygen vacancies in the oxide semiconductor film is too large, for example, the threshold voltage of the transistor is shifted in the negative direction, and the transistor has normally-on characteristics. Thus, especially in the channel region of the oxide semiconductor film, the amount of oxygen vacancies is preferably small or the amount with which the normally-on characteristics are not exhibited.

In view of the foregoing problems, an object of one embodiment of the present invention is to improve field-effect mobility and reliability of a transistor including an oxide semiconductor film. Another object of one embodiment of the present invention is to prevent a change in electrical characteristics of a transistor including an oxide semiconductor film and to improve reliability of the transistor. Another object of one embodiment of the present invention is to provide a semiconductor device with low power consumption. Another object of one embodiment of the present invention is to provide a novel semiconductor device. Another object of one embodiment of the present invention is to provide a novel display device.

Note that the description of the above objects does not disturb the existence of other objects. In one embodiment of the present invention, there is no need to achieve all of these objects. Objects other than the above objects will be apparent from and can be derived from the description of the specification and the like.

One embodiment of the present invention is a semiconductor device which includes a gate electrode, an insulating film over the gate electrode, an oxide semiconductor film over the insulating film, and a pair of electrodes over the oxide semiconductor film. The oxide semiconductor film includes a first oxide semiconductor film, a second oxide semiconductor film over the first oxide semiconductor film, and a third oxide semiconductor film over the second oxide semiconductor film. The first oxide semiconductor film, the second oxide semiconductor film, and the third oxide semiconductor film include the same element. The second oxide semiconductor film includes a region having lower crystallinity than one or both of the first oxide semiconductor film and the third oxide semiconductor film.

In the above embodiment, it is preferable that the first oxide semiconductor film, the second oxide semiconductor film, and the third oxide semiconductor film each independently include In, M (M is Al, Ga, Y, or Sn), and Zn. In the above embodiment, it is preferable that an atomic ratio of In to M to Zn be In:M:Zn=4:2:3 or in a neighborhood thereof, and when the proportion of In is 4, the proportion of M be higher than or equal to 1.5 and lower than or equal to 2.5 and the proportion of Zn be higher than or equal to 2 and lower than or equal to 4. In the above embodiment, it is preferable that an atomic ratio of In to M to Zn be In:M:Zn=5:1:6 or in a neighborhood thereof, and when the proportion of In is 5, the proportion of M be higher than or equal to 0.5 and lower than or equal to 1.5 and the proportion of Zn be higher than or equal to 5 and lower than or equal to 7.

In the above embodiments, it is preferable that the second oxide semiconductor film be a composite oxide semiconductor that includes a first region including $In_aM_bZn_cO_d$ (M represents Al, Ga, Y, or Sn and a, b, c, and d each represent a given number) and a second region including $In_xZn_yO_z$ (x, y, and z each represent a given number).

In the above embodiments, it is preferable that the second oxide semiconductor film include a region thicker than one or both of the first oxide semiconductor film and the third oxide semiconductor film.

In the above embodiments, it is preferable that one or both of the first oxide semiconductor film and the third oxide semiconductor film contain a crystal part, and that the crystal part have c-axis alignment.

Another embodiment of the present invention is a display device which includes the semiconductor device of any one of the above-described embodiments, and a display element. Another embodiment of the present invention is a display module which includes the display device and a touch sensor. Another embodiment of the present invention is an electronic device which includes the semiconductor device of any one of the above-described embodiments, the above-described display device, or the above-described display module; and an operation key or a battery.

Another embodiment of the present invention is a method for manufacturing a semiconductor device, which includes a step of forming a gate electrode, a step of forming an insulating film over the gate electrode, a step of forming an oxide semiconductor film over the insulating film, and a step of forming a pair of electrodes over the oxide semiconductor film. The step of forming the oxide semiconductor film includes a step of forming a first oxide semiconductor film, a step of forming a second oxide semiconductor film over the first oxide semiconductor film, and a step of forming a third oxide semiconductor film over the second oxide semiconductor film. The first oxide semiconductor film, the second oxide semiconductor film, and the third oxide semiconductor film are successively formed with a sputtering apparatus in a vacuum.

In the above embodiment, it is preferable that the second oxide semiconductor film be formed under a lower oxygen partial pressure than one or both of the first oxide semiconductor film and the third oxide semiconductor film.

One embodiment of the present invention can improve field-effect mobility and reliability of a transistor including an oxide semiconductor film. One embodiment of the present invention can prevent a change in electrical characteristics of a transistor including an oxide semiconductor film and improve the reliability of the transistor. One embodiment of the present invention can provide a semiconductor device with low power consumption. One embodiment of the present invention can provide a novel semiconductor device. One embodiment of the present invention can provide a novel display device.

Note that the description of these effects does not preclude the existence of other effects. One embodiment of the present invention does not necessarily have all the effects listed above. Other effects will be apparent from and can be derived from the description of the specification, the drawings, the claims, and the like.

BRIEF DESCRIPTION OF DRAWINGS

FIGS. 18A to 18C are cross-sectional TEM images and a cross-sectional HR-TEM image of an oxide semiconductor film.

FIGS. 22A to 22C show XRD measurement results and electron diffraction patterns of an oxide semiconductor film.

FIGS. 23A to 23C show XRD measurement results and electron diffraction patterns of an oxide semiconductor film.

FIG. 26 illustrates line profiles of electron diffraction patterns and shows relative luminance R of the line profiles and full widths at half maximum of the line profiles.

FIGS. 27A1, 27A2, 27B1, 27B2, 27C1, and 27C2 show electron diffraction patterns and line profiles.

FIGS. 29A1, 29A2, 29B1, 29B2, 29C1, and 29C2 show cross-sectional TEM images of oxide semiconductor films and cross-sectional TEM images obtained through analysis thereof.

BEST MODE FOR CARRYING OUT THE INVENTION

Figure 1A:
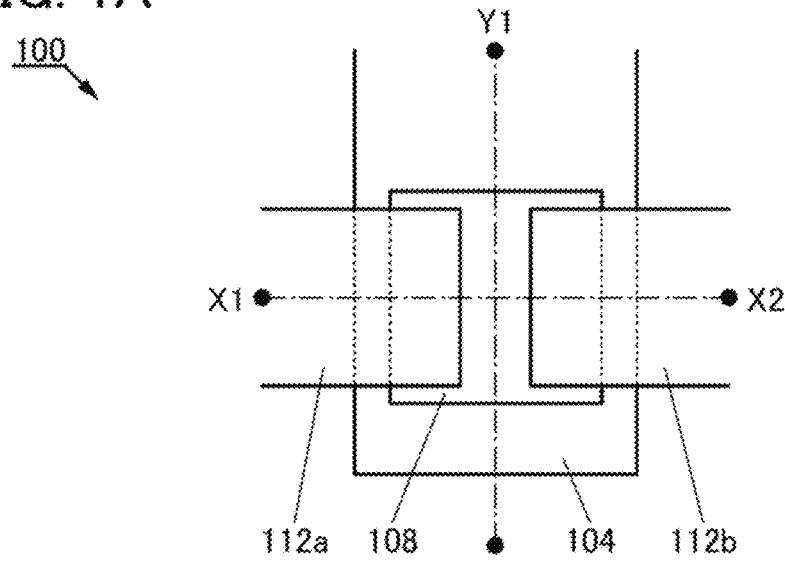
FIGS. 1A to 1C are a top view and cross-sectional views illustrating a semiconductor device.

Hereinafter, embodiments will be described with reference to drawings. However, the embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over", "above", "under", and "below", are used for convenience in describing a positional relation between components with reference to drawings. Further, the positional relation between components is changed as appropriate in accordance with a direction in which the components are described. Thus, the positional relation is not limited to that described with a term used in this specification and can be explained with another term as appropriate depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow between the drain and the source through the channel region. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the term "parallel" means that the angle formed between two straight lines is greater than or equal to −10° and less than or equal to 10°, and accordingly also covers the case where the angle is greater than or equal to −5° and less than or equal to 5°. The term "perpendicular" means that the angle formed between two straight lines is greater than or equal to 80° and less than or equal to 100°, and accordingly also covers the case where the angle is greater than or equal to 85° and less than or equal to 95°.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, the off-state current in this specification and the like refers to a drain current of a transistor in an off state (also referred to as non-conduction state and cutoff state). Unless otherwise specified, the off state of an n-channel transistor means that a voltage ($V_{gs}$) between its gate and source is lower than the threshold voltage ($V_{th}$), and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean "there is $V_{gs}$ with which the off-state current of the transistor becomes lower than or equal to I". Furthermore, "the off-state current of a transistor" means "the off-state current in an off state at predetermined $V_{gs}$", "the off-state current in an off state at $V_{gs}$ in a predetermined range", "the off-state current in an off state at $V_{gs}$ with which sufficiently reduced off-state current is obtained", or the like.

As an example, the assumption is made of an n-channel transistor where the threshold voltage $V_{th}$ is 0.5 V and the drain current is $1\times10^{-9}$ A at $V_{gs}$ of 0.5 V, $1\times10^{-13}$ A at $V_{gs}$ of 0.1 V, $1\times10^{-19}$ A at $V_{gs}$ of $-0.5$ V, and $1\times10^{-22}$ A at $V_{gs}$ of $-0.8$ V. The drain current of the transistor is $1\times10^{-19}$ A or lower at $V_{gs}$ of $-0.5$ V or at $V_{gs}$ in the range of $-0.8$ V to $-0.5$ V; therefore, it can be said that the off-state current of the transistor is $1\times10^{-19}$ A or lower. Since there is $V_{gs}$ at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value in relation to the channel width W or by a current value per given channel width (e.g., 1 µm). In the latter case, the off-state current may be expressed in the unit with the dimension of current per length (e.g., A/µm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is $V_{gs}$ at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at $V_{ds}$ at which the required reliability of a semiconductor device or the like including the transistor is ensured or $V_{ds}$ at which the semiconductor device or the like including the transistor is used. The description "an off-state current of a transistor is lower than or equal to I" may refer to a situation where there is $V_{gs}$ at which the off-state current of a transistor is lower than or equal to I at $V_{ds}$ of 0.1 V, 0.8 V, 1 V, 1.2 V, 1.8 V, 2.5 V, 3 V, 3.3 V, 10 V, 12 V, 16 V, or 20 V, $V_{ds}$ at which the required reliability of a semiconductor device or the like including the transistor is ensured, or $V_{ds}$ at which the semiconductor device or the like including the transistor is used.

In the above description of off-state current, a drain may be replaced with a source. That is, the off-state current sometimes refers to a current that flows through a source of a transistor in an off state.

In this specification and the like, the term "leakage current" sometimes expresses the same meaning as off-state current. In this specification and the like, the off-state current sometimes refers to a current that flows between a source and a drain when a transistor is off, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of $I_d$=0 A) and an extrapolated straight line that is tangent with the highest inclination to a plotted curve ($V_g$–$\sqrt{I_d}$ characteristics). Alternatively, the threshold voltage of a transistor may refer to a gate voltage ($V_g$) at which the value of $I_d$ [A]×L [µm]/W [µm] is $1\times10^{-9}$ [A] where L is channel length and W is channel width.

In this specification and the like, a "semiconductor" can have characteristics of an "insulator" when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. An "insulator" in this specification and the like can be called a "semi-insulator" in some cases.

In this specification and the like, a "semiconductor" can have characteristics of a "conductor" when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

In this specification and the like, an impurity in a semiconductor refers to an element that is not a main component of the semiconductor. For example, an element with a concentration of lower than 0.1 atomic % is an impurity. If a semiconductor contains an impurity, the density of states (DOS) may be formed therein, the carrier mobility may be decreased, or the crystallinity may be decreased, for example. In the case where the semiconductor includes an oxide semiconductor, examples of the impurity which changes the characteristics of the semiconductor include Group 1 elements, Group 2 elements, Group 13 elements, Group 14 elements, Group 15 elements, and transition metals other than the main components; specific examples include hydrogen (also included in water), lithium, sodium, silicon, boron, phosphorus, carbon, and nitrogen. When the semiconductor is an oxide semiconductor, oxygen vacancies may be formed by entry of impurities such as hydrogen, for example. Furthermore, in the case where the semiconductor includes silicon, examples of the impurity which changes the characteristics of the semiconductor include oxygen, Group 1 elements except hydrogen, Group 2 elements, Group 13 elements, and Group 15 elements.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" might be stated. CAAC refers to an example of a crystal structure, and CAC refers to an example of a function or a material composition.

An example of a crystal structure of an oxide semiconductor or a metal oxide is described. Note that an oxide semiconductor deposited by a sputtering method using an In—Ga—Zn oxide target (In:Ga:Zn=4:2:4.1 in an atomic ratio) is described below as an example. An oxide semiconductor formed by a sputtering method using the above-mentioned target at a substrate temperature of higher than or equal to 100° C. and lower than or equal to 130° C. is referred to as sIGZO, and an oxide semiconductor formed by a sputtering method using the above-mentioned target with the substrate temperature set at room temperature (R.T.) is referred to as tIGZO. For example, sIGZO has one or both of the nano crystal (nc) crystal structure and the CAAC crystal structure. Furthermore, tIGZO has the nc crystal structure. Note that room temperature (R.T.) herein also refers to a temperature of the time when a substrate is not heated intentionally.

In this specification and the like, CAC-OS or CAC-metal oxide has a function of a conductor in part of the material and has a function of a dielectric (or insulator) in another part of the material; as a whole, CAC-OS or CAC-metal oxide has a function of a semiconductor. In the case where CAC-OS or CAC-metal oxide is used in an active layer of a transistor, the conductor has a function of letting electrons (or holes) serving as carriers flow, and the dielectric has a function of not letting electrons serving as carriers flow. By the complementary action of the function as a conductor and the function as a dielectric, CAC-OS or CAC-metal oxide can have a switching function (on/off function). In the CAC-OS or CAC-metal oxide, separation of the functions can maximize each function.

In this specification and the like, CAC-OS or CAC-metal oxide includes conductor regions and dielectric regions. The conductor regions have the above-described function of the conductor, and the dielectric regions have the above-described function of the dielectric. In some cases, the conductor regions and the dielectric regions in the material are separated at the nanoparticle level. In some cases, the conductor regions and the dielectric regions are unevenly distributed in the material. When observed, the conductor regions are coupled in a cloud-like manner with their boundaries blurred, in some cases.

In other words, CAC-OS or CAC-metal oxide can be called a matrix composite or a metal matrix composite.

Furthermore, in the CAC-OS or CAC-metal oxide, the conductor regions and the dielectric regions each have a size of greater than or equal to 0.5 nm and less than or equal to 10 nm, preferably greater than or equal to 0.5 nm and less than or equal to 3 nm and are dispersed in the material, in some cases.

Embodiment 1

In this embodiment, a semiconductor device of one embodiment of the present invention and a manufacturing method of the semiconductor device are described with reference to FIGS. 1A to 1C, FIGS. 2A to 2C, FIGS. 3A to 3C, FIGS. 4A to 4C, FIGS. 5A to 5C, FIGS. 6A to 6C, FIGS. 7A to 7C, FIGS. 8A to 8C, FIGS. 9A to 9C, and FIGS. 10A and 10B.

<1-1. Structural Example 1 of Semiconductor Device>

Figure 1B:
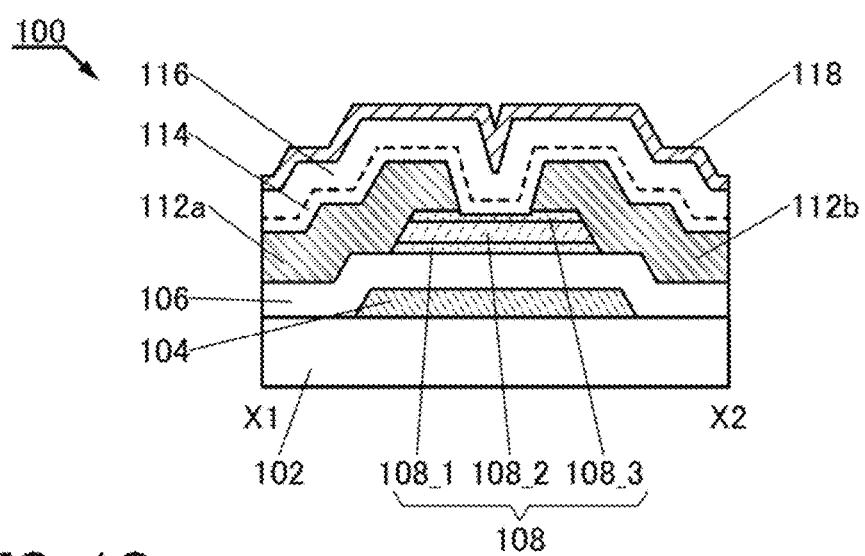
Figure 1C:
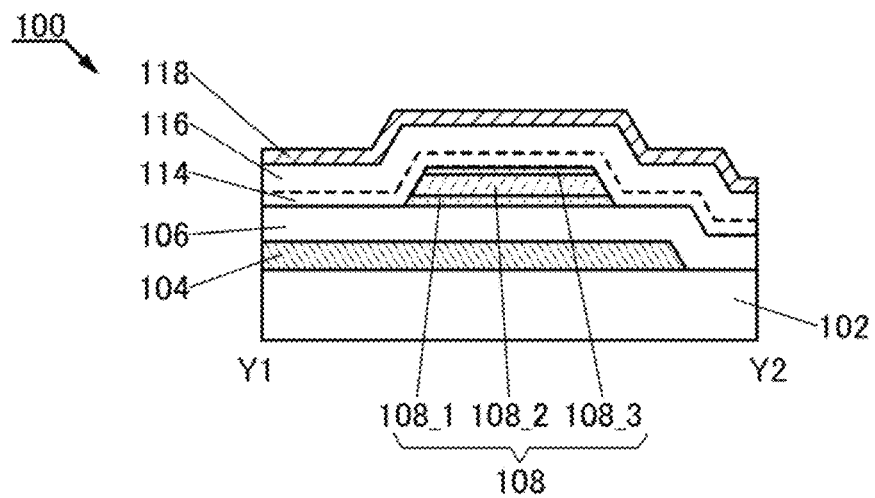

FIG. 1A is a top view of a transistor 100 that is a semiconductor device of one embodiment of the present invention. FIG. 1B is a cross-sectional view taken along a dashed dotted line X1-X2 in FIG. 1A, and FIG. 1C is a cross-sectional view taken along a dashed dotted line Y1-Y2 in FIG. 1A. Note that in FIG. 1A, some components of the transistor 100 (e.g., an insulating film serving as a gate insulating film) are not illustrated to avoid complexity. Furthermore, the direction of the dashed dotted line X1-X2 may be referred to as a channel length direction, and the direction of the dashed dotted line Y1-Y2 may be referred to as a channel width direction. As in FIG. 1A, some components are not illustrated in some cases in top views of transistors described below.

The transistor 100 includes a conductive film 104 over a substrate 102, an insulating film 106 over the substrate 102 and the conductive film 104, an oxide semiconductor film 108 over the insulating film 106, a conductive film 112a over the oxide semiconductor film 108, and a conductive film 112b over the oxide semiconductor film 108. Furthermore, an insulating film 114, an insulating film 116 over the insulating film 114, and an insulating film 118 over the insulating film 116 are formed over the transistor 100, specifically over the oxide semiconductor film 108, the conductive film 112a, and the conductive film 112b.

Note that the transistor 100 is what is called a channel-etched transistor.

Furthermore, the oxide semiconductor film 108 includes an oxide semiconductor film 108_1 over the insulating film 106, an oxide semiconductor film 108_2 over the oxide semiconductor film 108_1, and an oxide semiconductor film 108_3 over the oxide semiconductor film 108_2. Note that the oxide semiconductor film 108_1, the oxide semiconductor film 108_2, and the oxide semiconductor film 108_3 include the same element. For example, it is preferable that the oxide semiconductor film 108_1, the oxide semiconductor film 108_2, and the oxide semiconductor film 108_3 each independently include In, M (M is Al, Ga, Y, or Sn), and Zn.

The oxide semiconductor film 108_1, the oxide semiconductor film 108_2, and the oxide semiconductor film 108_3 preferably each independently include a region in which the atomic proportion of In is higher than the atomic proportion of M. For example, the atomic ratio of In to M to Zn in the oxide semiconductor film 108_1 is preferably In:M:Zn=4:2:3 or in the neighborhood thereof. Further, the atomic ratio of In to M to Z in the oxide semiconductor film 108_2 is preferably In:M:Zn=4:2:3 or in the neighborhood thereof. In addition, the atomic ratio of In to M to Z in the oxide semiconductor film 108_3 is preferably In:M:Zn=4:2:3 or in the neighborhood thereof. As for the range expressed by the term "neighborhood" here, when In is 4, M ranges from 1.5 to 2.5 and Zn ranges from 2 to 4. When the compositions of the oxide semiconductor film 108_1, the oxide semiconductor film 108_2, and the oxide semiconductor film 108_3 are substantially the same as described above, they can be formed using the same sputtering target and the manufacturing cost can be thus reduced.

When the oxide semiconductor film 108_1, the oxide semiconductor film 108_2, and the oxide semiconductor film 108_3 each independently include a region in which the atomic proportion of In is higher than the atomic proportion of M, the transistor 100 can have high field-effect mobility. Specifically, the field-effect mobility of the transistor 100 can exceed 10 cm$^2$/Vs, preferably exceed 30 cm$^2$/Vs.

For example, the use of the transistor with high field-effect mobility in a gate driver that generates a gate signal allows a display device to have a narrow frame. The use of the transistor with high field-effect mobility in a source driver (particularly in a demultiplexer connected to an output terminal of a shift register included in a source driver) that is included in a display device and supplies a signal from a signal line can reduce the number of wirings connected to the display device.

On the other hand, even when the oxide semiconductor film 108_1, the oxide semiconductor film 108_2, and the oxide semiconductor film 108_3 each independently include a region in which the atomic proportion of In is higher than the atomic proportion of M, the field-effect mobility might be low if the oxide semiconductor film 108_1, the oxide semiconductor film 108_2, and the oxide semiconductor film 108_3 have high crystallinity.

However, in the semiconductor device of one embodiment of the present invention, the oxide semiconductor film 108_2 includes a region having lower crystallinity than one or both of the oxide semiconductor film 108_1 and the oxide semiconductor film 108_3. Note that the crystallinity of the oxide semiconductor film 108 can be determined by analysis by X-ray diffraction (XRD) or with a transmission electron microscope (TEM).

In the case where the oxide semiconductor film 108_2 has a region with low crystallinity, the following effects can be achieved.

First, oxygen vacancies that might be formed in the oxide semiconductor film 108 will be described.

Oxygen vacancies formed in the oxide semiconductor film 108 adversely affect the transistor characteristics and therefore cause a problem. For example, oxygen vacancies formed in the oxide semiconductor film 108 are bonded to hydrogen to serve as a carrier supply source. The carrier supply source generated in the oxide semiconductor film 108 causes a change in the electrical characteristics, typically, shift in the threshold voltage, of the transistor 100 including the oxide semiconductor film 108. Therefore, it is preferable that the amount of oxygen vacancies in the oxide semiconductor film 108 be as small as possible.

In view of this, one embodiment of the present invention is a structure in which insulating films in the vicinity of the oxide semiconductor film 108, specifically the insulating films 114 and 116 formed over the oxide semiconductor film 108, include excess oxygen. Oxygen or excess oxygen is transferred from the insulating films 114 and 116 to the oxide semiconductor film 108, whereby the oxygen vacancies in the oxide semiconductor film can be reduced.

Figure 10A:
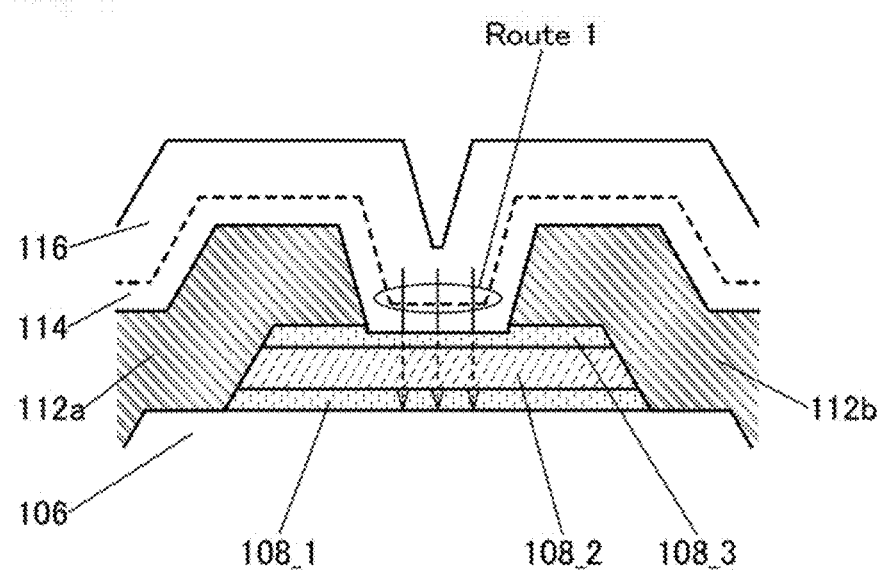
FIGS. 10A and 10B are schematic views illustrating diffusion paths of oxygen or excess oxygen diffused into an oxide semiconductor film.
Figure 10B:
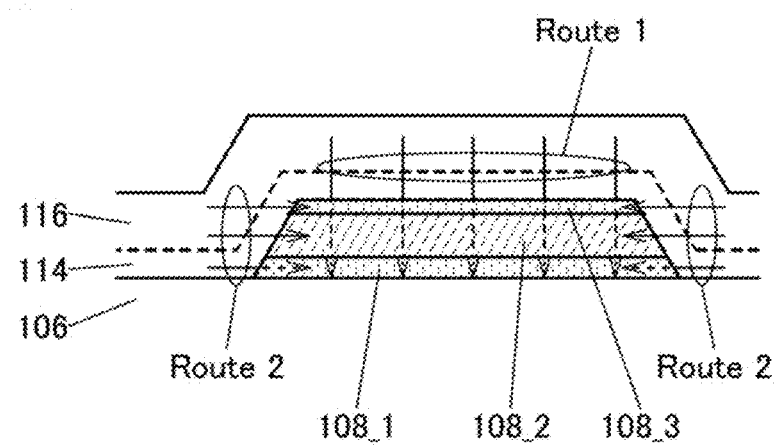

Here, the path of oxygen or excess oxygen diffused into the oxide semiconductor film 108 will be described with reference to FIGS. 10A and 10B. FIGS. 10A and 10B are schematic views illustrating the diffusion paths of oxygen or excess oxygen diffused into the oxide semiconductor film 108. FIG. 10A is the schematic view in the channel length direction and FIG. 10B is the schematic view in the channel width direction.

Oxygen or excess oxygen of the insulating films 114 and 116 is diffused to the oxide semiconductor film 108_2 and the oxide semiconductor film 108_1 from above, i.e., through the oxide semiconductor film 108_3 (Route 1 in FIGS. 10A and 10B).

Alternatively, oxygen or excess oxygen of the insulating films 114 and 116 is diffused into the oxide semiconductor film 108 through the side surfaces of the oxide semiconductor film 108_1, the oxide semiconductor film 108_2, and the oxide semiconductor film 108_3 (Route 2 in FIG. 10B).

For example, diffusion of oxygen or excess oxygen by Route 1 shown in FIGS. 10A and 10B is sometimes prevented when the oxide semiconductor film 108_3 has high crystallinity. In contrast, even when the oxide semiconductor film 108_3 has high crystallinity, oxygen or excess oxygen can be diffused to the oxide semiconductor film 108_1, the oxide semiconductor film 108_2, and the oxide semiconductor film 108_3 through the side surfaces of the oxide semiconductor film 108_1, the oxide semiconductor film 108_2, and the oxide semiconductor film 108_3 by Route 2 shown in FIG. 10B.

Since the oxide semiconductor film 108_2 includes a region having lower crystallinity than the oxide semiconductor film 108_1 and the oxide semiconductor film 108_3, the region serves as a diffusion path of excess oxygen, so that excess oxygen can also be diffused to the oxide semiconductor film 108_1 and the oxide semiconductor film 108_3 that have higher crystallinity than the oxide semiconductor film 108_2 by Route 2 shown in FIG. 10B. It is thus preferable that the oxide semiconductor film 108_2 be thicker than the oxide semiconductor film 108_1 and the oxide semiconductor film 108_3 to widen the oxygen diffusion path. Although not shown in FIGS. 10A and 10B, when the insulating film 106 contains oxygen or excess oxygen, the oxygen or excess oxygen might also be diffused from the insulating film 106 into the oxide semiconductor film 108.

As described above, a stacked-layer structure that includes the oxide semiconductor films having different crystal structures is formed in a semiconductor device of one embodiment of the present invention and the region with low crystallinity serves as a diffusion path of excess oxygen, whereby the semiconductor device can be highly reliable.

Note that in the case where the oxide semiconductor film 108 consists only of an oxide semiconductor film with low crystallinity, the reliability might be lowered because of attachment or entry of impurities (e.g., hydrogen or moisture) to the back channel side of the oxide semiconductor film, i.e., a region corresponding to the oxide semiconductor film 108_3.

Impurities such as hydrogen or moisture entering the oxide semiconductor film 108 adversely affect the transistor characteristics and therefore cause a problem. Therefore, it is preferable that the amount of impurities such as hydrogen or moisture in the oxide semiconductor film 108 be as small as possible.

In view of the above, in one embodiment of the present invention, the oxide semiconductor films over and under the oxide semiconductor film have higher crystallinity to inhibit entry of impurities to the oxide semiconductor film 108. In particular, the higher crystallinity of the oxide semiconductor film 108_3 can inhibit damage at the time of processing the conductive films 112a and 112b. The surface of the oxide semiconductor film 108, i.e., the surface of the oxide semiconductor film 108_3 is exposed to an etchant or an etching gas at the time of processing the conductive films 112a and 112b. However, since the oxide semiconductor film 108_3 includes a region with high crystallinity, it serves as an etching stopper.

Note that it is preferable to use, as the oxide semiconductor film 108, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width W of $1\times10^6$ µm and a channel length L of 10 µm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

By including a region having lower crystallinity than the oxide semiconductor film 108_1 and the oxide semiconductor film 108_3, the oxide semiconductor film 108_2 sometimes has a high carrier density.

When the oxide semiconductor film 108_2 has a high carrier density, the Fermi level is sometimes high relative to the conduction band of the oxide semiconductor film 108_2. This lowers the conduction band minimum of the oxide semiconductor film 108_2, so that the energy difference between the conduction band minimum of the oxide semiconductor film 108_2 and the trap level, which might be formed in a gate insulating film (here, the insulating film 106), is increased in some cases. The increase of the energy difference can reduce trap of charges in the gate insulating film and reduce variation in the threshold voltage of the transistor, in some cases. In addition, when the oxide semiconductor film 108_2 has a high carrier density, the oxide semiconductor film 108 can have high field-effect mobility.

It is favorable to use a composite oxide semiconductor that includes a first region containing $In_aM_bZn_cO_d$ (M represents Al, Ga, Y, or Sn and a, b, c, and d each represent a given number) and a second region containing $In_xZn_yO_z$ (x, y, and z each represent a given number) as the oxide semiconductor film 108_2. The details of the composite oxide semiconductor film will be described in Embodiment 2.

In the transistor 100 illustrated in FIGS. 1A to 1C, the insulating film 106 functions as a gate insulating film of the transistor 100, and the insulating films 114, 116, and 118 function as protective insulating films of the transistor 100. Furthermore, in the transistor 100, the conductive film 104 functions as a gate electrode, the conductive film 112a functions as a source electrode, and the conductive film 112b functions as a drain electrode. Note that in this specification and the like, in some cases, the insulating film 106 is referred to as a first insulating film, the insulating films 114 and 116 are collectively referred to as a second insulating film, and the insulating film 118 is referred to as a third insulating film.

<1-2. Components of Semiconductor Device>

Next, components of the semiconductor device in this embodiment are described in detail.

[Substrate]

There is no particular limitation on a material and the like of the substrate 102 as long as the material has heat resistance high enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate of silicon or silicon carbide, a compound semiconductor substrate of silicon germanium, an SOI substrate, or the like can be used, or any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

[Conductive Film]

The conductive film 104 functioning as a gate electrode and the conductive films 112a and 112b functioning as a source electrode and a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

Furthermore, the conductive films 104, 112a, and 112b can be formed using an oxide conductor or an oxide semiconductor, such as an oxide including indium and tin (In—Sn oxide), an oxide including indium and tungsten (In—W oxide), an oxide including indium, tungsten, and zinc (In—W—Zn oxide), an oxide including indium and titanium (In—Ti oxide), an oxide including indium, titanium, and tin (In—Ti—Sn oxide), an oxide including indium and zinc (In—Zn oxide), an oxide including indium, tin, and silicon (In—Sn—Si oxide), or an oxide including indium, gallium, and zinc (In—Ga—Zn oxide).

Here, an oxide conductor is described. In this specification and the like, an oxide conductor may be referred to as OC. For example, oxygen vacancies are formed in an oxide semiconductor, and then hydrogen is added to the oxygen vacancies, so that a donor level is formed in the vicinity of the conduction band. This increases the conductivity of the oxide semiconductor; accordingly, the oxide semiconductor becomes a conductor. The oxide semiconductor having become a conductor can be referred to as an oxide conductor. Oxide semiconductors generally transmit visible light because of their large energy gap. Since an oxide conductor is an oxide semiconductor having a donor level in the vicinity of the conduction band, the influence of absorption due to the donor level is small in an oxide conductor, and an oxide conductor has a visible light transmitting property comparable to that of an oxide semiconductor.

A Cu—X alloy film (X is Mn, Ni, Cr, Fe, Co, Mo, Ta, or Ti) may be used for the conductive films 104, 112a, and 112b. The use of a Cu—X alloy film results in lower manufacturing costs because the film can be processed by wet etching.

Among the above-mentioned metal elements, any one or more elements selected from copper, titanium, tungsten, tantalum, and molybdenum are preferably included in the conductive films 112a and 112b. In particular, a tantalum nitride film is preferably used for the conductive films 112a and 112b. A tantalum nitride film has conductivity and a high barrier property against copper or hydrogen. Because a tantalum nitride film releases little hydrogen from itself, it can be favorably used as the conductive film in contact with the oxide semiconductor film 108 or the conductive film in the vicinity of the oxide semiconductor film 108. It is favorable to use a copper film for the conductive films 112a and 112b because the resistance of the conductive films 112a and 112b can be reduced.

The conductive films 112a and 112b can be formed by electroless plating. As a material that can be deposited by electroless plating, for example, one or more elements selected from Cu, Ni, Al, Au, Sn, Co, Ag, and Pd can be used. It is further favorable to use Cu or Ag because the resistance of the conductive film can be reduced.

[Insulating Film Functioning as Gate Insulating Film]

As the insulating film 106 functioning as a gate insulating film of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the insulating film 106 may have a layered structure of two or more layers.

The insulating film 106 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 106 is an insulating film capable of releasing oxygen. In order to provide the oxygen-excess region in the insulating film 106, the insulating film 106 is formed in an oxygen atmosphere, or the deposited insulating film 106 is subjected to heat treatment in an oxygen atmosphere, for example.

In the case where hafnium oxide is used for the insulating film 106, the following effect is attained. Hafnium oxide has higher dielectric constant than silicon oxide and silicon oxynitride. Therefore, the insulating film 106 using hafnium oxide can have a larger thickness than the insulating film 106 using silicon oxide, so that leakage current due to tunnel current can be low. That is, it is possible to provide a transistor with a low off-state current. Moreover, hafnium oxide having a crystal structure has a higher dielectric constant than hafnium oxide having an amorphous structure. Therefore, it is preferable to use hafnium oxide having a crystal structure, in order to provide a transistor with a low off-state current. Examples of the crystal structure include a monoclinic crystal structure and a cubic crystal structure. Note that one embodiment of the present invention is not limited to the above examples.

In this embodiment, a layered film of a silicon nitride film and a silicon oxide film is formed as the insulating film 106. The silicon nitride film has a higher dielectric constant than a silicon oxide film and needs a larger thickness for capacitance equivalent to that of the silicon oxide film. Thus, when the silicon nitride film is included in the gate insulating film of the transistor 100, the thickness of the insulating film can be increased. This makes it possible to reduce a decrease in withstand voltage of the transistor 100 and furthermore to increase the withstand voltage, thereby reducing electrostatic discharge damage to the transistor 100.

[Oxide Semiconductor Film]

The oxide semiconductor film 108 can be formed using the materials described above.

In the case where the oxide semiconductor film 108 includes In-M-Zn oxide, it is preferable that the atomic ratio of metal elements of a sputtering target used for forming the In-M-Zn oxide satisfy In>M. The atomic ratio of metal elements in such a sputtering target is, for example, In:M:Zn=2:1:3, In:M:Zn=3:1:2, In:M:Zn=4:2:4.1, In:M:Zn=5:1:6, In:M:Zn=5:1:8, In:M:Zn=6:1:6, or In:M:Zn=5:2:5.

In the case where the oxide semiconductor film 108 is formed of In-M-Zn oxide, it is preferable to use a target including polycrystalline In-M-Zn oxide as the sputtering target. The use of the target including polycrystalline In-M-Zn oxide facilitates formation of the oxide semiconductor film 108 having crystallinity. Note that the atomic ratio of metal elements in the formed oxide semiconductor film 108 varies from the above atomic ratios of metal elements of the sputtering targets in a range of ±40%. For example, when a sputtering target with an atomic ratio of In to Ga to Zn of 4:2:4.1 is used, the atomic ratio of In to Ga to Zn in the formed oxide semiconductor film 108 may be 4:2:3 or in the neighborhood of 4:2:3.

The energy gap of the oxide semiconductor film 108 is 2 eV or more, preferably 2.5 eV or more. With the use of an oxide semiconductor having such a wide energy gap, the off-state current of the transistor 100 can be reduced.

Furthermore, the oxide semiconductor film 108 preferably has a non-single-crystal structure. Examples of the non-single-crystal structure include a c-axis-aligned crystalline oxide semiconductor (CAAC-OS) which is described later, a polycrystalline structure, a microcrystalline structure, and an amorphous structure. Among the non-single-crystal structures, the amorphous structure has the highest density of defect states, whereas the CAAC-OS has the lowest density of defect states.

[Insulating Film 1 Functioning as Protective Insulating Film]

The insulating films 114 and 116 function as protective insulating films for the transistor 100. In addition, the insulating films 114 and 116 each have a function of supplying oxygen to the oxide semiconductor film 108. That is, the insulating films 114 and 116 contain oxygen. The insulating film 114 is an insulating film that allows oxygen to pass therethrough. Note that the insulating film 114 also functions as a film that relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114.

In addition, it is preferable that the number of defects in the insulating film 114 be small and typically, the spin density corresponding to a signal that appears at g=2.001 due to a dangling bond of silicon be lower than or equal to $3 \times 10^{17}$ spins/cm$^3$ by electron spin resonance (ESR) measurement. This is because if the density of defects in the insulating film 114 is high, oxygen is bonded to the defects and the property of transmitting oxygen of the insulating film 114 is lowered.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film that can transmit oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide. Note that the density of states due to nitrogen oxide can be formed between the energy of the valence band maximum ($E_{v\_o}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film which releases ammonia more than nitrogen oxide in thermal desorption spectroscopy (TDS) analysis; the amount of released ammonia is typically greater than or equal to $1\times10^{18}$ cm$^{-3}$ and less than or equal to $5\times10^{19}$ cm$^{-3}$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating film 114, for example. The level is positioned in the energy gap of the oxide semiconductor film 108. Therefore, when nitrogen oxide is diffused to the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the interface between the insulating film 114 and the oxide semiconductor film 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 corresponds to the sum of the spin densities of signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the above oxide insulating film measured by SIMS is lower than or equal to $6\times10^{20}$ atoms/cm$^3$.

The above oxide insulating film is formed by a PECVD method at a substrate temperature higher than or equal to 220° C. and lower than or equal to 350° C. using silane and dinitrogen monoxide, whereby a dense and hard film can be formed.

The insulating film 116 is an oxide insulating film which contains oxygen at a higher proportion than the stoichiometric composition. Part of oxygen is released from the above oxide insulating film by heating. The amount of oxygen released from the oxide insulating film in TDS is more than or equal to $1.0\times10^{19}$ atoms/cm$^3$, preferably more than or equal to $3.0\times10^{20}$ atoms/cm$^3$. Note that the amount of released oxygen is the total amount of oxygen released by heat treatment in a temperature range of 50° C. to 650° C. or 50° C. to 550° C. in TDS. In addition, the amount of released oxygen is the total amount of released oxygen converted into oxygen atoms in TDS.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the number of defects in the insulating film 116 be small, and typically the spin density corresponding to a signal that appears at g=2.001 due to a dangling bond of silicon be lower than $1.5\times10^{18}$ spins/cm$^3$, preferably lower than or equal to $1\times10^{18}$ spins/cm$^3$ by ESR measurement. Note that the insulating film 116 is provided more apart from the oxide semiconductor film 108 than the insulating film 114 is; thus, the insulating film 116 may have higher density of defects than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this.

For example, a single-layer structure of only the insulating film 114 or a layered structure of three or more layers may be employed.

[Insulating Film 2 Functioning as Protective Insulating Film]

The insulating film 118 functions as a protective insulating film for the transistor 100.

The insulating film 118 includes one or both of hydrogen and nitrogen. Alternatively, the insulating film 118 includes nitrogen and silicon. The insulating film 118 has a function of blocking oxygen, hydrogen, water, alkali metal, alkaline earth metal, or the like. The provision of the insulating film 118 makes it possible to prevent outward diffusion of oxygen from the oxide semiconductor film 108, outward diffusion of oxygen included in the insulating films 114 and 116, and entry of hydrogen, water, or the like into the oxide semiconductor film 108 from the outside.

A nitride insulating film, for example, can be used as the insulating film 118. The nitride insulating film is formed using silicon nitride, silicon nitride oxide, aluminum nitride, aluminum nitride oxide, or the like.

Although the variety of films such as the conductive films, the insulating films, and the oxide semiconductor film described above can be formed by a sputtering method or a PECVD method, such films may be formed by another method, e.g., a thermal chemical vapor deposition (CVD) method. A metal organic chemical vapor deposition (MOCVD) method and an atomic layer deposition (ALD) method can be given as examples of a thermal CVD method.

A thermal CVD method has an advantage that no defect due to plasma damage is generated since it does not utilize plasma for forming a film. In a thermal CVD method, a source gas is introduced into a chamber, the chamber is set at an atmospheric pressure or a reduced pressure, and a film is deposited on a substrate.

Furthermore, in an ALD method, a source gas is introduced into a chamber, the chamber is set at an atmospheric pressure or a reduced pressure, and a film is deposited on a substrate.

The variety of films such as the conductive films, the insulating films, and the oxide semiconductor film in this embodiment can be formed by a thermal CVD method such as an MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a hafnium oxide film is formed by a deposition apparatus using an ALD method, two kinds of gases, that is, ozone ($O_3$) as an oxidizer and a source gas that is obtained by vaporizing liquid containing a solvent and a hafnium precursor compound (e.g., a hafnium alkoxide or a hafnium amide such as tetrakis(dimethylamide) hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, that is, $H_2O$ as an oxidizer and a source gas that is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine included in the adsorbate is removed, and radicals of an oxidizing gas (e.g., $O_2$ or dinitrogen monoxide) are supplied to react with the adsorbate.

For example, in the case where a tungsten film is formed using a deposition apparatus using an ALD method, a first tungsten film is formed using a $WF_6$ gas and a $B_2H_6$ gas, and then a second tungsten film is formed using a $WF_6$ gas and an $H_2$ gas. Note that a $SiH_4$ gas may be used instead of a $B_2H_6$ gas.

For example, in the case where an oxide semiconductor film, e.g., an In—Ga—Zn—O film is formed using a deposition apparatus using an ALD method, an InO layer is formed using an $In(CH_3)_3$ gas and an $O_3$ gas, a GaO layer is formed using a $Ga(CH_3)_3$ gas and an $O_3$ gas, and then a ZnO layer is formed using a $Zn(CH_3)_2$ gas and an $O_3$ gas. Note that the order of these layers is not limited to this example. A mixed compound layer such as an In—Ga—O layer, an In—Zn—O layer, or a Ga—Zn—O layer may be formed by mixing these gases. Note that although an $H_2O$ gas that is obtained by bubbling water with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

<1-3. Structure Example 2 of Semiconductor Device>

Next, variations of the transistor 100 illustrated in in FIGS. 1A to 1C are described with reference to FIGS. 2A to 2C, FIGS. 3A to 3C, FIGS. 4A to 4C, and FIGS. 5A to 5C.

Figure 2A:
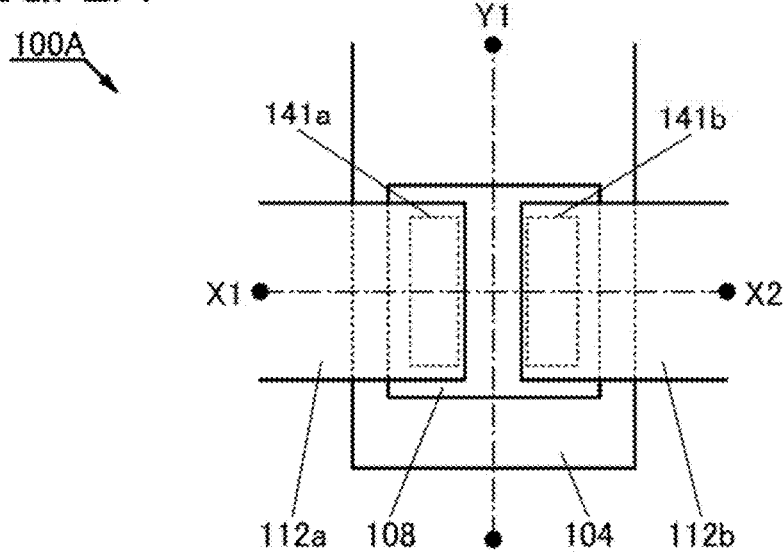
FIGS. 2A to 2C are a top view and cross-sectional views illustrating a semiconductor device.
Figure 2B:
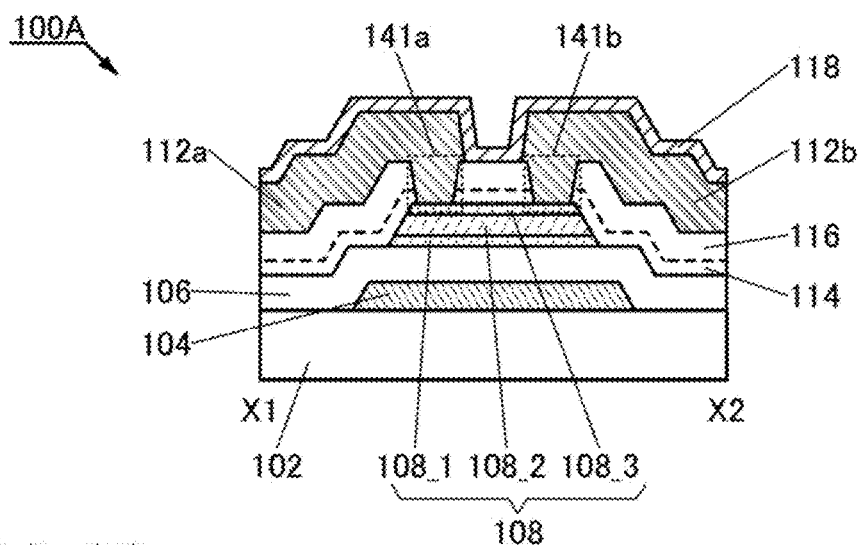

FIG. 2A is a top view of a transistor 100A that is a semiconductor device of one embodiment of the present invention. FIG. 2B is a cross-sectional view taken along a dashed dotted line X1-X2 in FIG. 2A, and FIG. 2C is a cross-sectional view taken along a dashed dotted line Y1-Y2 in FIG. 2A.

Figure 2C:
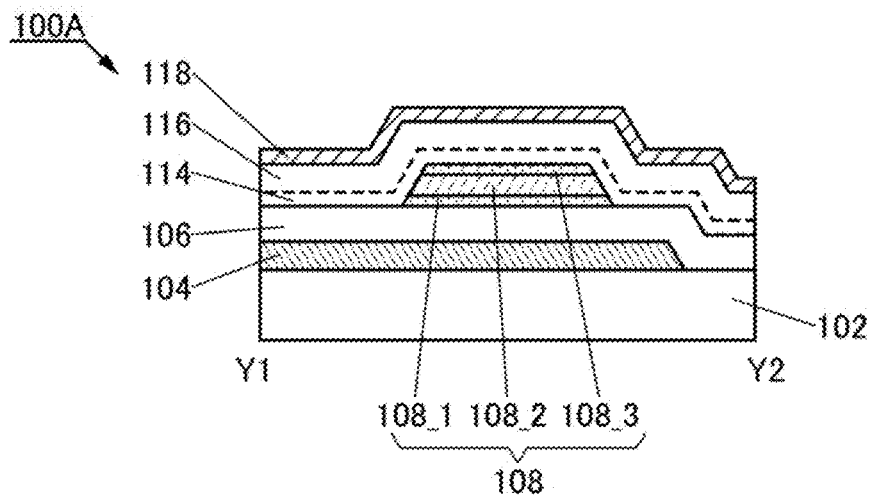

Note that the transistor 100A illustrated in FIGS. 2A to 2C is what is called a channel-protective transistor. Thus, the semiconductor device of one embodiment of the present invention can have either the channel-etched structure or the channel-protective structure.

In the transistor 100A, the insulating films 114 and 116 have an opening 141a and an opening 141b. The oxide semiconductor film 108 is connected to the conductive films 112a and 112b through the openings 141a and 141b. Furthermore, the insulating film 118 is formed over the conductive films 112a and 112b. The insulating films 114 and 116 function as channel protective films. Note that the other components of the transistor 100A are similar to those of the transistor 100 described above, and an effect similar to that of the transistor 100 can be obtained.

Figure 3A:
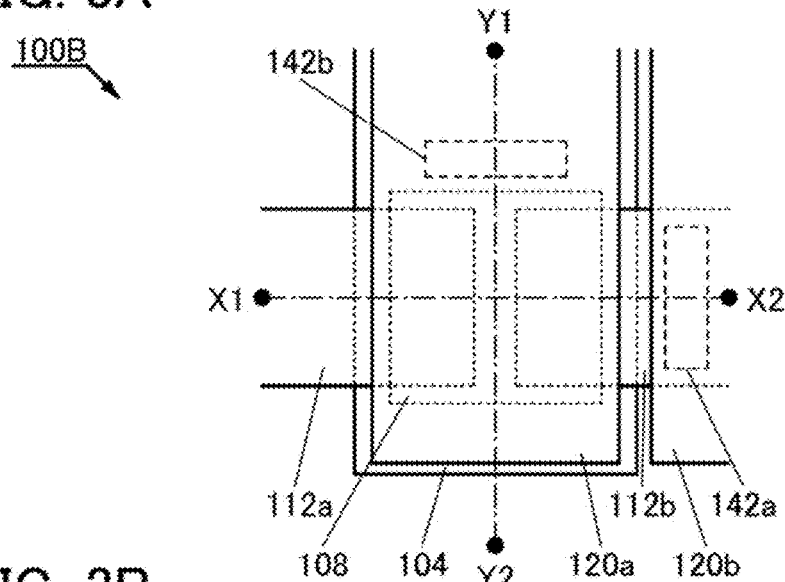
FIGS. 3A to 3C are a top view and cross-sectional views illustrating a semiconductor device.
Figure 3B:
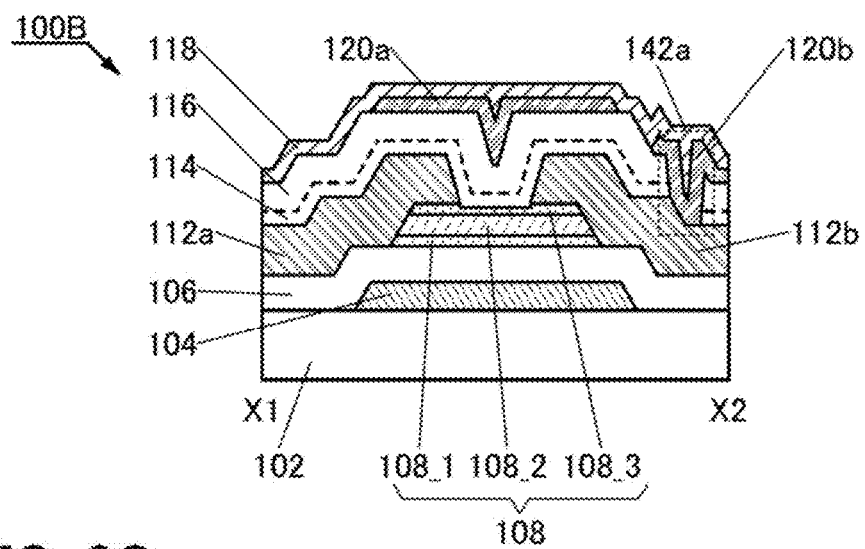
Figure 3C:
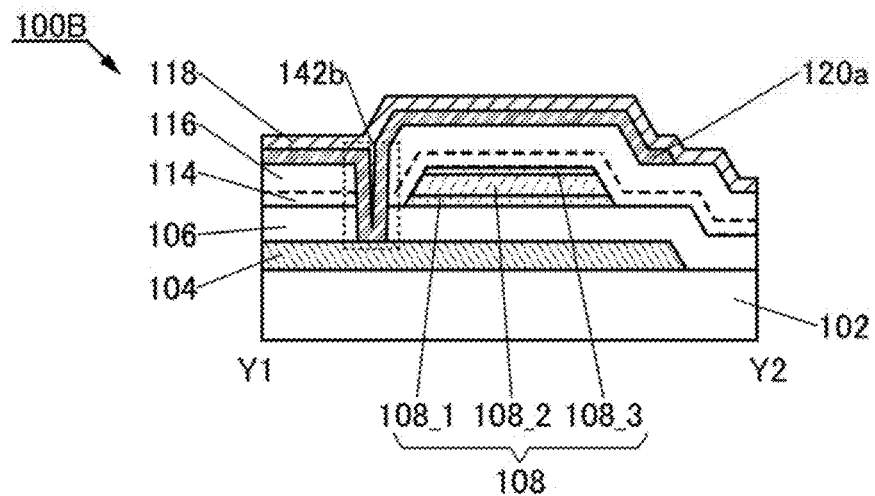

FIG. 3A is a top view of a transistor 100B that is a semiconductor device of one embodiment of the present invention. FIG. 3B is a cross-sectional view taken along a dashed dotted line X1-X2 in FIG. 3A, and FIG. 3C is a cross-sectional view taken along a dashed dotted line Y1-Y2 in FIG. 3A.

The transistor 100B includes the conductive film 104 over the substrate 102, the insulating film 106 over the substrate 102 and the conductive film 104, the oxide semiconductor film 108 over the insulating film 106, the conductive film 112a over the oxide semiconductor film 108, the conductive film 112b over the oxide semiconductor film 108, the insulating film 114 over the oxide semiconductor film 108, the conductive film 112a, and the conductive film 112b, the insulating film 116 over the insulating film 114, a conductive film 120a over the insulating film 116, a conductive film 120b over the insulating film 116, and the insulating film 118 over the insulating film 116 and the conductive films 120a and 120b.

The insulating films 114 and 116 have an opening 142a. The insulating films 106, 114, and 116 have an opening 142b. The conductive film 120a is electrically connected to the conductive film 104 through the opening 142b. Furthermore, the conductive film 120b is electrically connected to the conductive film 112b through the opening 142a.

Note that in the transistor 100B, the insulating film 106 functions as a first gate insulating film of the transistor 100B, the insulating films 114 and 116 function as a second gate insulating film of the transistor 100B, and the insulating film 118 functions as a protective insulating film of the transistor 100B. In the transistor 100B, the conductive film 104 functions as a first gate electrode, the conductive film 112a functions as a source electrode, and the conductive film 112b functions as a drain electrode. In the transistor 100B, the conductive film 120a functions as a second gate electrode, and the conductive film 120b functions as a pixel electrode of a display device.

As illustrated in FIG. 3C, the conductive film 120a is electrically connected to the conductive film 104 through the opening 142b. Accordingly, the conductive film 104 and the conductive film 120a are supplied with the same potential.

As illustrated in FIG. 3C, the oxide semiconductor film 108 is positioned so as to face the conductive film 104 and the conductive film 120a, and is sandwiched between the two conductive films functioning as the gate electrodes. The length in the channel length direction and the length in the channel width direction of the conductive film 120a are longer than the length in the channel length direction and the length in the channel width direction of the oxide semiconductor film 108, respectively. The whole oxide semiconductor film 108 is covered with the conductive film 120a with the insulating films 114 and 116 positioned therebetween.

In other words, the conductive film 104 and the conductive film 120a are connected through the opening provided in the insulating films 106, 114, and 116, and each include a region positioned outside an edge portion of the oxide semiconductor film 108.

With this structure, the oxide semiconductor film 108 included in the transistor 100B can be electrically surrounded by electric fields of the conductive films 104 and 120a. A device structure of a transistor, like that of the transistor 100B, in which electric fields of a first gate electrode and a second gate electrode electrically surround an oxide semiconductor film where a channel region is formed can be referred to as a surrounded channel (s-channel) structure.

Since the transistor 100B has the s-channel structure, an electric field for inducing a channel can be effectively applied to the oxide semiconductor film 108 by the conductive film 104 functioning as a first gate electrode; therefore, the current drive capability of the transistor 100B can be improved and high on-state current characteristics can be obtained. Since the on-state current can be increased, the size of the transistor 100B can be reduced. In addition, since the transistor 100B has a structure in which the oxide semiconductor film 108 is surrounded by the conductive film 104 functioning as the first gate electrode and the conductive film 120a functioning as the second gate electrode, the mechanical strength of the transistor 100B can be increased.

Note that for the conductive films 120a and 120b, materials similar to those described as the materials of the above-described conductive films 104, 112a, and 112b can be used. In particular, oxide conductor films (OC) are preferable as the conductive films 120a and 120b. When the conductive films 120a and 120b are formed using an oxide conductive film, oxygen can be added to the insulating films 114 and 116.

The other components of the transistor 100B are similar to those of the transistor 100 described above and have similar effects.

Figure 4A:
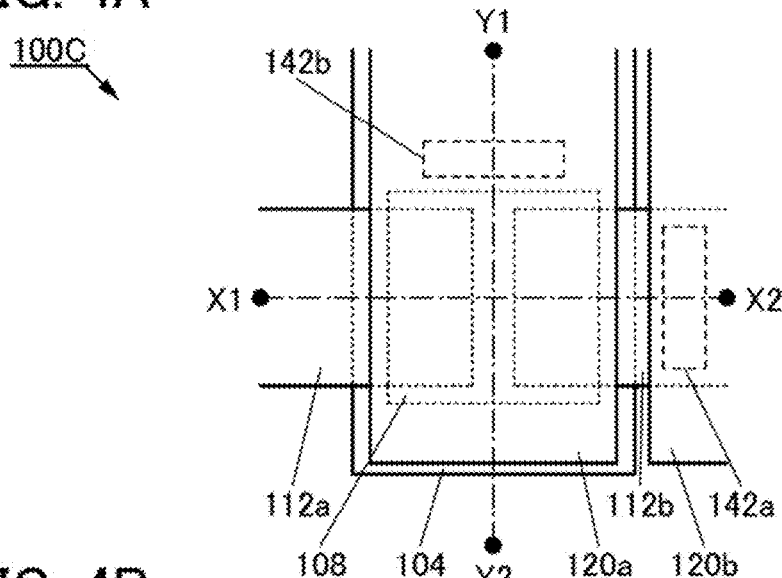
FIGS. 4A to 4C are a top view and cross-sectional views illustrating a semiconductor device.
Figure 4B:
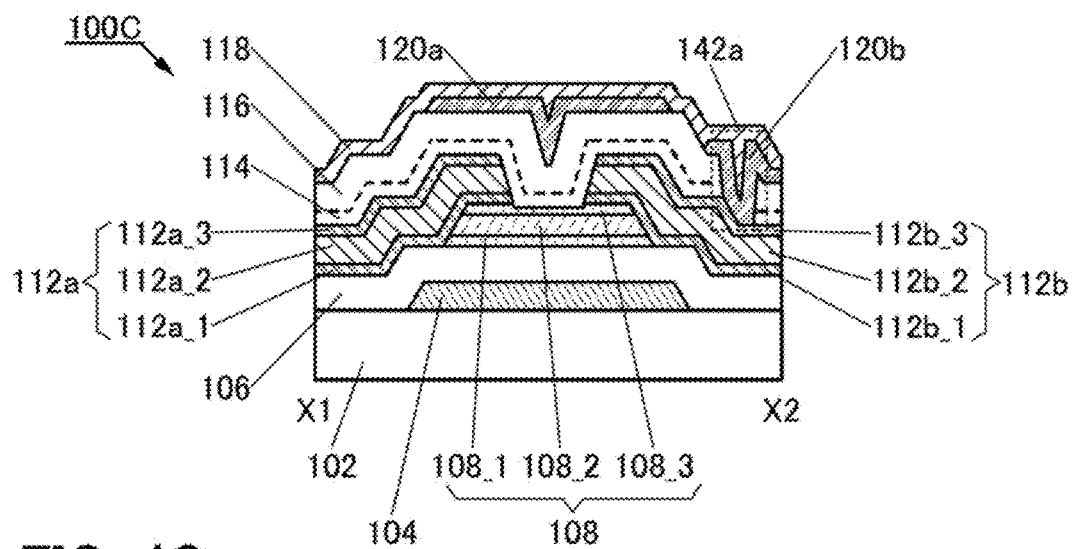
Figure 4C:
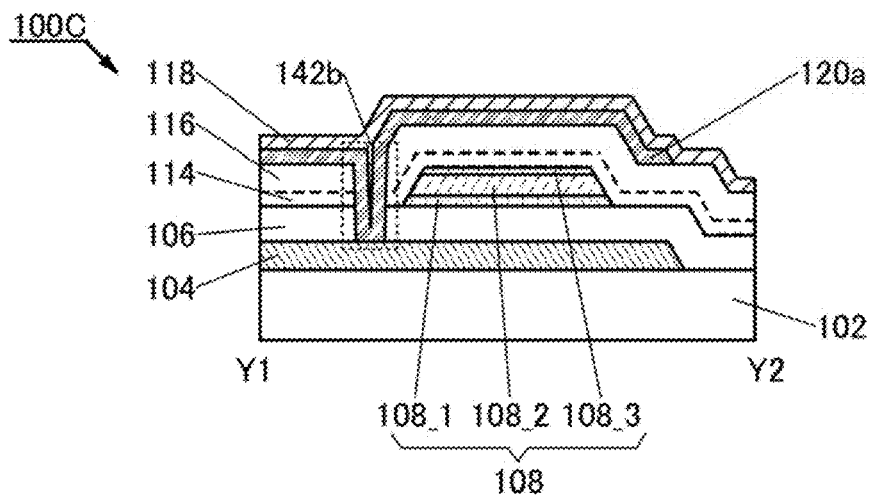

FIG. 4A is a top view of a transistor 100C that is a semiconductor device of one embodiment of the present invention. FIG. 4B is a cross-sectional view taken along a dashed dotted line X1-X2 in FIG. 4A, and FIG. 4C is a cross-sectional view taken along a dashed dotted line Y1-Y2 in FIG. 4A.

The transistor 100C is different from the above-described transistor 100B in that the conductive films 112a and 112b each have a three-layer structure.

The conductive film 112a of the transistor 100C includes a conductive film 112a_1, a conductive film 112a_2 over the conductive film 112a_1, and a conductive film 112a_3 over the conductive film 112a_2. The conductive film 112b of the transistor 100C includes a conductive film 112b_1, a conductive film 112b_2 over the conductive film 112b_1, and a conductive film 112b_3 over the conductive film 112b_2.

For example, it is preferable that the conductive film 112a_1, the conductive film 112b_1, the conductive film 112a_3, and the conductive film 112b_3 contain one or more elements selected from titanium, tungsten, tantalum, molybdenum, indium, gallium, tin, and zinc. Furthermore, it is preferable that the conductive film 112a_2 and the conductive film 112b_2 contain one or more elements selected from copper, aluminum, and silver.

Specifically, the conductive film 112a_1, the conductive film 112b_1, the conductive film 112a_3, and the conductive film 112b_3 can be formed using an In—Sn oxide or an In—Zn oxide and the conductive film 112a_2 and the conductive film 112b_2 can be formed using copper.

The above structure is preferred because the wiring resistance of the conductive films 112a and 112b can be reduced and diffusion of copper to the oxide semiconductor film 108 can be inhibited. The above structure is preferred also because the contact resistance between the conductive film 112b and the conductive film 120b can be low. The other components of the transistor 100C are similar to those of the transistor 100 described above and have similar effects.

Figure 5A:
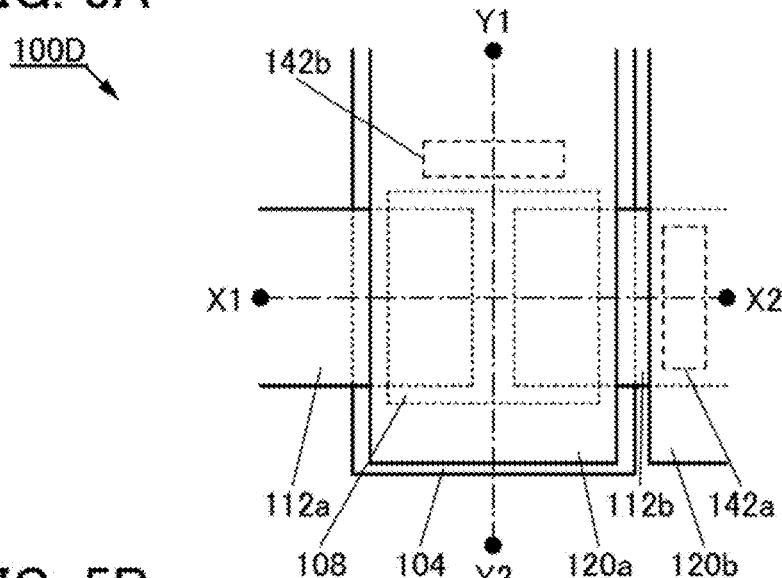
FIGS. 5A to 5C are a top view and cross-sectional views illustrating a semiconductor device.
Figure 5B:
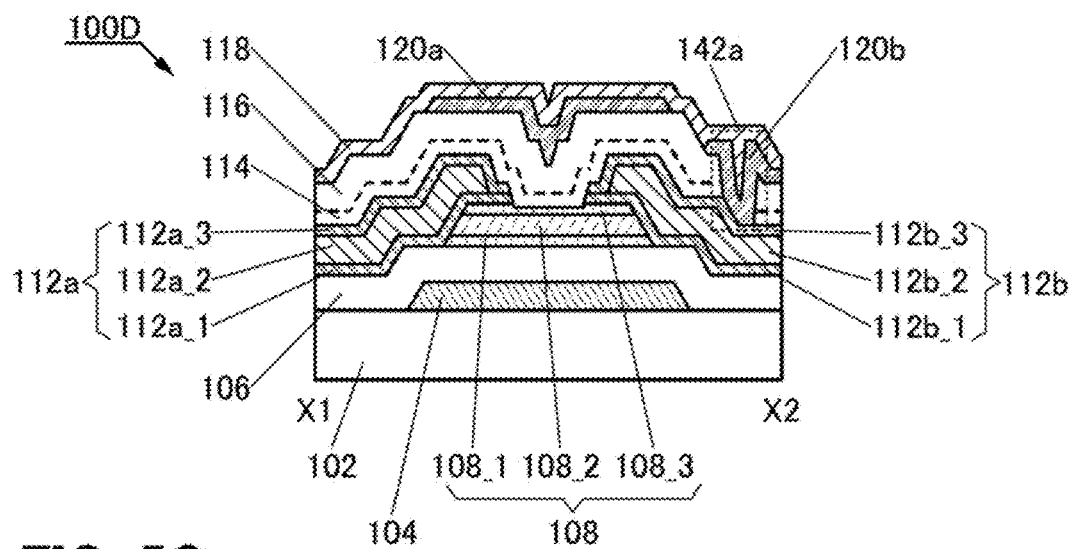
Figure 5C:
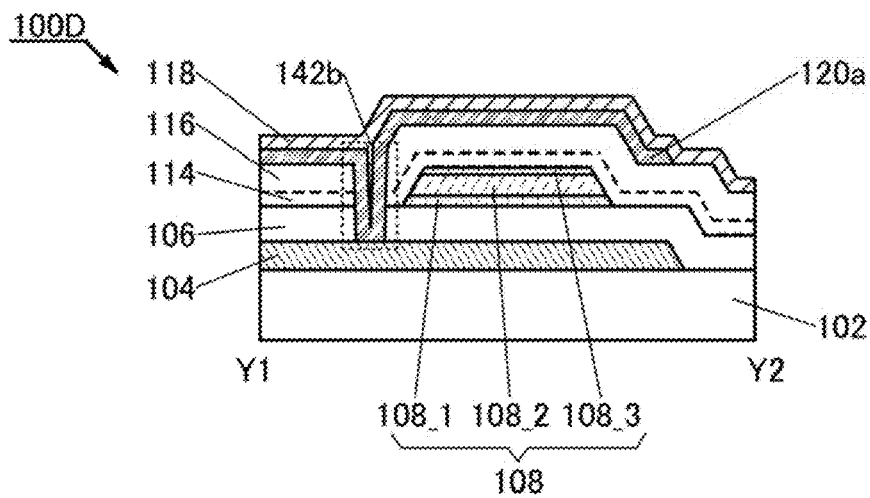

FIG. 5A is a top view of a transistor 100D that is a semiconductor device of one embodiment of the present invention. FIG. 5B is a cross-sectional view taken along a dashed dotted line X1-X2 in FIG. 5A, and FIG. 5C is a cross-sectional view taken along a dashed dotted line Y1-Y2 in FIG. 5A.

The transistor 100D is different from the above-described transistor 100B in that the conductive films 112a and 112b each have a three-layer structure. In addition, the transistor 100D is different from the above-described transistor 100C in the shapes of the conductive films 112a and 112b.

The conductive film 112a of the transistor 100D includes the conductive film 112a_1, the conductive film 112a_2 over the conductive film 112a_1, and the conductive film 112a_3 over the conductive film 112a_2. The conductive film 112b of the transistor 100C includes the conductive film 112b_1, the conductive film 112b_2 over the conductive film 112b_1, and the conductive film 112b_3 over the conductive film 112b_2. Note that the conductive film 112a_1, the conductive film 112a_2, the conductive film 112a_3, the conductive film 112b_1, the conductive film 112b_2, and the conductive film 112b_3 can be formed using any of the above-described materials.

An end portion of the conductive film 112a_1 has a region located outward from an end portion of the conductive film 112a_2. The conductive film 112a_3 covers a top surface and a side surface of the conductive film 112a_2 and has a region that is in contact with the conductive film 112a_1. An end portion of the conductive film 112b_1 has a region located outward from an end portion of the conductive film 112b_2. The conductive film 112b_3 covers a top surface and a side surface of the conductive film 112b_2 and has a region that is in contact with the conductive film 112b_1.

The above structure is preferred because the wiring resistance of the conductive films 112a and 112b can be reduced and diffusion of copper to the oxide semiconductor film 108 can be inhibited. Note that diffusion of copper can be more effectively inhibited in the transistor 100D than in the above-described transistor 100C. The above structure is preferred also because the contact resistance between the conductive film 112b and the conductive film 120b can be low. The other components of the transistor 100D are similar to those of the transistor 100 described above and have similar effects.

The structures of the transistors in this embodiment can be freely combined with each other.

<1-4. Manufacturing Method of Semiconductor Device>

Next, a manufacturing method of the transistor 100B that is a semiconductor device of one embodiment of the present invention is described with reference to FIGS. 6A to 6C, FIGS. 7A to 7C, FIGS. 8A to 8C, and FIGS. 9A to 9C.

FIGS. 6A to 6C, FIGS. 7A to 7C, FIGS. 8A to 8C, and FIGS. 9A to 9C are cross-sectional views illustrating a manufacturing method of the semiconductor device. In each of FIGS. 6A to 6C, FIGS. 7A to 7C, FIGS. 8A to 8C, and FIGS. 9A to 9C, the left part is a cross-sectional view in the channel length direction, and the right part is a cross-sectional view in the channel width direction.

First, a conductive film is formed over the substrate 102 and processed through a lithography process and an etching process, whereby the conductive film 104 functioning as the first gate electrode is formed. Then, the insulating film 106 functioning as the first gate insulating film is formed over the conductive film 104 (see FIG. 6A).

In this embodiment, a glass substrate is used as the substrate 102, and as the conductive film 104 functioning as the first gate electrode, a 50-nm-thick titanium film and a 200-nm-thick copper film are each formed by a sputtering method. A 400-nm-thick silicon nitride film and a 50-nm-thick silicon oxynitride film as the insulating film 106 are formed by a PECVD method.

Note that the above-described silicon nitride film has a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and a power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and a power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and a power of 2000 W is supplied using a 27.12 MHz high-frequency power source.

Note that the first silicon nitride film, the second silicon nitride film, and the third silicon nitride film can each be formed at a substrate temperature of lower than or equal to 350° C.

When the silicon nitride film has the above-described three-layer structure, for example, in the case where a conductive film including copper is used as the conductive film 104, the following effect can be obtained.

The first silicon nitride film can inhibit diffusion of copper from the conductive film 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

Figure 6A:
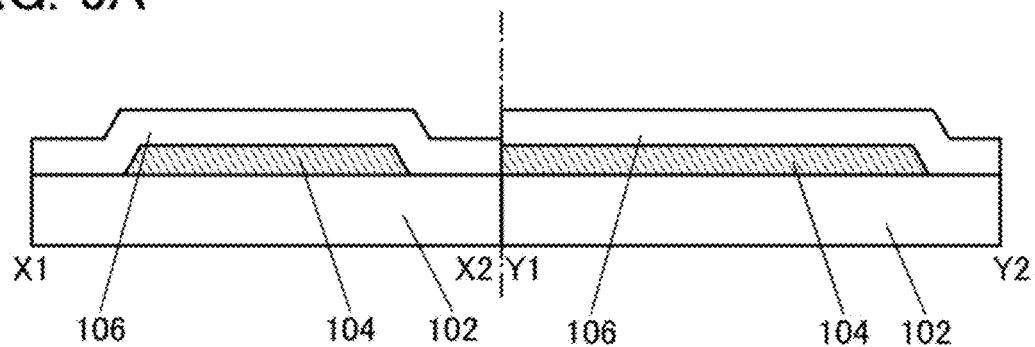
FIGS. 6A to 6C are cross-sectional views illustrating a method for manufacturing a semiconductor device.
Figure 6B:
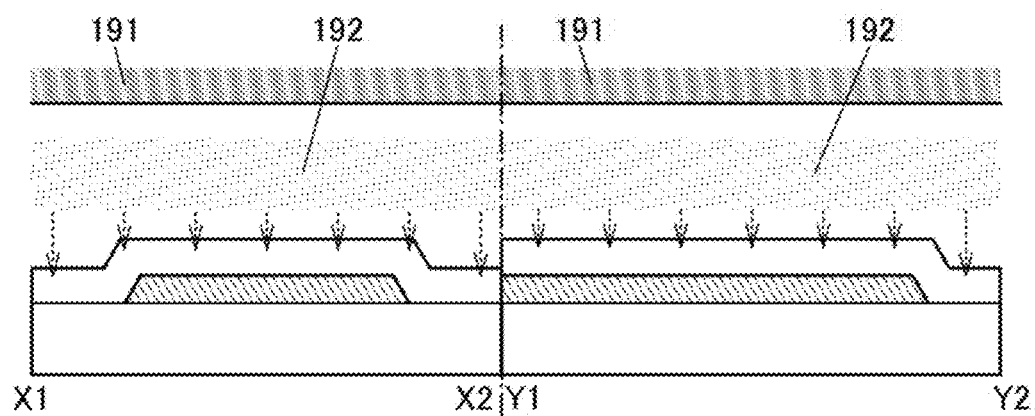
Figure 6C:
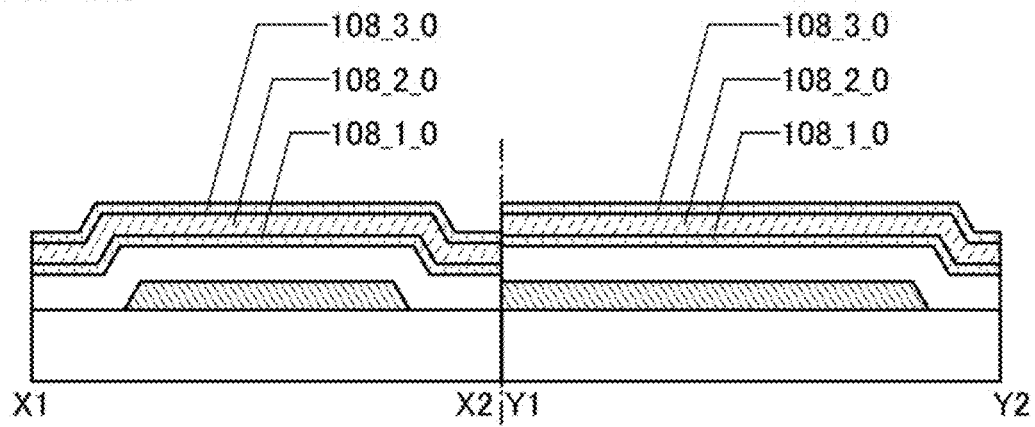

Next, an oxide semiconductor film 108_1_0, an oxide semiconductor film 108_2_0, and an oxide semiconductor film 108_3_0 are formed over the insulating film 106 (see FIGS. 6B and 6C).

FIG. 6B is a schematic cross-sectional view illustrating the inside of a deposition apparatus when the oxide semiconductor film 108_1_0, the oxide semiconductor film 108_2_0, and the oxide semiconductor film 108_3_0 are formed over the insulating film 106. In FIG. 6B, a sputtering apparatus is used as the deposition apparatus, and a target 191 placed inside the sputtering apparatus and plasma 192 formed under the target 191 are schematically illustrated.

First, the oxide semiconductor film 108_1_0 is formed over the insulating film 106. When the oxide semiconductor film 108_1_0 is formed, plasma discharge is performed in an atmosphere containing an oxygen gas. At this time, oxygen is added to the insulating film 106 over which the oxide semiconductor film 108_1_0 is to be formed. When the oxide semiconductor film 108_1_0 is formed, an inert gas (e.g., a helium gas, an argon gas, or a xenon gas) and the oxygen gas may be mixed. The proportion of the oxygen gas in a deposition gas for forming the oxide semiconductor film 108_1_0 (percentage of oxygen flow rate) is higher than or equal to 70% and lower than or equal to 100%, preferably higher than or equal to 80% and lower than or equal to 100%, further preferably higher than or equal to 90% and lower than or equal to 100%.

In FIG. 6B, oxygen or excess oxygen added to the insulating film 106 is schematically shown by arrows of broken lines. When the percentage of oxygen flow rate for forming the oxide semiconductor film 108_1_0 is in the above range, oxygen can be added to the insulating film 106 in a favorable manner. Furthermore, when the percentage of oxygen flow rate for forming the oxide semiconductor film 108_1_0 is in the above range, the oxide semiconductor film 108_1_0 can have higher crystallinity.

The thickness of the oxide semiconductor film 108_1_0 is greater than or equal to 1 nm and less than 20 nm, preferably greater than or equal to 5 nm and less than or equal to 10 nm.

Next, the oxide semiconductor film 108_2_0 is formed over the oxide semiconductor film 108_1_0. The oxide semiconductor film 108_2_0 is formed using one or both of an inert gas and an oxygen gas. The percentage of oxygen flow rate in forming the oxide semiconductor film 108_2_0 is higher than 0% and lower than or equal to 20%, preferably higher than or equal to 5% and lower than or equal to 15%.

When the percentage of oxygen flow rate for forming the oxide semiconductor film 108_2_0 is in the above range, the oxide semiconductor film 108_2_0 can have lower crystallinity.

The thickness of the oxide semiconductor film 108_2_0 is greater than or equal to 20 nm and less than or equal to 100 nm, preferably greater than or equal to 20 nm and less than or equal to 50 nm.

Next, the oxide semiconductor film 108_3_0 is formed over the oxide semiconductor film 108_2_0. The oxide semiconductor film 108_3_0 is formed in an atmosphere containing an oxygen gas. The percentage of oxygen flow rate in forming the oxide semiconductor film 108_3_0 is higher than or equal to 70% and lower than or equal to 100%, preferably higher than or equal to 80% and lower than or equal to 100%, further preferably higher than or equal to 90% and lower than or equal to 100%.

When the percentage of oxygen flow rate for forming the oxide semiconductor film 108_3_0 is in the above range, oxygen can be added to the oxide semiconductor film 108_2_0 in a favorable manner. When the percentage of oxygen flow rate for forming the oxide semiconductor film 108_3_0 is in the above range, the oxide semiconductor film 108_3_0 can have higher crystallinity.

The thickness of the oxide semiconductor film 108_3_0 is greater than or equal to 1 nm and less than 20 nm, preferably greater than or equal to 5 nm and less than or equal to 15 nm.

As described above, the percentage of oxygen flow rate for forming the oxide semiconductor film 108_1_0 and that for forming the oxide semiconductor film 108_3_0 are preferably higher than the percentage of oxygen flow rate for forming the oxide semiconductor film 108_2_0. In other words, the oxide semiconductor film 108_2_0 is preferably formed under a lower oxygen partial pressure than one or both of the oxide semiconductor film 108_1_0 and the oxide semiconductor film 108_3_0.

The substrate temperature at the time of formation of the oxide semiconductor film 108_1_0, the oxide semiconductor film 108_20, and the oxide semiconductor film 108_3_0 is set at higher than or equal to room temperature (25° C.) and lower than or equal to 200° C., preferably higher than or equal to room temperature and lower than or equal to 130° C. Setting the substrate temperature in the above range is favorable for large glass substrates (e.g., the above-described 8th- to 10th-generation glass substrates). Specifically, when the substrate temperature for forming the oxide semiconductor film 108_1_0, the oxide semiconductor film 108_2_0, and the oxide semiconductor film 108_3_0 is set at room temperature, bending or distortion of the substrate can be inhibited.

Note that it is more favorable to successively form the oxide semiconductor film 108_1_0, the oxide semiconductor film 108_2_0, and the oxide semiconductor film 108_3_0 in a vacuum because impurities can be prevented from being caught at the interfaces.

In addition, increasing the purity of a sputtering gas is necessary. For example, as an oxygen gas or an argon gas used as a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film can be minimized.

In the case where the oxide semiconductor film is deposited by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor film, as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably $5\times10^{-5}$ Pa.

In this embodiment, the oxide semiconductor film 108_1_0 is formed by a sputtering method using an In—Ga—Zn metal oxide target (In:Ga:Zn=4:2:4.1 in an atomic ratio). The substrate temperature during the formation of the oxide semiconductor film 108_1_0 is room temperature, and an oxygen gas at a flow rate of 200 sccm is used as a deposition gas (percentage of oxygen flow rate: 100%).

In addition, the oxide semiconductor film 108_2_0 is formed by a sputtering method using an In—Ga—Zn metal oxide target (In:Ga:Zn=4:2:4.1 in an atomic ratio). The substrate temperature during the formation of the oxide semiconductor film 108_2_0 is room temperature, and an oxygen gas at a flow rate of 20 sccm and an argon gas at a flow rate of 180 sccm are used as a deposition gas (percentage of oxygen flow rate: 10%).

The oxide semiconductor film 108_3_0 is formed by a sputtering method using an In—Ga—Zn metal oxide target (In:Ga:Zn=4:2:4.1 in an atomic ratio). The substrate temperature during the formation of the oxide semiconductor film 108_3_0 is room temperature, and an oxygen gas at a flow rate of 200 sccm is used as a deposition gas (percentage of oxygen flow rate: 100%).

When the percentage of oxygen flow rate in forming the oxide semiconductor film 108_1_0 and the oxide semiconductor film 108_3_0 is different from that in forming the oxide semiconductor film 108_2_0, a layered film having a plurality of kinds of crystallinity can be formed.

Next, the oxide semiconductor film 108_1_0, the oxide semiconductor film 108_2_0, and the oxide semiconductor film 108_3_0 are processed into desired shapes, so that the island-shaped oxide semiconductor film 108_1, the island-shaped oxide semiconductor film 108_2, and the island-shaped oxide semiconductor film 108_3 are formed. In this embodiment, the oxide semiconductor film 108_1, the oxide semiconductor film 108_2, and the oxide semiconductor film 108_3 constitute the oxide semiconductor film 108 (see FIG. 7A).

Heat treatment (hereinafter referred to as first heat treatment) is preferably performed after the oxide semiconductor film 108 is formed. By the first heat treatment, water, hydrogen, or the like contained in the oxide semiconductor film 108 can be reduced. The heat treatment for the purpose of reducing hydrogen, water, and the like may be performed before the oxide semiconductor film 108 is processed into an island shape. Note that the first heat treatment is one kind of treatment for increasing the purity of the oxide semiconductor film.

The first heat treatment can be performed at a temperature of, for example, higher than or equal to 150° C. and lower than the strain point of the substrate, preferably higher than or equal to 200° C. and lower than or equal to 450° C., further preferably higher than or equal to 250° C. and lower than or equal to 350° C.

Moreover, an electric furnace, an RTA apparatus, or the like can be used for the first heat treatment. With the use of an RTA apparatus, the heat treatment can be performed at a temperature higher than or equal to the strain point of the substrate if the heating time is short. Therefore, the heat treatment time can be shortened. The first heat treatment may be performed under an atmosphere of nitrogen, oxygen, ultra-dry air (air with a water content of 20 ppm or less, preferably 1 ppm or less, further preferably 10 ppb or less), or a rare gas (e.g., argon, helium). It is preferable that hydrogen, water, and the like not be contained in the nitrogen, oxygen, ultra-dry air, or rare gas. Furthermore, after heat treatment is performed under a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the number of oxygen vacancies in the oxide semiconductor film can be reduced.

Figure 7A:
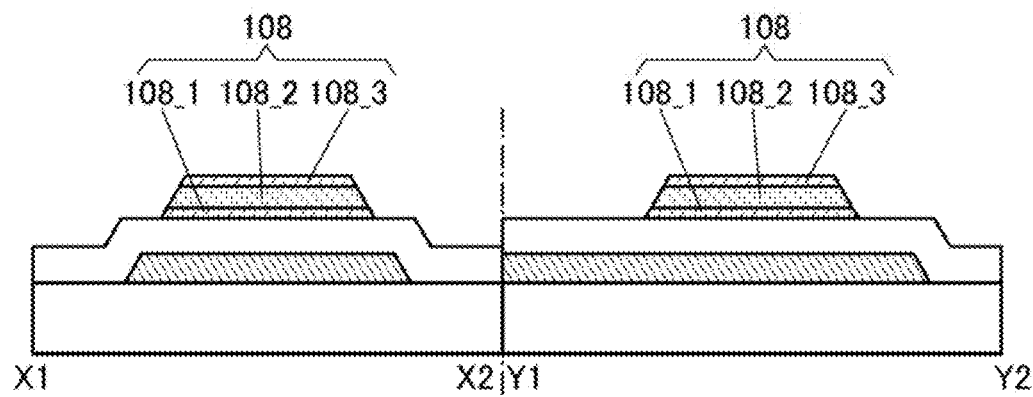
FIGS. 7A to 7C are cross-sectional views illustrating a method for manufacturing a semiconductor device.
Figure 7B:
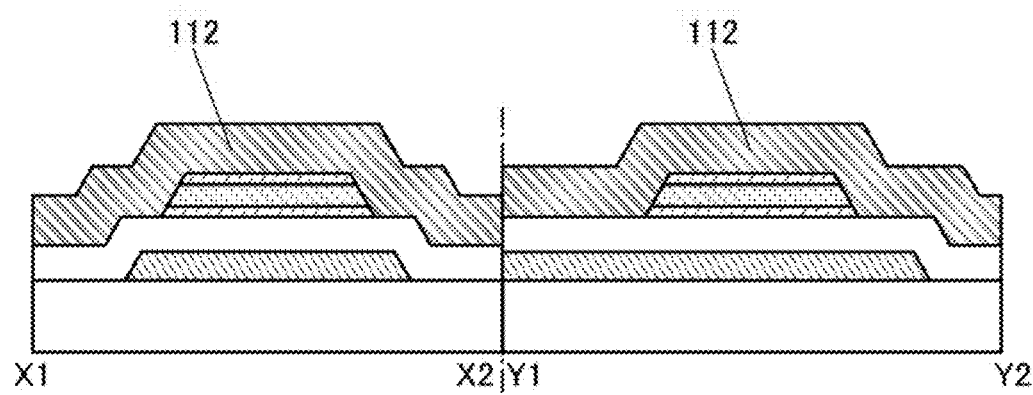

Next, a conductive film 112 is formed over the insulating film 106 and the oxide semiconductor film 108 (see FIG. 7B).

In this embodiment, as the conductive film 112, a 30-nm-thick titanium film, a 200-nm-thick copper film, and a 10-nm-thick titanium film are formed in this order by a sputtering method.

Figure 7C:
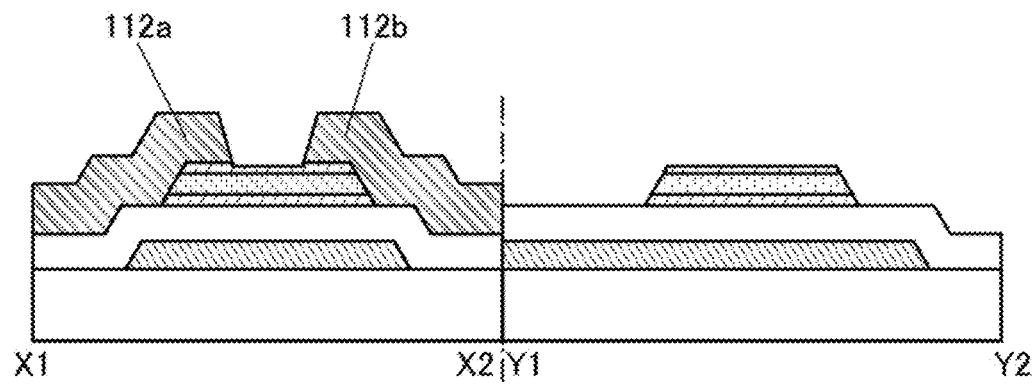

Next, the conductive film 112 is processed into a desired shape, so that the island-shaped conductive film 112a and the island-shaped conductive film 112b are formed (see FIG. 7C).

In this embodiment, the conductive film 112 is processed with a wet etching apparatus. Note that the method for processing the conductive film 112 is not limited to the above-described method, and a dry etching apparatus may be used, for example.

After the conductive films 112a and 112b are formed, a surface (on the back channel side) of the oxide semiconductor film 108 (specifically, the oxide semiconductor film 108_3) may be cleaned. The cleaning may be performed, for example, using a chemical solution such as a phosphoric acid. The cleaning using a chemical solution such as a phosphoric acid can remove impurities (e.g., an element included in the conductive films 112a and 112b) attached to the surface of the oxide semiconductor film 108_3. Note that the cleaning is not necessarily performed; in some cases, the cleaning is not performed.

In the step of forming the conductive films 112a and 112b and/or the cleaning step, the thickness of a region of the oxide semiconductor film 108 which is not covered with the conductive films 112a and 112b might be reduced.

Note that in the semiconductor device of one embodiment of the present invention, the region not covered with the conductive films 112a and 112b, i.e., the oxide semiconductor film 108_3 is an oxide semiconductor film with improved crystallinity. Impurities (in particular, constituent elements used in the conductive films 112a and 112b) are not easily diffused into an oxide semiconductor film with high crystallinity. Accordingly, a highly reliable semiconductor device can be provided.

Although FIG. 7C illustrates an example in which the surface of the oxide semiconductor film 108 not covered with the conductive films 112a and 112b, i.e., the surface of the oxide semiconductor film 108_3 has a depression, one embodiment of the present invention is not limited to this example and the surface of the oxide semiconductor film 108 not covered with the conductive films 112a and 112b does not necessarily have a depression.

Figure 8A:
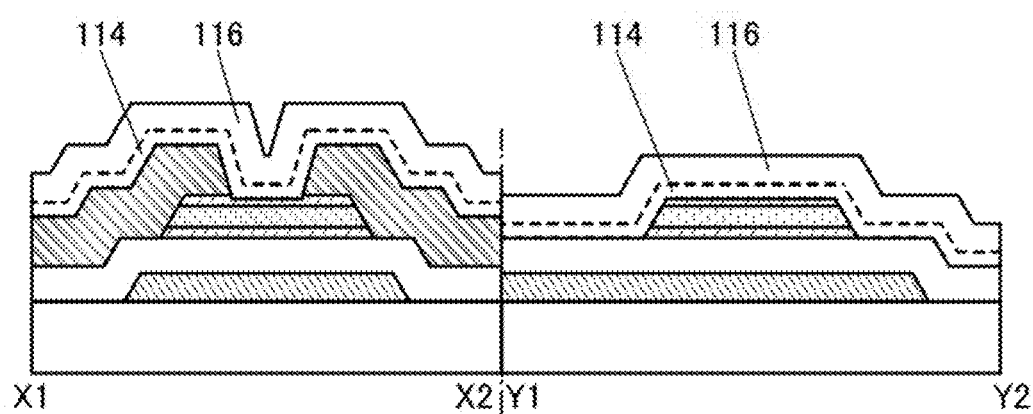
FIGS. 8A to 8C are cross-sectional views illustrating a method for manufacturing a semiconductor device.

Next, the insulating film 114 and the insulating film 116 are formed over the oxide semiconductor film 108 and the conductive films 112a and 112b (see FIG. 8A).

Note that after the insulating film 114 is formed, the insulating film 116 is preferably formed successively without exposure to the air. When the insulating film 116 is formed successively after the formation of the insulating film 114 without exposure to the air while at least one of the flow rate of a source gas, the pressure, high-frequency power, and the substrate temperature is adjusted, the concentration of impurities attributed to the atmospheric component at the interface between the insulating films 114 and 116 can be reduced.

For example, as the insulating film 114, a silicon oxynitride film can be formed by a PECVD method. In that case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. The flow rate of the oxidizing gas is more than or equal to 20 times and less than or equal to 500 times, preferably more than or equal to 40 times and less than or equal to 100 times, that of the deposition gas.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the insulating film 116, a silicon oxide film or a silicon oxynitride film is formed under the following conditions: the substrate placed in the treatment chamber of the PECVD apparatus that is vacuum-evacuated is held at a temperature of higher than or equal to 180° C. and lower than or equal to 350° C., the pressure in the treatment chamber is higher than or equal to 100 Pa and lower than or equal to 250 Pa, preferably higher than or equal to 100 Pa and lower than or equal to 200 Pa, with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 116, the high-frequency power having the above power density is supplied to the reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. In the film formed at a substrate temperature within the above temperature range, the bond between silicon and oxygen is weak, and accordingly, part of oxygen in the film is released by heat treatment in a later step. Thus, it is possible to form an oxide insulating film which contains more oxygen than that in the stoichiometric composition and from which part of oxygen is released by heating.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the amount of defects in the insulating film 116 can be reduced. Typically, it is possible to form an oxide insulating film in which the amount of defects is small, i.e., the spin density of a signal which appears at g=2.001 due to a dangling bond of silicon, is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor 100 can be improved.

Heat treatment (hereinafter referred to as second heat treatment) is preferably performed after the insulating films 114 and 116 are formed. The second heat treatment can reduce nitrogen oxide included in the insulating films 114 and 116. By the second heat treatment, part of oxygen contained in the insulating films 114 and 116 can be transferred to the oxide semiconductor film 108, so that the amount of oxygen vacancies included in the oxide semiconductor film 108 can be reduced.

The temperature of the second heat treatment is typically lower than 400° C., preferably lower than 375° C., further preferably higher than or equal to 150° C. and lower than or equal to 350° C. The second heat treatment may be performed in an atmosphere of nitrogen, oxygen, ultra-dry air (air with a water content of less than or equal to 20 ppm, preferably less than or equal to 1 ppm, further preferably less than or equal to 10 ppb), or a rare gas (e.g., argon, helium). It is preferable that hydrogen, water, and the like not be contained in the nitrogen, oxygen, ultra-dry air, or rare gas. An electric furnace, RTA, or the like can be used for the heat treatment.

Figure 8B:
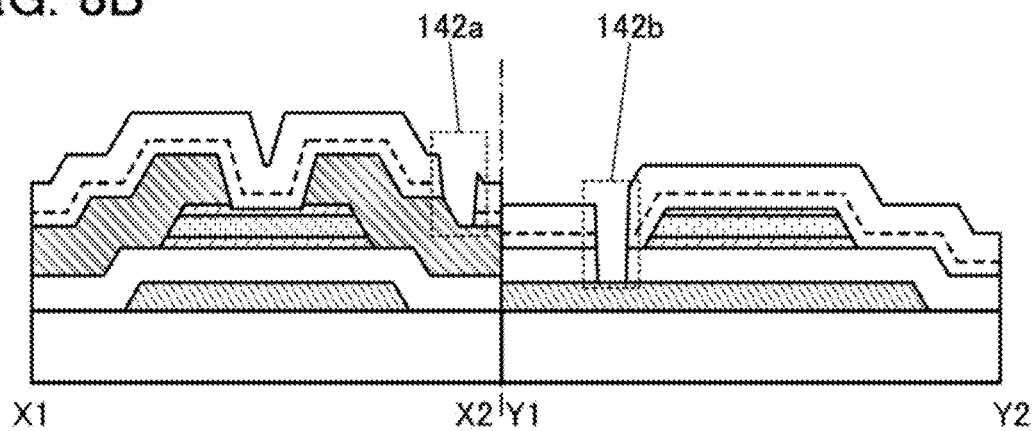

Next, the openings 142a and 142b are formed in desired regions in the insulating films 114 and 116 (see FIG. 8B).

In this embodiment, the openings 142a and 142b are formed with a dry etching apparatus. Note that the opening 142a reaches the conductive film 112b, and the opening 142b reaches the conductive film 104.

Figure 8C:
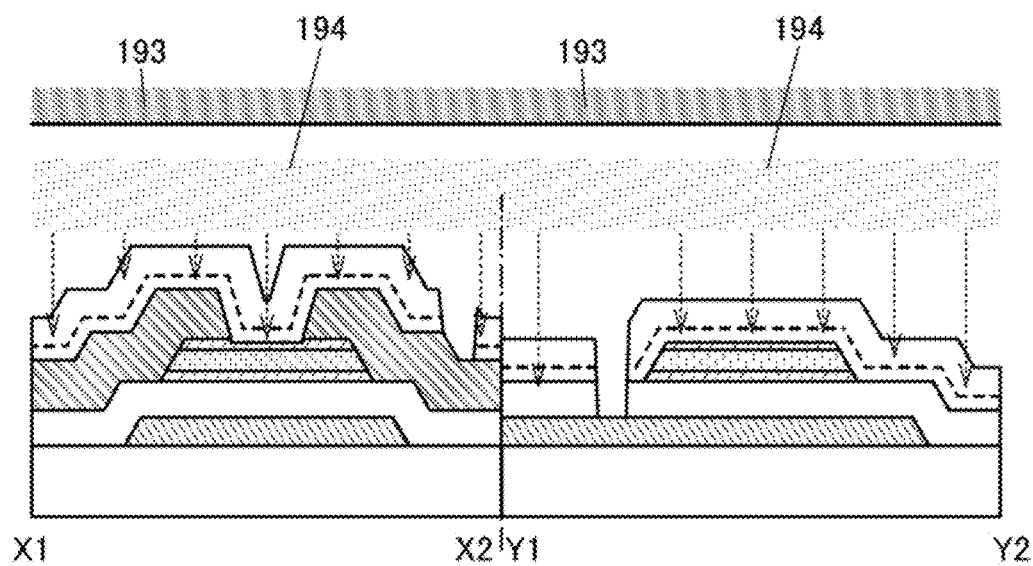
Figure 9A:
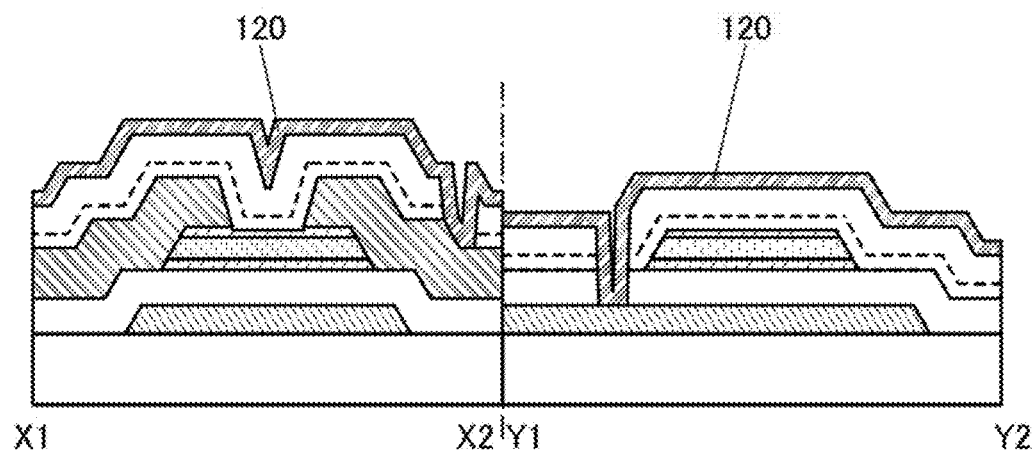
FIGS. 9A to 9C are cross-sectional views illustrating a method for manufacturing a semiconductor device.

Next, a conductive film 120 is formed over the insulating film 116 (see FIG. 8C and FIG. 9A).

FIG. 8C is a schematic cross-sectional view illustrating the inside of a deposition apparatus when the conductive film 120 is formed over the insulating film 116. In FIG. 8C, a sputtering apparatus is used as the deposition apparatus, and a target 193 placed inside the sputtering apparatus and plasma 194 formed under the target 193 are schematically illustrated.

When the conductive film 120 is formed, plasma discharge is performed in an atmosphere containing an oxygen gas. At this time, oxygen is added to the insulating film 116 over which the conductive film 120 is to be formed. When the conductive film 120 is formed, an inert gas (e.g., a helium gas, an argon gas, or a xenon gas) and the oxygen gas may be mixed.

The oxygen gas is mixed at least when the conductive film 120 is formed. The proportion of the oxygen gas in a deposition gas for forming the conductive film 120 is higher than 0% and lower than or equal to 100%, preferably higher than or equal to 10% and lower than or equal to 100%, further preferably higher than or equal to 30% and lower than or equal to 100%.

In FIG. 8C, oxygen or excess oxygen added to the insulating film 116 is schematically shown by arrows of broken lines.

In this embodiment, the conductive film 120 is formed by a sputtering method using an In—Ga—Zn metal oxide target (In:Ga:Zn=4:2:4.1 in an atomic ratio).

Note that although oxygen is added to the insulating film 116 when the conductive film 120 is formed in this embodiment, the method for adding oxygen is not limited to this example. For example, oxygen may be further added to the insulating film 116 after the conductive film 120 is formed.

As the method for adding oxygen to the insulating film 116, an ITSO film with a thickness of 5 nm may be formed using a target of an oxide including indium, tin, and silicon (an In—Sn—Si oxide, also referred to as ITSO) (In$_2$O$_3$: SnO$_2$:SiO$_2$=85:10:5 in wt %), for example. In that case, the thickness of the ITSO film is preferably greater than or equal to 1 nm and less than or equal to 20 nm or greater than or equal to 2 nm and less than or equal to 10 nm, in which case oxygen is favorably transmitted and release of oxygen can be inhibited. Then, oxygen is added to the insulating film 116 through the ITSO film. Oxygen can be added by, for example, ion doping, ion implantation, or plasma treatment. By application of a bias voltage to the substrate side when oxygen is added, oxygen can be effectively added to the insulating film 116. An ashing apparatus is used, for example, and the power density of the bias voltage applied to the substrate side of the ashing apparatus can be greater than or equal to 1 W/cm$^2$ and less than or equal to 5 W/cm$^2$. The substrate temperature during addition of oxygen is higher than or equal to room temperature and lower than or equal to 300° C., preferably higher than or equal to 100° C. and lower than or equal to 250° C., whereby oxygen can be added efficiently to the insulating film 116.

Figure 9B:
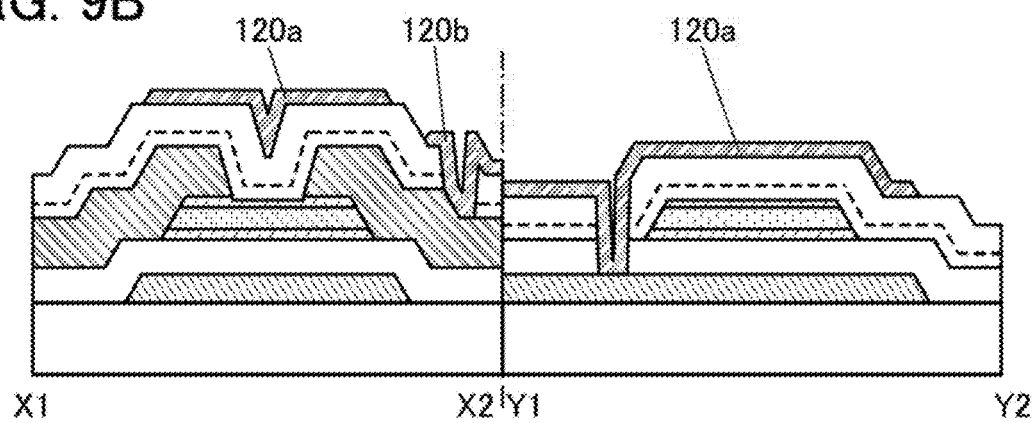

Next, the conductive film 120 is processed into a desired shape, so that the island-shaped conductive films 120a and 120b are formed (see FIG. 9B).

In this embodiment, the conductive film 120 is processed with a wet etching apparatus.

Figure 9C:
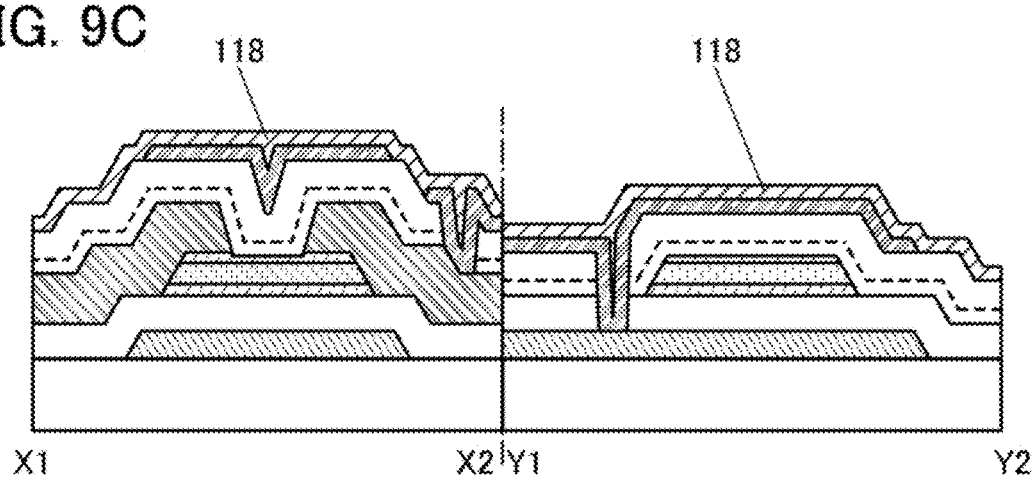

Next, the insulating film 118 is formed over the insulating film 116 and the conductive films 120a and 120b (see FIG. 9C).

The insulating film 118 includes either or both of hydrogen and nitrogen. As the insulating film 118, a silicon nitride film is preferably used, for example. The insulating film 118 can be formed by a sputtering method or a PECVD method, for example. In the case where the insulating film 118 is formed by a PECVD method, for example, the substrate temperature is lower than 400° C., preferably lower than 375° C., and further preferably higher than or equal to 180° C. and lower than or equal to 350° C. The substrate temperature at which the insulating film 118 is formed is preferably within the above range because a dense film can be formed. Furthermore, when the substrate temperature at which the insulating film 118 is formed is within the above range, oxygen or excess oxygen in the insulating films 114 and 116 can be moved to the oxide semiconductor film 108.

In the case where a silicon nitride film is formed by a PECVD method as the insulating film 118, a deposition gas containing silicon, nitrogen, and ammonia are preferably used as a source gas. A small amount of ammonia compared with the amount of nitrogen is used, whereby ammonia is dissociated in the plasma and activated species are generated. The activated species cleave a bond between silicon and hydrogen which are included in a deposition gas including silicon and a triple bond between nitrogen molecules. As a result, a dense silicon nitride film having few defects, in which bonds between silicon and nitrogen are promoted and bonds between silicon and hydrogen are few, can be formed. If the amount of ammonia with respect to nitrogen is large, decomposition of a deposition gas including silicon and decomposition of nitrogen are not promoted, so that a sparse silicon nitride film in which bonds between silicon and hydrogen remain and defects are increased is formed. Therefore, in the source gas, the flow rate of nitrogen is set to be preferably 5 times or more and 50 times or less, further preferably 10 times or more and 50 times or less the flow rate of ammonia.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to parallel-plate electrodes with a 27.12 MHz high-frequency power source. The PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

In the case where the conductive films 120a and 120b are formed using an In—Ga—Zn metal oxide target (In:Ga:Zn=4:2:4.1 in an atomic ratio), either or both of hydrogen and nitrogen included in the insulating film 118 might enter the conductive films 120a and 120b. In this case, either or both of hydrogen and nitrogen might be bonded to oxygen vacancies in the conductive films 120a and 120b to cause a reduction in the resistance of the conductive films 120a and 120b.

After the insulating film 118 is formed, heat treatment similar to the first heat treatment or the second heat treatment (hereinafter referred to as third heat treatment) may be performed.

By the third heat treatment, oxygen included in the insulating film 116 moves into the oxide semiconductor film 108 to fill the oxygen vacancies in the oxide semiconductor film 108.

Through the above process, the transistor 100B illustrated in FIGS. 3A to 3C can be manufactured.

The transistor 100 illustrated in FIGS. 1A to 1C can be manufactured by forming the insulating film 118 after the step of FIG. 8A. The transistor 100A illustrated in FIGS. 2A to 2C can be manufactured by changing the formation order of the conductive films 112a and 112b and the insulating films 114 and 116 and, in addition, adding a step for forming the openings 141a and 141b in the insulating films 114 and 116.

At least part of this embodiment can be implemented in combination with any of the other embodiments described in this specification as appropriate.

Embodiment 2

In this embodiment, an oxide semiconductor film of one embodiment of the present invention will be described with reference to FIGS. 11A and 11B, FIGS. 12A and 12B, FIGS. 13A and 13B, FIGS. 14A and 14B, FIG. 15, FIGS. 16A and 16B, FIG. 17, FIGS. 18A to 18C, FIGS. 19A to 19C, FIGS. 20A to 20C, FIGS. 21A to 21C, FIGS. 22A to 22C, FIGS. 23A to 23C, FIGS. 24A and 24B, FIG. 25, FIG. 26, FIGS. 27A1, 27A2, 27B1, 27B2, 27C1, and 27C2, FIG. 28, FIGS. 29A1, 29A2, 29B1, 29B2, 29C1, and 29C2, FIGS. 30A to 30C.

An oxide semiconductor film of one embodiment of the present invention preferably contains at least indium and zinc. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor film contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M in some cases.

<2-1. Schematic View of Top Surface and Cross Section of Oxide Semiconductor Film>

FIGS. 11A and 11B, FIGS. 12A and 12B, FIGS. 13A and 13B, and FIGS. 14A and 14B are schematic views of oxide semiconductor films of embodiments of the present invention. Note that FIG. 11A, FIG. 12A, FIG. 13A, and FIG. 14A are schematic views of top surfaces of the oxide semiconductor films (a-b plane direction) and FIG. 11B, FIG. 12B, FIG. 13B, and FIG. 14B are schematic views of cross sections of oxide semiconductor films (c-axis direction) each formed over a substrate (Sub.).

Figure 11A:
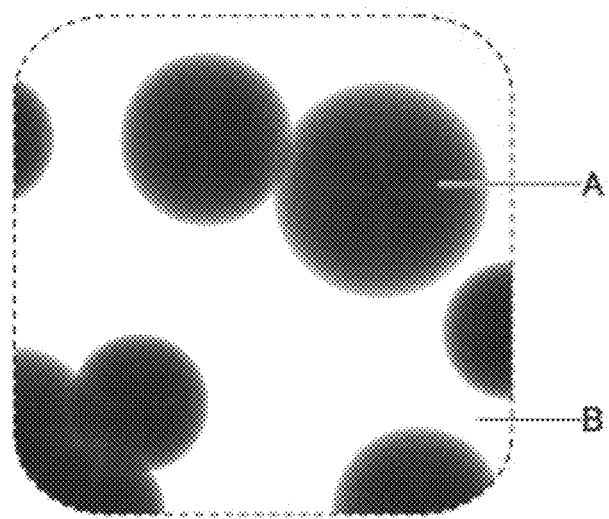
FIGS. 11A and 11B are schematic views illustrating a top structure and a cross-sectional structure of an oxide semiconductor film.
Figure 11B:
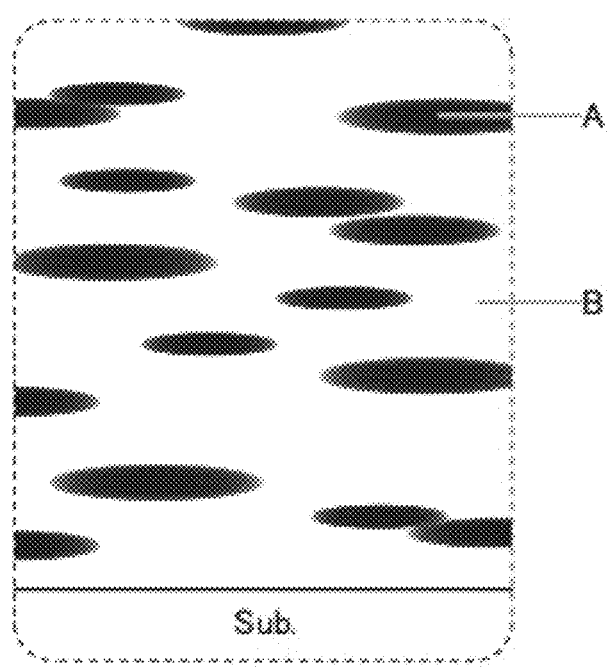

First, description is made with reference to FIGS. 11A and 11B.

As shown in FIGS. 11A and 11B, an oxide semiconductor film of one embodiment of the present invention includes Region A and Region B. That is, an oxide semiconductor film of one embodiment of the present invention is a composite oxide semiconductor in which Region A and Region B are mixed. Note that Region A is represented by $In_xZn_yO_z$ (x, y, and z each represent a given number) and Region B is represented by $In_aM_bZn_cO_d$ (M represents Al, Ga, Y, or Sn and a, b, c, and d each represent a given number). Note that Region A may contain M.

Note that the In concentration in Region A is higher than that in Region B. In other words, Region A is In-rich and Region B is In-poor. For example, it is preferable that the In concentration in Region A be greater than or equal to 1.1 times, further preferably greater than or equal to two times and less than or equal to 10 times the In concentration in Region B.

As shown in FIG. 11A, Region A is basically formed to have an almost circular shape in the a-b plane direction. As shown in FIG. 11B, Region A is basically formed to have an almost elliptical shape in the c-axis direction. In other words, Region A has an island-like shape and is surrounded by Region B. As shown in FIGS. 11A and 11B, Regions A are unevenly distributed in Region B. For this reason, two or more Regions A might be connected to be shaped like connected circles or connected ellipses. Note that the switching characteristics of the transistor are degraded (for example, the off-state current of the transistor is increased) when all of Regions A are connected in the c-axis direction; thus, Regions A are preferably scattered as shown in FIGS. 11A and 11B.

Figure 12A:
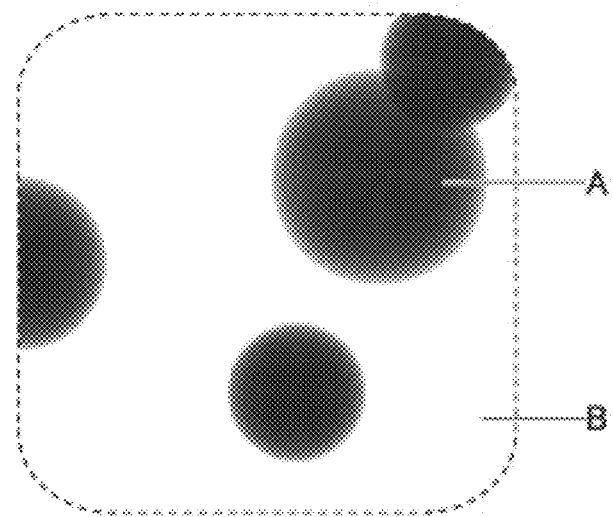
FIGS. 12A and 12B are schematic views illustrating a top structure and a cross-sectional structure of an oxide semiconductor film.
Figure 12B:
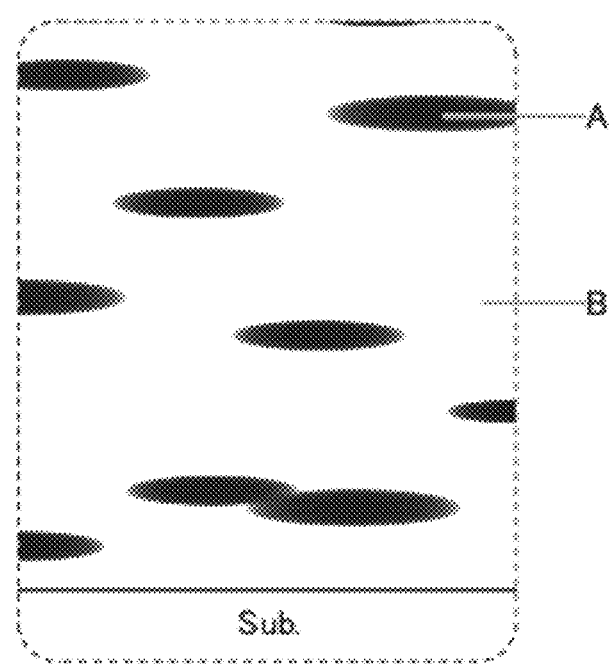
Figure 13A:
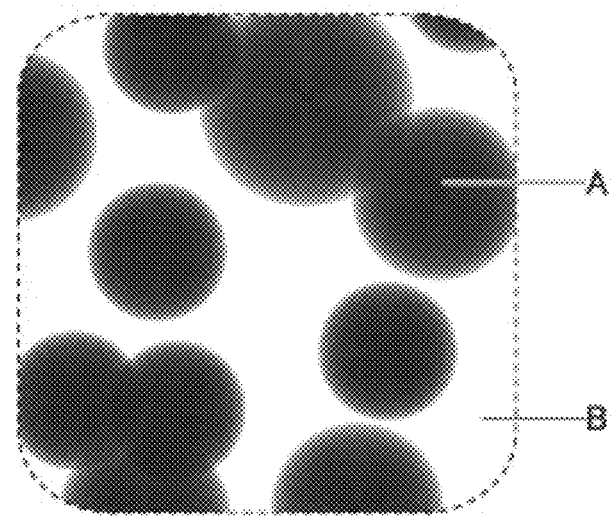
FIGS. 13A and 13B are schematic views illustrating a top structure and a cross-sectional structure of an oxide semiconductor film.
Figure 13B:
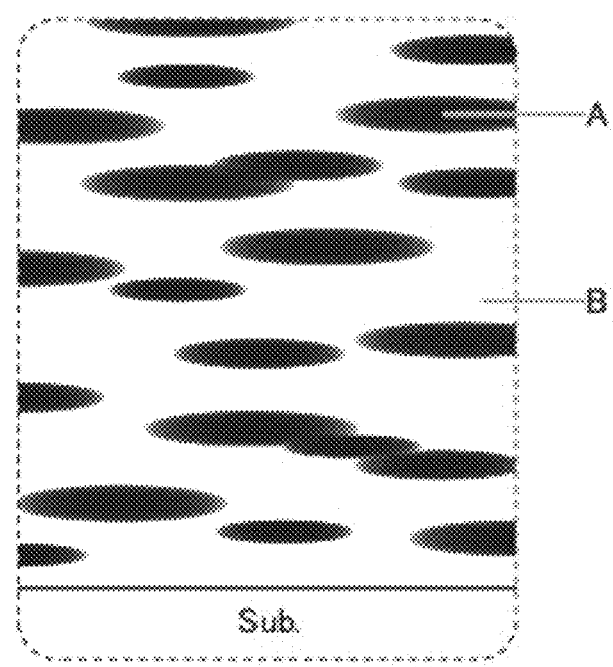

Note that the proportion of scattered Regions A can be adjusted by changing, for example, the formation conditions or composition of the composite oxide semiconductor. For example, it is possible to form a composite oxide semiconductor in which the proportion of Regions A is low as shown in FIGS. 12A and 12B or a composite oxide semiconductor in which the proportion of Regions A is high as shown in FIGS. 13A and 13B. In a composite oxide semiconductor, the proportion of Regions A is not always lower than that of Region B. In a composite oxide semiconductor with an extremely high proportion of Regions A, depending on the observation range, Region B is sometimes formed in Region A.

Figure 14A:
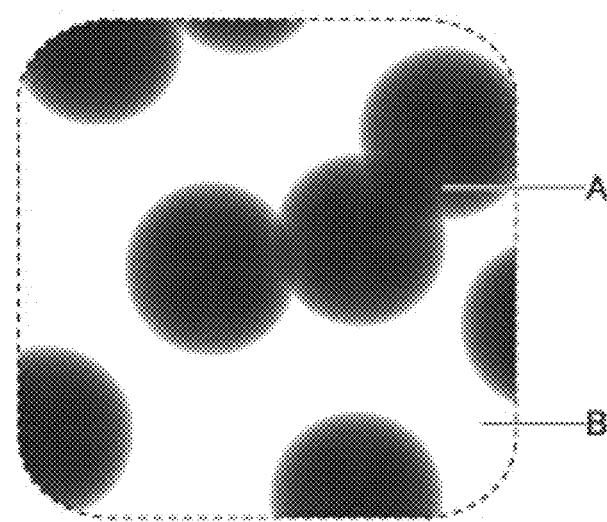
FIGS. 14A and 14B are schematic views illustrating a top structure and a cross-sectional structure of an oxide semiconductor film.
Figure 14B:
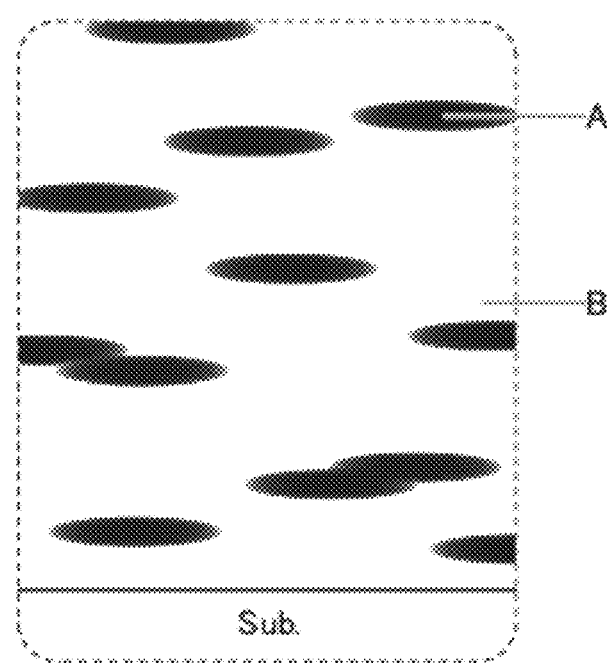

The size of the island-like shape of Region A can be adjusted by changing, for example, the formation conditions or composition of the composite oxide semiconductor. Although the island-like regions have various sizes in the schematic views in FIGS. 11A and 11B, FIGS. 12A and 12B, and FIGS. 13A and 13B, Regions A with substantially the same size are scattered as shown in FIGS. 14A and 14B in some cases.

As shown in FIGS. 11A and 11B, the boundary between Region A and Region B is not clear or cannot be observed in some cases. The thickness of each of Region A and Region B can be examined with an EDX mapping image of a cross-sectional photograph. Note that Region A is sometimes observed as having a size of greater than or equal to 0.1 nm and less than or equal to 5 nm or greater than or equal to 0.3 nm and less than or equal to 3 nm in an EDX mapping image of a cross-sectional photograph.

Since Region A is In-rich, it has a function of increasing carrier mobility. Thus, a transistor that uses an oxide semiconductor film including Region A can have increased on-state current and increased field-effect mobility. In contrast, since Region B is In-poor, it has a function of reducing carrier mobility. Thus, a transistor that uses an oxide semiconductor film including Region B can have reduced off-state current. In other words, Region A contributes to the on-state current and field-effect mobility of a transistor and Region B contributes to the switching characteristics of the transistor.

As described above, an oxide semiconductor film of one embodiment of the present invention is a composite oxide semiconductor in which Region A and Region B are mixed and have different functions that are complementary. For example, when an oxide semiconductor film of one embodiment of the present invention is an In—Ga—Zn oxide (hereinafter referred to as IGZO), in which Ga is used as the element M, the oxide semiconductor film can be called complementary IGZO (abbreviation: C/IGZO).

In contrast, when Region A and Region B are stacked in a layered manner, for example, interaction does not take place or is unlikely to take place between Region A and Region B, so that the function of Region A and that of Region B are independently performed in some cases. In that case, even when the field-effect mobility is increased owing to Regions A, the off-state current of the transistor might be increased. Therefore, in the case where an oxide semiconductor film of one embodiment of the present invention is the above-described composite oxide semiconductor or C/IGZO, a function of achieving high field-effect mobility and a function of achieving excellent switching characteristics can be obtained at the same time. This is an advantageous effect obtained by using the oxide semiconductor film of one embodiment of the present invention.

FIGS. 11A and 11B illustrate an example in which the oxide semiconductor film is formed over the substrate; however, one embodiment of the present invention is not limited to this example and an insulating film such as a base film or an interlayer film or another semiconductor film such as an oxide semiconductor film may be formed between the substrate and the oxide semiconductor film.

<2-2. Atomic Ratio of Oxide Semiconductor Film>

Next, the atomic ratio of an oxide semiconductor film of one embodiment of the present invention is described with reference to FIG. 15.

Figure 15:
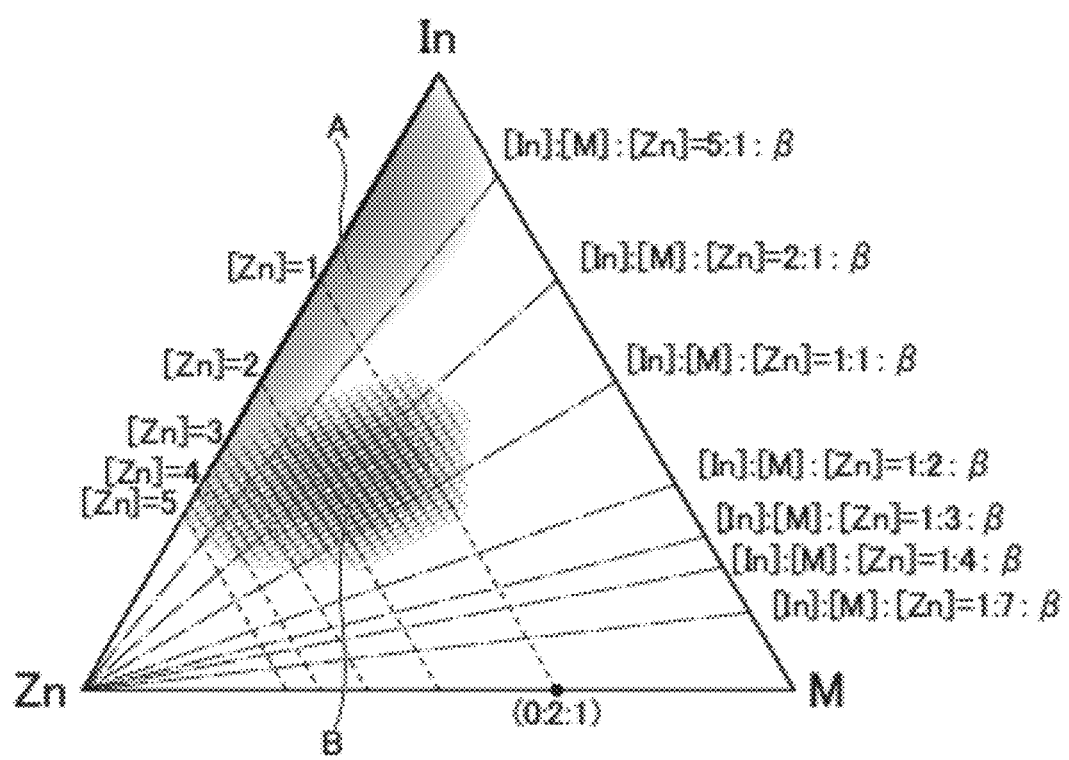
FIG. 15 illustrates an atomic ratio of an oxide semiconductor film.

The phase diagram in FIG. 15 can be used to show the atomic ratio of an element X to an element Y to an element Z in a substance. The atomic ratio of the element X to the element Y to the element Z is denoted by x:y:z. This atomic ratio can be shown as coordinates (x:y:z) in FIG. 15. Note that the proportion of oxygen atoms is not shown in FIG. 15.

In FIG. 15, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is 1:1: $\beta$, where $\beta \leq 0$, a line where the atomic ratio [In]:[M]:[Zn] is 1:2: $\beta$, a line where the atomic ratio [In]:[M]:[Zn] is 1:3: $\beta$, a line where the atomic ratio [In]:[M]:[Zn] is 1:4:$\beta$ a line where the atomic ratio [In]:[M]:[Zn] is 2:1: $\beta$, a line where the atomic ratio [In]:[M]:[Zn] is 5:1: $\beta$, and a line where the atomic ratio [In]:[M]:[Zn] is 1:7:$\beta$.

The oxide semiconductor film shown in FIG. 15 with an atomic ratio of [In]:[M]:[Zn]=0:2:1 or an atomic ratio that is in the neighborhood thereof tends to have a spinel crystal structure.

Region A in FIG. 15 is an example of a preferable range of the atomic ratio of In to M to Zn in a region with a high proportion of In (a region where [In]:[M]:[Zn]=x:y:z (x>0, y≥0, z≥0)). Note that Region A includes a line where the atomic ratio [In]:[M]:[Zn] is $(1+\gamma):0:(1-\gamma)$ $(-1<\gamma \leq 1)$.

Region B in FIG. 15 is an example of a preferable range of the atomic ratio of In to M to Zn in a region that contains a lower proportion of In than Region A (a region where [In]:[M]:[Zn]=m:n:l (m>0, n≥0, l≥0)). Note that Region B includes an atomic ratio of [In]:[M]:[Zn]=4:2:3 to 4.1 and the neighborhood thereof. The neighborhood includes an atomic ratio of [In]:[M]:[Zn]=5:3:4. Note that Region B includes an atomic ratio of [In]:[M]:[Zn]=5:1:6 and the neighborhood thereof. An oxide semiconductor film with an atomic ratio represented by Region B is an oxide semiconductor film that has high crystallinity.

In the case where the oxide semiconductor film is formed with a sputtering apparatus, a film having an atomic ratio different from the atomic ratio of the target is formed in some cases. Specifically, depending on the substrate temperature during deposition, the atomic proportion of [Zn] in a deposited film is lower than that of [Zn] in the target in some cases.

<2-3. Sputtering Apparatus>

Here, an example of the sputtering apparatus is described with reference to FIGS. 16A and 16B.

Figure 16A:
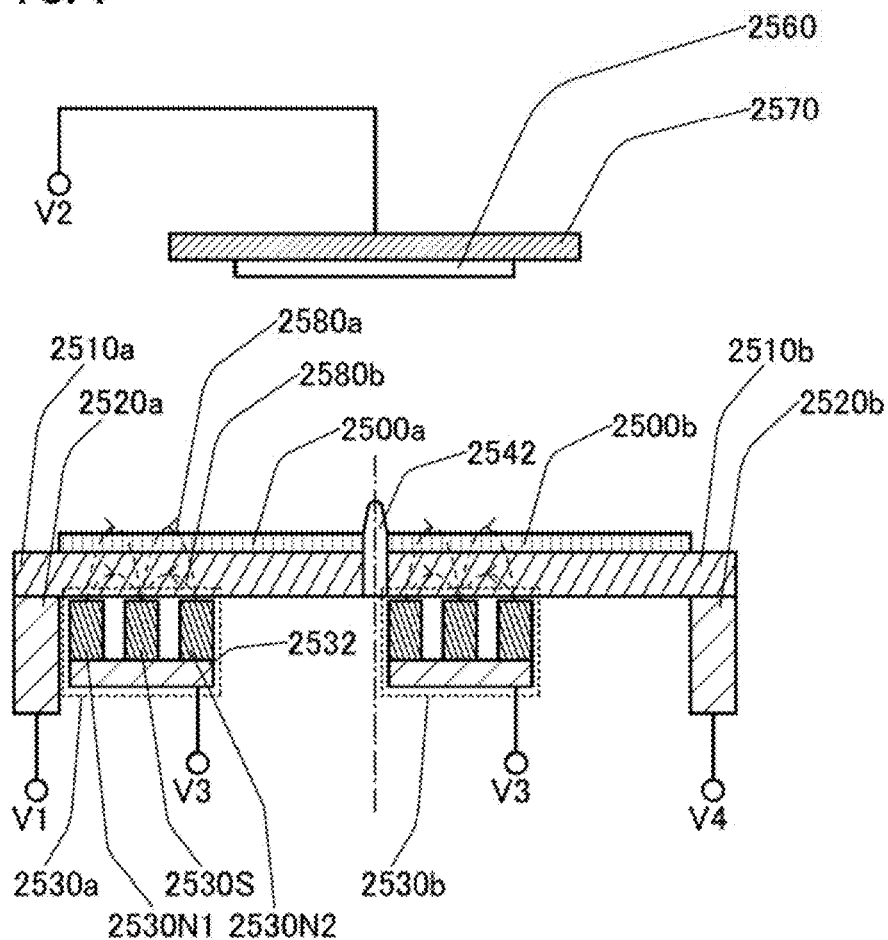
FIGS. 16A and 16B illustrate a sputtering apparatus.

FIG. 16A is a cross-sectional view of a deposition chamber 2501 of the sputtering apparatus. FIG. 16B is a plan view of a magnet unit 2530a and a magnet unit 2530b of the sputtering apparatus.

The deposition chamber 2501 illustrated in FIG. 16A includes a target holder 2520a, a target holder 2520b, a backing plate 2510a, a backing plate 2510b, a target 2500a, a target 2500b, a member 2542, and a substrate holder 2570. Note that the target 2500a is placed over the backing plate 2510a. The backing plate 2510a is placed over the target holder 2520a. The magnet unit 2530a is placed under the target 2500a with the backing plate 2510a therebetween.

The target 2500b is placed over the backing plate 2510b. The backing plate 2510b is placed over the target holder 2520b. The magnet unit 2530b is placed under the target 2500b with the backing plate 2510b therebetween.

Figure 16B:
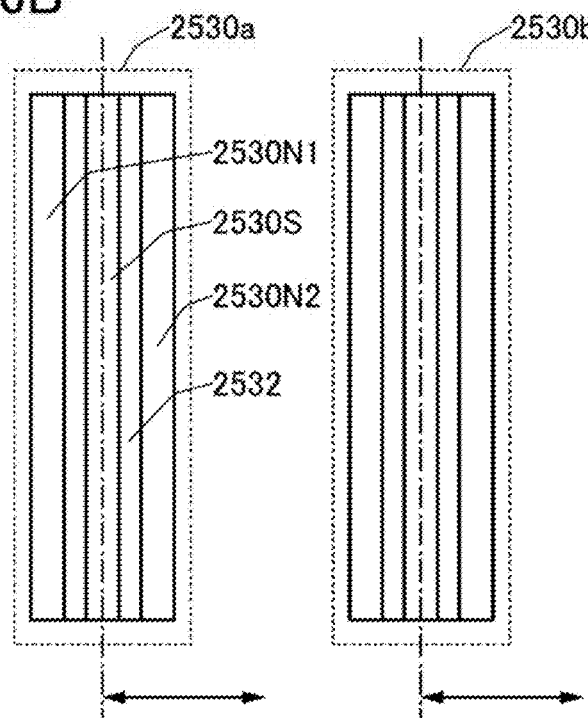

As illustrated in FIGS. 16A and 16B, the magnet unit 2530a includes a magnet 2530N1, a magnet 2530N2, a magnet 2530S, and a magnet holder 2532. The magnet 2530N1, the magnet 2530N2, and the magnet 2530S are placed over the magnet holder 2532 in the magnet unit 2530a. The magnet 2530N1, the magnet 2530N2, and the magnet 2530S are spaced. Note that the magnet unit 2530b has a structure similar to that of the magnet unit 2530a. When the substrate 2560 is transferred into the deposition chamber 2501, the substrate 2560 is placed in contact with the substrate holder 2570.

The target 2500a, the backing plate 2510a, and the target holder 2520a are separated from the target 2500b, the backing plate 2510b, and the target holder 2520b by the member 2542. Note that the member 2542 is preferably an insulator. The member 2542 may be a conductor or a semiconductor. The member 2542 may be a conductor or a semiconductor whose surface is covered with an insulator.

The target holder 2520a and the backing plate 2510a are fixed to each other with a screw (e.g., a bolt) and have the same potential. The target holder 2520a has a function of supporting the target 2500a with the backing plate 2510a positioned therebetween. The target holder 2520b and the backing plate 2510b are fixed to each other with a screw (e.g., a bolt) and have the same potential. The target holder 2520b has a function of supporting the target 2500b with the backing plate 2510b positioned therebetween.

The backing plate 2510a has a function of fixing the target 2500a. The backing plate 2510b has a function of fixing the target 2500b.

Magnetic lines of force 2580a and 2580b formed by the magnet unit 2530a are illustrated in FIG. 16A.

As illustrated in FIG. 16B, the magnet unit 2530a has a structure in which the magnet 2530N1 having a rectangular or substantially rectangular shape, the magnet 2530N2 having a rectangular or substantially rectangular shape, and the magnet 2530S having a rectangular or substantially rectangular shape are fixed to the magnet holder 2532. The magnet unit 2530a can be oscillated horizontally as shown by an arrow in FIG. 16B. For example, the magnet unit 2530a may be oscillated with a beat of greater than or equal to 0.1 Hz and less than or equal to 1 kHz.

The magnetic field over the target 2500a changes in accordance with oscillation of the magnet unit 2530a. The region with an intense magnetic field is a high-density plasma region; thus, sputtering of the target 2500a easily occurs in the vicinity of the region. The same applies to the magnet unit 2530b.

Here, the case where the target 2500a and the target 2500b are each an In—Ga—Zn oxide target is considered. For example, the target 2500a and the target 2500b each have an atomic ratio of In:Ga:Zn=4:2:4.1. In the case of using a sputtering apparatus provided with the above targets, the deposition model of an oxide semiconductor film of one embodiment of the present invention can be presumed in the following manner.

Note that the gases introduced into the sputtering apparatus are an argon gas and an oxygen gas. Furthermore, a potential applied to a terminal V1 connected to the target holder 2520a is lower than a potential applied to a terminal V2 connected to the substrate holder 2570. A potential applied to a terminal V4 connected to the target holder 2520b is lower than the potential applied to the terminal V2 connected to the substrate holder 2570. The potential applied to the terminal V2 connected to the substrate holder 2570 is a ground potential. A potential applied to a terminal V3 connected to the magnet holder 2532 is a ground potential.

Note that the potentials applied to the terminals V1, V2, V3, and V4 are not limited to the above-described potentials. Not all the target holder 2520, the substrate holder 2570, and the magnet holder 2532 are necessarily supplied with potentials. For example, the substrate holder 2570 may be electrically floating. Note that it is assumed that a power source capable of controlling a potential applied to the terminal V1 is electrically connected to the terminal V1. As the power source, a DC power source, an AC power source, or an RF power source may be used.

First, in the deposition chamber 2501, an argon gas or an oxygen gas is ionized to be separated into cations and electrons, and plasma is created. Then, the cations in the plasma are accelerated toward the targets 2500a and 2500b by the potential V1 applied to the target holder 2520a and the potential V4 applied to the target holder 2520b. Sputtered particles are generated when the cations collide with the targets 2500a and 2500b, and the sputtered particles are deposited on the substrate 2560.

When the targets 2500a and 2500b are each an In—Ga—Zn oxide target, the cations collide with the targets 2500a and 2500b, so that Ga and Zn each of which has a smaller relative atom mass than In are sputtered from the targets 2500a and 2500b preferentially to be deposited on the substrate 2560. Because of release of Ga and Zn, In is segregated on the surfaces of the targets 2500a and 2500b. Then, the In segregated on the surfaces of the targets 2500a and 2500b are sputtered from the targets 2500a and 2500b to be deposited on the substrate 2560.

The composite oxide semiconductor as illustrated in FIGS. 11A and 11B, FIGS. 12A and 12B, FIGS. 13A and 13B, or FIGS. 14A and 14B, in which Region A and Region B are mixed, is presumed to be formed after the above-described deposition model.

<2-4. Carrier Density of Oxide Semiconductor Film>

Next, the carrier density of an oxide semiconductor film will be described below.

Examples of a factor affecting the carrier density of an oxide semiconductor film include oxygen vacancies (Vo) and impurities in the oxide semiconductor film.

As the amount of oxygen vacancies in the oxide semiconductor film increases, the density of defect states increases when hydrogen is bonded to the oxygen vacancy (this state is also referred to as VoH). The density of defect states also increases with an increase in the amount of impurities in the oxide semiconductor film. Hence, the carrier density of an oxide semiconductor film can be controlled by controlling the density of defect states in the oxide semiconductor film.

A transistor using the oxide semiconductor film in a channel region will be described below.

The carrier density of the oxide semiconductor film is preferably reduced in order to inhibit the negative shift of the threshold voltage of the transistor or reduce the off-state current of the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor film is lower than $8 \times 10^{15}$ cm$^{-3}$, preferably lower than $1\times10^{11}$ cm$^{-3}$, and further preferably lower than $1\times10^{10}$ cm$^{-3}$ and is higher than or equal to $1\times10^{-9}$ cm$^{-3}$.

In contrast, the carrier density of the oxide semiconductor film is preferably increased in order to improve the on-state current of the transistor or improve the field-effect mobility of the transistor. In order to increase the carrier density of the oxide semiconductor film, the impurity concentration or the density of defect states in the oxide semiconductor film is slightly increased. Alternatively, the bandgap of the oxide semiconductor film is preferably narrowed. For example, an oxide semiconductor film that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor film that has a high electron affinity and thus has a narrow bandgap so as to increase the density of thermally excited electrons (carriers) can be regarded as substantially intrinsic. Note that a transistor using an oxide semiconductor film with higher electron affinity has lower threshold voltage.

The carrier density of a substantially intrinsic oxide semiconductor film is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

Figure 17:
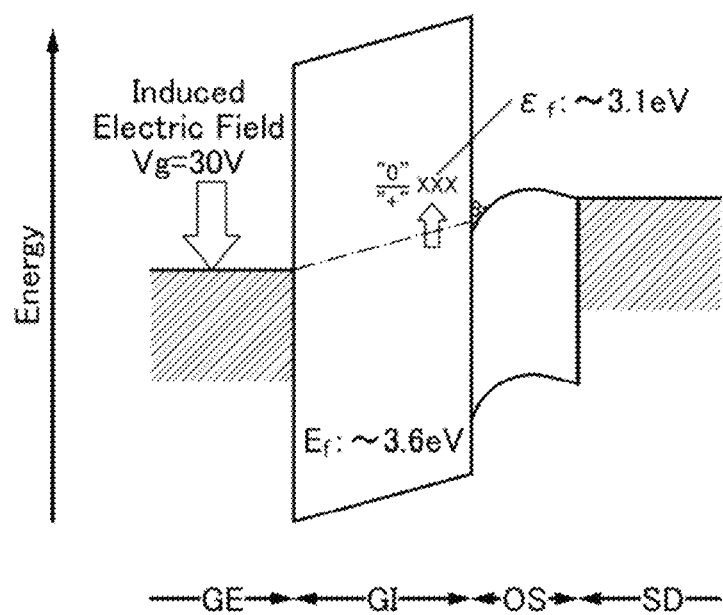
FIG. 17 is an energy band diagram of a transistor including an oxide semiconductor in a channel region.

The use of the substantially intrinsic oxide semiconductor film may improve the reliability of a transistor. Here, the reason for the improvement in the reliability of a transistor which uses the oxide semiconductor film in its channel region is described with reference to FIG. 17. FIG. 17 is an energy band diagram of the transistor including the oxide semiconductor film in its channel region.

In FIG. 17, GE, GI, OS, and SD refer to a gate electrode, a gate insulating film, an oxide semiconductor film, and a source/drain electrode, respectively. In other words, FIG. 17 shows an example of energy bands of the gate electrode, the gate insulating film, the oxide semiconductor film, and the source/drain electrode in contact with the oxide semiconductor film.

In FIG. 17, a silicon oxide film and an In—Ga—Zn oxide are used as the gate insulating film and the oxide semiconductor film, respectively. The transition level ($\varepsilon f$) of a defect that might be formed in the silicon oxide film is assumed to be formed at a position approximately 3.1 eV away from the conduction band minimum of the gate insulating film. Furthermore, the Fermi level (Ef) of the silicon oxide film at the interface between the oxide semiconductor film and the silicon oxide film when the gate voltage ($V_g$) is 30 V is assumed to be formed at a position approximately 3.6 eV away from the conduction band minimum of the gate insulating film. Note that the Fermi level of the silicon oxide film changes depending on the gate voltage. For example, the Fermi level (Ef) of the silicon oxide film at the interface between the oxide semiconductor film and the silicon oxide film is lowered as the gate voltage is increased. A white circle and X in FIG. 17 represent an electron (carrier) and a defect state in the silicon oxide film, respectively.

As shown in FIG. 17, when thermal excitation of carriers occurs during the application of a gate voltage, the carriers are trapped by the defect states (X in the diagram) and the charge state of each of the defect states is changed from positive ("+") to neutral ("0"). In other words, when the value obtained by adding the thermal excitation energy to the Fermi level ($E_f$) of the silicon oxide film becomes greater than the transition level ($\varepsilon_f$) of the defect, the charge state of the defect states in the silicon oxide film is changed from positive to neutral, so that the threshold voltage of the transistor shifts in the positive direction.

When an oxide semiconductor film with a different electron affinity is used, the Fermi level of the interface between the gate insulating film and the oxide semiconductor film might be changed. When an oxide semiconductor film with a higher electron affinity is used, the conduction band minimum of the gate insulating film becomes relatively high at the interface between the gate insulating film and the oxide semiconductor film or in the vicinity of the interface. In that case, the defect state (X in FIG. 17) which might be formed in the gate insulating film also becomes relatively high, so that the energy difference between the Fermi level of the gate insulating film and the Fermi level of the oxide semiconductor film is increased. The increase in energy difference leads to a reduction in the amount of charge trapped in the gate insulating film. For example, a change in the charge state of the defect states which might be formed in the silicon oxide film becomes smaller, so that a change in the threshold voltage of the transistor by gate bias temperature (GBT) stress can be reduced.

Note that when the oxide semiconductor film is used for a channel region of a transistor, carrier scattering or the like at a grain boundary can be reduced; thus, the transistor can have high field-effect mobility. In addition, the transistor can have high reliability.

Charge trapped by the defect states in the oxide semiconductor film takes a long time to be released and may behave like fixed charge. Thus, the transistor in which a channel region is formed in the oxide semiconductor film having a high density of defect states might have unstable electrical characteristics.

To obtain stable electrical characteristics of the transistor, it is effective to reduce the concentration of impurities in the oxide semiconductor film. In order to reduce the concentration of impurities in the oxide semiconductor film, the concentration of impurities in a film which is adjacent to the oxide semiconductor film is preferably reduced. As examples of the impurities, hydrogen, nitrogen, alkali metal, alkaline earth metal, iron, nickel, silicon, and the like are given.

Here, the influence of impurities in the oxide semiconductor film is described.

When silicon or carbon that is one of Group 14 elements is contained in the oxide semiconductor film, defect states are formed in the oxide semiconductor film. Thus, the concentration of silicon or carbon in the oxide semiconductor film and around an interface with the oxide semiconductor film (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor film contains alkali metal or alkaline earth metal, defect states are formed and carriers are generated, in some cases. Thus, a transistor including an oxide semiconductor film that contains alkali metal or alkaline earth metal is likely to be normally-on. Therefore, it is preferable to reduce the concentration of alkali metal or alkaline earth metal in the oxide semiconductor film. Specifically, the concentration of alkali metal or alkaline earth metal in the oxide semiconductor film measured by SIMS is set lower than or equal to $1\times10^{18}$ atoms/cm$^3$, and preferably lower than or equal to $2\times10^{16}$ atoms/cm$^3$.

Hydrogen contained in an oxide semiconductor film reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally-on. Accordingly, it is preferable that hydrogen in the oxide semiconductor film be reduced as much as possible. Specifically, the hydrogen concentration of the oxide semiconductor film measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor film with sufficiently reduced impurity concentration is used for a channel formation region in a transistor, the transistor can have stable electrical characteristics.

The energy gap of the oxide semiconductor film is preferably 2 eV or more or 2.5 eV or more.

<2-5. Structure of Oxide Semiconductor>

Next, a structure of an oxide semiconductor is described.

An oxide semiconductor is classified into a single crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of the crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

[CAAC-OS]

First, a CAAC-OS is described.

A CAAC-OS is one of oxide semiconductors and has a plurality of c-axis aligned crystal parts (also referred to as pellets).

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

Note that an impurity means an element other than the main components of an oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

[nc-OS]

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

The nc-OS is an oxide semiconductor that has higher regularity than an amorphous oxide semiconductor. Thus, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS in some cases.

[a-Like OS]

An a-like OS has a structure between the structure of an nc-OS and the structure of an amorphous oxide semiconductor.

The a-like OS contains a void or a low-density region. The a-like OS has an unstable structure because it contains a void.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of the nc-OS and the density of the CAAC-OS are each higher than or equal to 92.3% and lower than 100% of the density of the single crystal oxide semiconductor having the same composition. It is difficult to deposit an oxide semiconductor having a density lower than 78% of the density of the single crystal oxide semiconductor.

For example, in the case of an oxide semiconductor whose atomic ratio of In to Ga to Zn is 1:1:1, the density of single crystal InGaZnO$_4$ with a rhombohedral crystal structure is 6.357 g/cm$^3$. Accordingly, in the case of the oxide semiconductor whose atomic ratio of In to Ga to Zn is 1:1:1, the density of the a-like OS is higher than or equal to 5.0 g/cm$^3$ and lower than 5.9 g/cm$^3$, for example. In the case of the oxide semiconductor whose atomic ratio of In to Ga to Zn is 1:1:1, the density of the nc-OS and the density of the CAAC-OS are each higher than or equal to 5.9 g/cm$^3$ and lower than 6.3 g/cm$^3$, for example.

In the case where an oxide semiconductor having a certain composition does not exist in a single crystal state, single crystal oxide semiconductors with different compositions are combined at an adequate ratio, which makes it possible to calculate a density equivalent to that of a single crystal oxide semiconductor with the desired composition. The density of a single crystal oxide semiconductor having the desired composition may be calculated using a weighted average with respect to the combination ratio of the single crystal oxide semiconductors with different compositions. Note that it is preferable to use as few kinds of single crystal oxide semiconductors as possible to calculate the density.

As described above, oxide semiconductors have various structures and various properties. In the oxide semiconductor film of one embodiment of the present invention, two or more of an amorphous oxide semiconductor, an a-like OS, an nc-OS, and a CAAC-OS may be mixed. An example of such a case is described below.

The oxide semiconductor film of one embodiment of the present invention can include two kinds of crystal parts. That is, two kinds of crystal parts are mixed in the oxide semiconductor film. One is a crystal part (also referred to as a first crystal part) having orientation in the thickness direction (also referred to as a film-plane direction, or a direction perpendicular to a formation surface or a film surface), i.e., a crystal part having c-axis alignment. The other is a crystal part (also referred to as a second crystal part) which does not have c-axis alignment and has random orientation.

Although crystal parts are divided into the two categories for simplicity: the first crystal part having c-axis alignment and the second crystal part having no c-axis alignment, the first crystal part and the second crystal part cannot be distinguished from each other in some cases because there is not much difference in crystallinity, crystal size, and the like. That is, the oxide semiconductor film of one embodiment of the present invention can be described without a distinction between the first crystal part and the second crystal part.

For example, the oxide semiconductor film of one embodiment of the present invention includes a plurality of crystal parts, and at least one of the crystal parts may have c-axis alignment. Furthermore, in the crystal parts existing in the film, the proportion of crystal parts having no c-axis alignment may be higher than that of crystal parts having c-axis alignment. For example, in a transmission electron microscope image of a cross section of the oxide semiconductor film which is one embodiment of the present invention in the thickness direction, a plurality of crystal parts are observed and the second crystal parts having no c-axis alignment are observed at a higher proportion than the first crystal parts having c-axis alignment in some cases. In other words, the oxide semiconductor film of one embodiment of the present invention has a high proportion of second crystal parts having no c-axis alignment.

When the oxide semiconductor film has a high proportion of second crystal parts having no c-axis alignment, the following effects can be obtained.

In the case where a source which supplies sufficient oxygen is provided in the vicinity of the oxide semiconductor film, the second crystal part having no c-axis alignment can serve as an oxygen diffusion path. Thus, in the case where a source which supplies sufficient oxygen is provided in the vicinity of the oxide semiconductor film, oxygen can be supplied from the source to the first crystal part having c-axis alignment through the second crystal part having no c-axis alignment. Accordingly, the amount of oxygen vacancies in the oxide semiconductor film can be reduced. When such an oxide semiconductor film is used as a semiconductor film of a transistor, high reliability and high field-effect mobility can be obtained.

In the first crystal part, particular crystal planes are aligned in the thickness direction. Accordingly, when an X-ray diffraction (XRD) measurement is performed in a direction substantially perpendicular to the top surface of the oxide semiconductor film including the first crystal parts, a diffraction peak derived from the first crystal parts is observed at a predetermined diffraction angle (2θ). However, even when the oxide semiconductor film includes the first crystal parts, a diffraction peak is not sufficiently observed in some cases because of x-rays scattering or increase in background due to a support substrate. Note that the higher the proportion of the first crystal parts in the oxide semiconductor film is, the higher the diffraction peak becomes; thus, the height (intensity) of the diffraction peak can be an indicator of crystallinity of the oxide semiconductor film.

As an example of a method for evaluating crystallinity of the oxide semiconductor film, electron diffraction can be given. For example, in the case where an electron diffraction measurement is performed on a cross section of the oxide semiconductor film of one embodiment of the present invention and an electron diffraction pattern thereof is observed, first regions including diffraction spots derived from the first crystal parts and second regions including diffraction spots derived from the second crystal parts are observed.

The first regions including diffraction spots derived from the first crystal parts are derived from crystal parts having c-axis alignment. The second regions including diffraction spots derived from the second crystal parts are derived from crystal parts having no orientation or crystal parts having random orientation. Therefore, different patterns are observed in accordance with the diameter of an electron beam, i.e., the area of an observed region in some cases. Note that in this specification and the like, electron diffraction with an electron beam having a diameter of 1 nmϕ to 100 nmϕ inclusive is referred to as nanobeam electron diffraction (NBED).

Note that the crystallinity of the oxide semiconductor film of one embodiment of the present invention may be evaluated by a method different from NBED. As examples of a method for evaluating crystallinity of the oxide semiconductor film, electron diffraction, x-ray diffraction, neutron diffraction, and the like can be given. Among the electron diffractions, transmission electron microscopy (TEM), scanning electron microscopy (SEM), convergent beam electron diffraction (CBED), selected-area electron diffraction (SAED), and the like can be favorably used in addition to the above NBED.

In NBED, a ring-like pattern is observed in a nanobeam electron diffraction pattern obtained by using an electron beam having a large diameter (e.g., greater than or equal to 25 nmϕ and less than or equal to 100 nmϕ, or greater than or equal to 50 nmϕ and less than or equal to 100 nmϕ. The ring-like pattern has luminance distribution in a radial direction in some cases. On the other hand, in an electron diffraction pattern of NBED obtained by using an electron beam having a sufficiently small diameter (e.g., greater than or equal to 1 nmϕ and less than or equal to 10 nmϕ), a plurality of spots distributed in a circumferential direction (also referred to as θ direction) are observed at the position of the ring-like pattern. That is, the ring-like pattern obtained by using an electron beam having a large diameter is formed from an aggregate of the plurality of spots.

<2-6. Evaluation of Crystallinity of Oxide Semiconductor Film>

Three samples (Samples X1 to X3) each including an oxide semiconductor film were fabricated and the crystallinity of each of the samples was evaluated. Three kinds of oxide semiconductor films were formed in different conditions. First, methods for fabricating Samples X1 to X3 are described.

[Sample X1]

Sample X1 is a sample in which an approximately 100-nm-thick oxide semiconductor film is formed over a glass substrate. The oxide semiconductor film contains indium, gallium, and zinc. The oxide semiconductor film of Sample X1 was formed under the following conditions: the substrate temperature was 170° C.; an argon gas with a flow rate of 140 sccm and an oxygen gas with a flow rate of 60 sccm were introduced into a chamber of a sputtering apparatus;

the pressure was set to 0.6 Pa; and an AC power of 2.5 kW was applied to a metal oxide target containing indium, gallium, and zinc (with an atomic ratio of In:Ga:Zn=4:2:4.1). Note that the percentage of oxygen flow rate under the formation conditions for Sample X1 was 30%.

[Sample X2]

Sample X2 is a sample in which an approximately 100-nm-thick oxide semiconductor film is formed over a glass substrate. The oxide semiconductor film of Sample X2 was formed under the following conditions: the substrate temperature was 130° C.; and an argon gas with a flow rate of 180 sccm and an oxygen gas with a flow rate of 20 sccm were introduced into a chamber of a sputtering apparatus. The percentage of oxygen flow rate under the formation conditions for Sample X2 was 10%. Note that the conditions other than the substrate temperature and the percentage of oxygen flow rate are the same as those for Sample X1.

[Sample X3]

Sample X3 is a sample in which an approximately 100-nm-thick oxide semiconductor film is formed over a glass substrate. The oxide semiconductor film of Sample X3 was formed under the following conditions: the substrate temperature was room temperature; an argon gas with a flow rate of 180 sccm and an oxygen gas with a flow rate of 20 sccm were introduced into a chamber of a sputtering apparatus. The percentage of oxygen flow rate under the formation conditions for Sample X3 was 10%. Note that the conditions other than the substrate temperature and the percentage of oxygen flow rate are the same as those for Sample X1.

The conditions for forming Samples X1 to X3 are shown in Table 1.

TABLE 1

| | Target [atomic ratio] | Substrate temperature [° C.] | Pressure [Pa] | Percentage of oxygen flow rate [%] |
|---|---|---|---|---|
| Sample X1 | In:Ga:Zn = 4:2:4.1 | 170 | 0.6 | 30 |
| Sample X2 | In:Ga:Zn = 4:2:4.1 | 130 | 0.6 | 10 |
| Sample X3 | In:Ga:Zn = 4:2:4.1 | R.T. | 0.6 | 10 |

Next, the crystallinity of Samples X1 to X3 was evaluated. In this embodiment, cross-sectional TEM observation, XRD measurement, and electron diffraction were performed to evaluate crystallinity.

[Cross-Sectional TEM Observation]

Figure 19A:
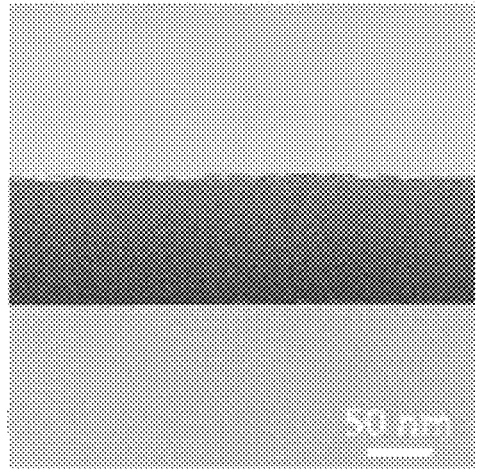
FIGS. 19A to 19C are cross-sectional TEM images and a cross-sectional HR-TEM image of an oxide semiconductor film.
Figure 19B:
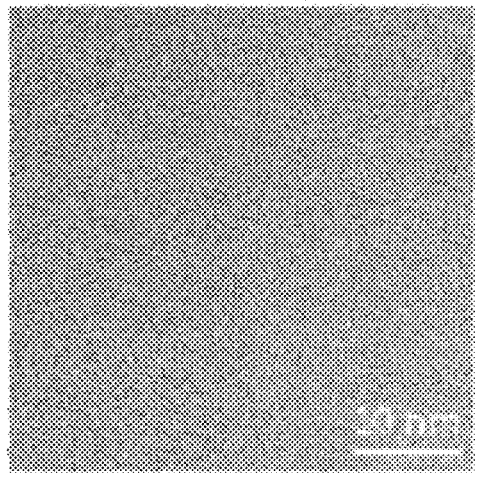
Figure 19C:
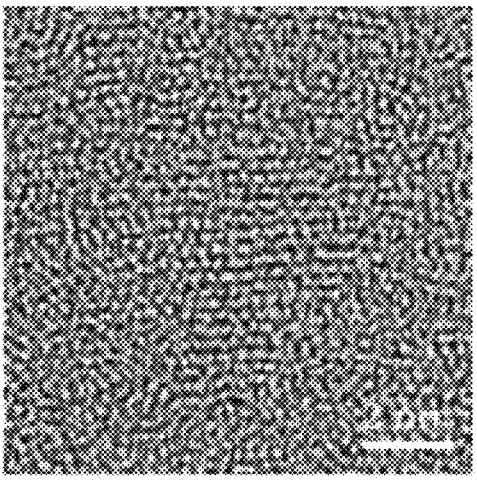
Figure 20A:
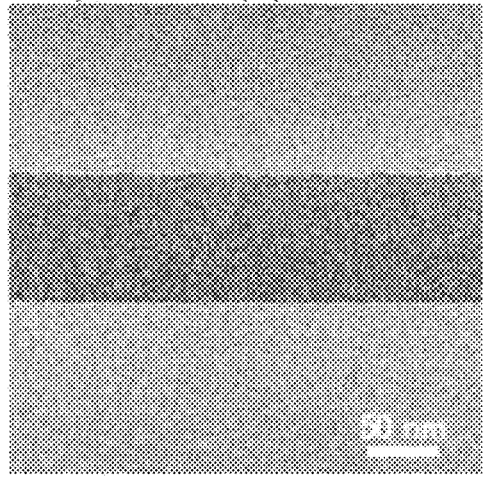
FIGS. 20A to 20C are cross-sectional TEM images and a cross-sectional HR-TEM image of an oxide semiconductor film.
Figure 20B:
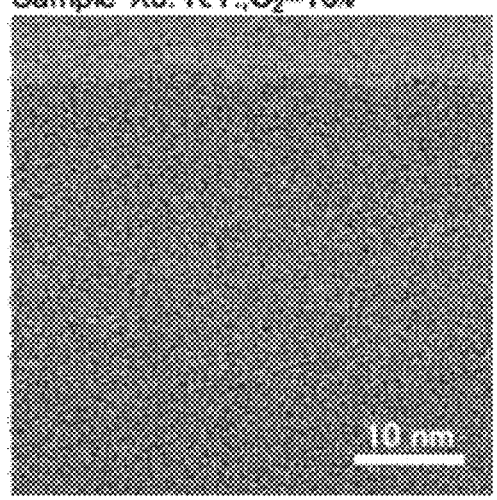

FIGS. 18A to 18C, FIGS. 19A to 19C, and FIGS. 20A to 20C show cross-sectional TEM observation results of Samples X1 to X3. FIGS. 18A and 18B are cross-sectional TEM images of Sample X1. FIGS. 19A and 19B are cross-sectional TEM images of Sample X2. FIGS. 20A and 20B are cross-sectional TEM images of Sample X3.

Figure 20C:
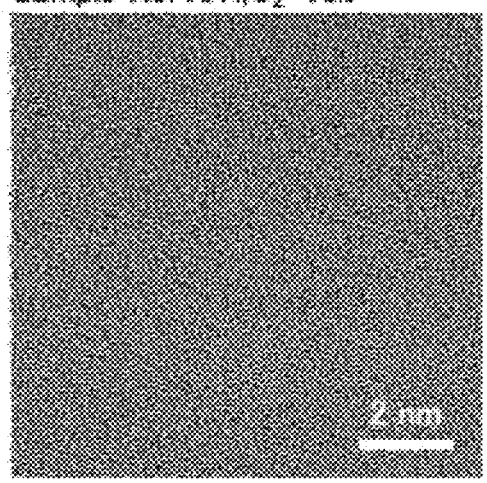

FIG. 18C, FIG. 19C, and FIG. 20C are cross-sectional high resolution transmission electron microscope (HR-TEM) images of Sample X1, Sample X2, and Sample X3, respectively. The cross-sectional HR-TEM images may be obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

As shown in FIGS. 18A to 18C and FIGS. 19A to 19C, crystal parts in which atoms are aligned in a layered manner in the thickness direction are observed in Sample X1 and Sample X2. In particular, in HR-TEM images, crystal parts in which atoms are aligned in a layered manner are easily observed. As shown in FIGS. 20A to 20C, the state where atoms are aligned in a layered manner in the thickness direction is unlikely to be observed in Sample X3.

[XRD Measurement]

Next, XRD measurement results of the samples will be described.

Figure 21A:
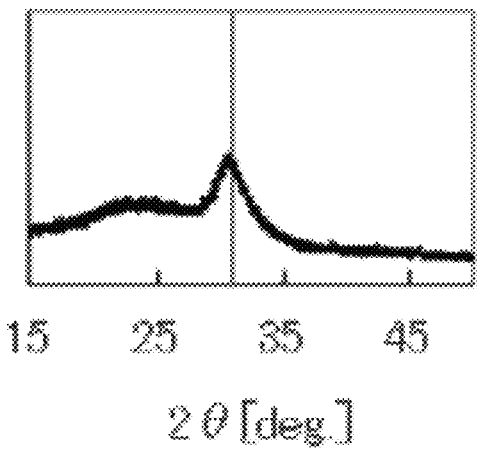
FIGS. 21A to 21C show XRD measurement results and electron diffraction patterns of an oxide semiconductor film.

FIG. 21A, FIG. 22A, and FIG. 23A show XRD measurement results of Sample X1, Sample X2, and Sample X3, respectively.

The XRD measurement was conducted by a powder method (also referred to as a θ-2θ method) which is a kind of an out-of-plane method. Note that in a θ-2θ method, X-ray diffraction intensity is measured while an incident angle of an X-ray is changed and the angle of a detector facing an X-ray source is equal to the incident angle. Note that a grazing-incidence XRD (GIXRD) method (also referred to as a thin film method or a Seemann-Bohlin method) may be used. The GIXRD method is a kind of an out-of-plane method for measuring X-ray diffraction intensity in which X-ray is incident at an angle approximately 0.40° from a film surface with use of a variable-angle detector. In FIG. 21A, FIG. 22A, and FIG. 23A, the vertical axis represents the diffraction intensity in arbitrary unit and the horizontal axis represents the angle 2θ.

As shown in FIG. 21A and FIG. 22A, a peak of diffraction intensity is observed at around 2θ=31° in each of Sample X1 and Sample X2. In contrast, as shown in FIG. 23A, in Sample X3, a peak of diffraction intensity at around 2θ=31° is unlikely to be observed. Alternatively, a peak of diffraction intensity at around 2θ=31° is extremely low or does not exist.

The diffraction angle (at around 2θ=31° at which the peak of the diffraction intensity was observed corresponds to a diffraction angle on the (009) plane of the structure model of single crystal InGaZnO$_4$. Accordingly, the above peaks indicate that each of Samples X1 and X2 includes a crystal part where the c-axes are aligned in the thickness direction (hereinafter also referred to as a crystal part having c-axis alignment or a first crystal part). Note that it is difficult to determine, by XRD measurement, whether a crystal part having c-axis alignment is included in Sample X3.

[Electron Diffraction]

Next, electron diffraction measurement results of Samples X1 to X3 are described below. In the electron diffraction measurement, an electron diffraction pattern was obtained in such a manner that each of the samples is irradiated with an electron beam incident in a direction perpendicular to its cross section. The electron-beam diameters were set to 1 nmφ and 100 nmφ.

In electron diffraction, as the diameter of an incident electron beam becomes larger and the thickness of sample becomes larger, information of the sample in the depth direction is likely to be shown in the electron diffraction pattern. Therefore, the information of local regions can be obtained by reducing not only the diameter of the electron beam but also the thickness of the sample in the depth direction. In contrast, when the thickness of the sample in the depth direction is too small (e.g., the thickness of the sample in the depth direction is less than or equal to 5 nm), information of only submicroscopic region is obtained. Thus, an electron diffraction pattern obtained when a crystal exists in the submicroscopic region is similar to an electron diffraction pattern of a single crystal in some cases. When the aim is not to analyze the submicroscopic region, the thickness of the sample in the depth direction is preferably greater than or equal to 10 nm and less than or equal to 100 nm, typically greater than or equal to 10 nm and less than or equal to 50 nm.

Figure 21B:
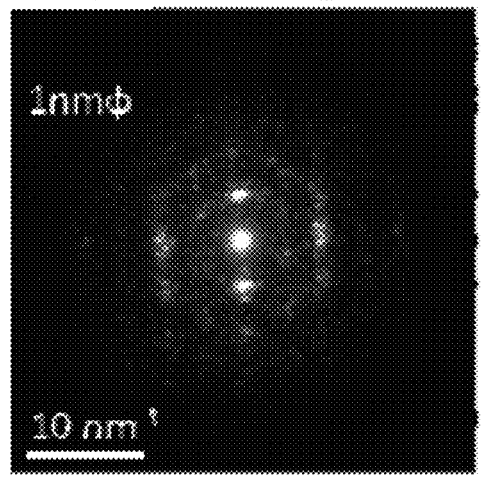
Figure 21C:
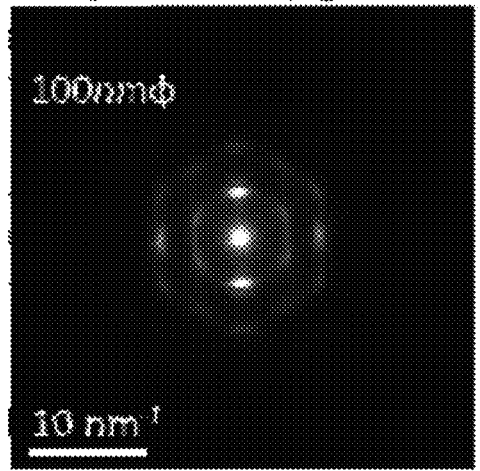

FIGS. 21B and 21C show electron diffraction patterns of Sample X1. FIGS. 22B and 22C show electron diffraction patterns of Sample X2. FIGS. 23B and 23C show electron diffraction patterns of Sample X3.

The contrast of the electron diffraction patterns shown in FIGS. 21B and 21C, FIGS. 22B and 22C, and FIGS. 23B and 23C is adjusted for clarity. In FIGS. 21B and 21C, FIGS. 22B and 22C, and FIGS. 23B and 23C, the brightest luminescent spot at the center of the pattern is derived from the incident electron beam and is the center of the electron diffraction pattern (also referred to as a direct spot or a transmitted wave).

As shown in FIG. 21B, when the diameter of the incident electron beam is set to 1 nm$\phi$, a plurality of spots circumferentially distributed can be observed. This indicates that the oxide semiconductor film contains a plurality of submicroscopic crystal parts having random surface orientation. As shown in FIG. 21C, when the diameter of the incident electron beam is set to 100 nm$\phi$, the luminances of a sequence of a plurality of diffraction spots derived from these plurality of crystal parts are averaged to be a ring-like diffraction pattern. Two ring-like diffraction patterns with different radii are observed in FIG. 21C. The rings are referred to as a first ring and a second ring in ascending order of radius. It is observed that the luminance of the first ring is higher than that of the second ring. In addition, two spots (referred to as first regions) with high luminance are observed at a position overlapping with the first ring.

The distance from the center to the first ring in a radial direction substantially corresponds to the distance from the center to a diffraction spot on the (009) plane of the structure model of single crystal $InGaZnO_4$ in a radical direction. The first regions are diffraction spots derived from c-axis alignment.

As shown in FIG. 21C, the observations of the ring-like diffraction patterns indicate that crystal parts having random orientation (hereinafter also referred to as crystal parts having no c-axis alignment or second crystal parts) exist in the oxide semiconductor film.

In addition, two first regions are presumed to have two-hold symmetry because the regions are disposed symmetrically with respect to the center point of the electron diffraction pattern and the luminances of the regions are substantially equal to each other. As described above, since the two first regions are diffraction spots which are derived from the c-axis alignment, the orientation of a straight line which passes through the two first regions and the center is aligned with that of the c-axis of the crystal part. The thickness direction is the vertical direction of FIG. 21C, which suggests the presence of crystal part in which the c-axis is aligned in the thickness direction in the oxide semiconductor film.

As described above, the oxide semiconductor film of Sample X1 is confirmed to be a film including both crystal parts having c-axis alignment and crystal parts having no c-axis alignment.

The results of the electron diffraction patterns shown in FIGS. 22B and 22C and FIGS. 23B and 23C are substantially the same as those of the electron diffraction patterns shown in FIGS. 21B and 21C. The luminance of the two spots (first regions) derived from c-axis alignment is high in the order of Sample X1, Sample X2 and Sample X3. This indicates that the proportion of crystal parts having c-axis alignment is high in that order.

[Quantification Method of Crystallinity of Oxide Semiconductor Film]

Next, an example of a quantification method of crystallinity of an oxide semiconductor film is described with reference to FIGS. 24A and 24B, FIG. 25, and FIG. 26.

Figure 24A:
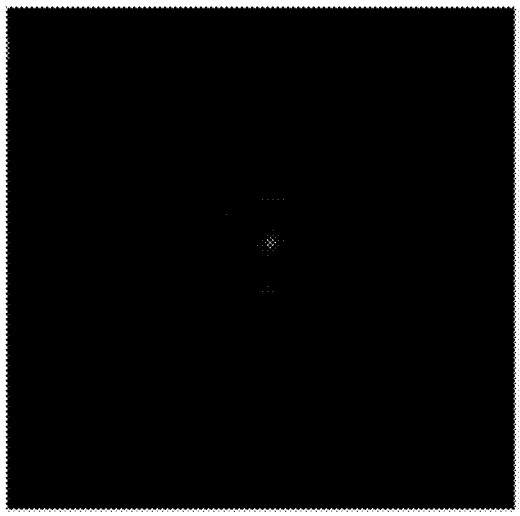
FIGS. 24A and 24B show electron diffraction patterns.

First, an electron diffraction pattern is prepared (see FIG. 24A).

Figure 24B:
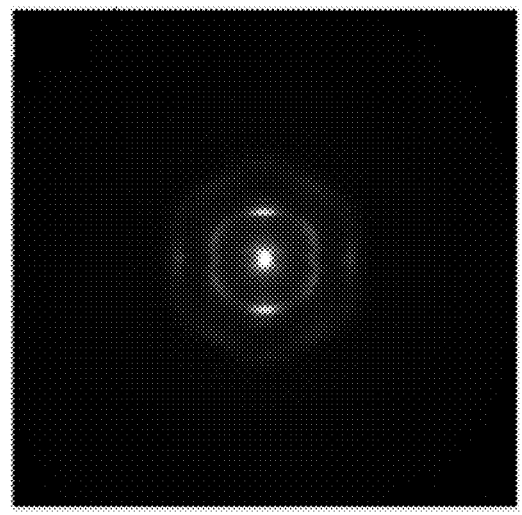

FIG. 24A shows an electron diffraction pattern obtained by measuring a 100-nm-thick oxide semiconductor film using an electron beam with a diameter of 100 nm$\phi$. FIG. 24B shows an electron diffraction pattern obtained by adjusting contrast of the electron diffraction pattern shown in FIG. 24A.

In FIG. 24B, two clear spots (first regions) are observed over and under a direct spot. The two spots (first regions) are derived from diffraction spots corresponding to (001) in a structure model of $InGaZnO_4$, that is, crystal parts having c-axis alignment. In addition to the first regions, a ring-like pattern (second regions) with a low luminance positioned on an approximately concentric circle of the first region is observed. The ring-like pattern is obtained when the luminances of spots derived from structures of crystal parts having no c-axis alignment (second crystal parts) are averaged by using the electron beam with a diameter of 100 nm$\phi$.

Here, in the electron diffraction pattern, the first regions including diffraction spots derived from the crystal parts having c-axis alignment and the second regions including diffraction spots derived from the second crystal parts are observed to overlap with each other. Thus, a line profile including the first regions and line profiles including the second regions are obtained and compared with each other, whereby the crystallinity of the oxide semiconductor film can be quantified.

The line profile including the first regions and the line profiles including the second regions are described with reference to FIG. 25.

Figure 25:
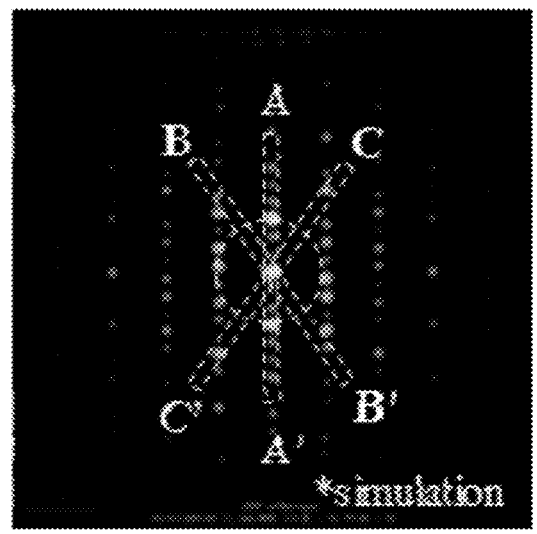
FIG. 25 shows line profiles of an electron diffraction pattern.

FIG. 25 shows a simulation pattern of electron diffraction that is obtained when an electron beam is emitted to the (100) plane of the structure model of $InGaZnO_4$. In the simulation pattern, auxiliary lines of a region A-A', a region B-B', and a region C-C' are drawn.

The region A-A' in FIG. 25 includes a straight line passing through two diffraction spots derived from the first crystal parts having c-axis alignment and a direct spot. The regions B-B' and C-C' in FIG. 25 each include a straight line passing through a region where no diffraction spot derived from the first crystal part having c-axis alignment is observed and the direct spot. An angle between the region A-A' and the region B-B' or C-C' is approximately 34°, specifically, larger than or equal to 30° and smaller than or equal to 38°, preferably larger than or equal to 32° and smaller than or equal to 36°, further preferably larger than or equal to 33° and smaller than or equal to 35°.

The line profiles have the tendencies shown in FIG. 26 in accordance with the structure of the oxide semiconductor film. FIG. 26 illustrates line profiles and shows relative luminance R and a full width at half maximum (FWHM) of each line profile.

Relative luminance R in FIG. 26 is obtained by dividing the integrated intensity of luminance of the region A-A' by the integrated intensity of luminance of the region B-B' or the integrated intensity of luminance of the region C-C'. Note that the integrated intensity of the luminance of each of the regions A-A', B-B', and C-C' is obtained by removing the luminance of background derived from the direct spot which appears at the center.

When the relative luminance R is calculated, the intensity of c-axis alignment can be quantitatively defined. For example, as shown in FIG. 26, in a single crystal oxide semiconductor film, the peak intensity of diffraction spots derived from the first crystal parts having c-axis alignment in the region A-A' is high and there is no diffraction spot derived from the first crystal part having c-axis alignment in the regions B-B' and C-C'; thus, the relative luminance R is much larger than 1. The relative luminance R decreases in the order of single crystal, only CAAC (details of CAAC will be described later), CAAC+nanocrystal, nanocrystal, and amorphous. In particular, in nanocrystal and amorphous, which have no particular orientation, the relative luminance R is equal to 1.

As the periodicity of the crystal becomes higher, the intensity of the spectrum derived from the first crystal part having c-axis alignment becomes high and the full width at half maximum of the spectrum becomes small. Thus, the full width at half maximum of single crystal is the smallest, and the full width at half maximum is increased in the order of only CAAC, CAAC+nanocrystal, and nanocrystal. The full width at half maximum of amorphous is extremely large and the profile thereof is called a "halo".

[Analysis using Line Profile]

As described above, the ratio of the integrated intensity of luminance of the first regions to the integrated intensity of luminance of the second regions is important information to presume the proportion of crystal parts having orientation.

Then, from electron diffraction patterns of Samples X1 to X3 that is described above, analysis with line profiles was performed.

FIGS. 27A1 and 27A2 show results of analysis with line profiles of Sample X1. FIGS. 27B1 and 27B2 show results of analysis with line profiles of Sample X2. FIGS. 27C1 and 27C2 show results of analysis with line profiles of Sample X3.

FIG. 27A1 shows the electron diffraction pattern in FIG. 21C in which the regions A-A', B-B', and C-C' are drawn. FIG. 27B1 shows the electron diffraction pattern in FIG. 22C in which the regions A-A', B-B', and C-C' are drawn. FIG. 27C1 shows the electron diffraction pattern in FIG. 23C in which the regions A-A', B-B', and C-C' are drawn.

The regions A-A', B-B', and C-C' can each be obtained by normalizing line profiles using the luminance of the direct spot as a reference. Note that the direct spot appears at the center of an electron diffraction pattern. With the regions, Samples X1 to X3 can be relatively compared.

When the profile of the luminance is calculated, a component of the luminance derived from inelastic scatterings and the like from the sample is subtracted as the background, whereby comparison with higher accuracy can be performed. Because the component of the luminance derived from inelastic scatterings shows an extremely broad profile in a radial direction, the luminance of the background may be obtained by a linear approximation. For example, a straight line is drawn along the tails of a target peak, and a region positioned on the lower luminance side than the straight line can be subtracted as the background.

Here, the integrated intensity of the luminance of each of the regions A-A', B-B', and C-C' is calculated from data in which the background is subtracted by the method described above. Then, the relative luminance R is obtained by dividing the integrated intensity of the luminance of the region A-A' by the integrated intensity of the luminance of the region B-B' or the integrated intensity of the luminance of the region C-C'.

Figure 28:
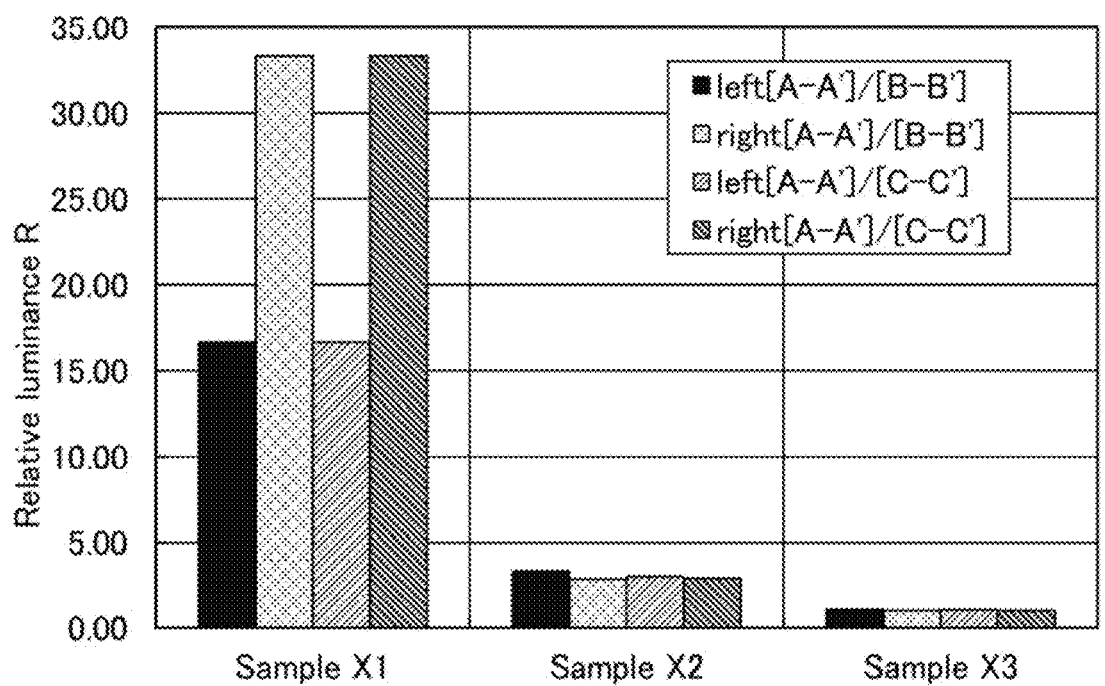
FIG. 28 shows relative luminance estimated from electron diffraction patterns of oxide semiconductor films.

FIG. 28 shows the relative luminance R of Samples X1 to X3. In FIG. 28, in a spectrum on the left side and the right side of the direct spot in the profiles of the luminance in each of FIGS. 27A2, 27B2, and 27C2, a value obtained by dividing the integrated intensity of the luminance of the region A-A' by the integrated intensity of the luminance of the region B-B' and a value obtained by dividing the integrated intensity of the luminance of the region A-A' by the integrated intensity of the luminance of the region C-C' are calculated.

As shown in FIG. 28, the relative luminance of Samples X1 to X3 is as follows. The relative luminance R of Sample X1 is 25.00. The relative luminance R of Sample X2 is 3.04. The relative luminance R of Sample X3 is 1.05. Note that the relative luminance R is an average value of relative luminances at four points. As described above, the relative luminance R is high in the order of Sample X1, Sample X2, and Sample X3.

When the oxide semiconductor film of one embodiment of the present invention is used as a semiconductor film in which a channel of a transistor is formed, the relative luminance R is preferably greater than 1 and less than or equal to 40, further preferably greater than 1 and less than or equal to 10, still further preferably greater than 1 and less than or equal to 3. With use of such an oxide semiconductor film as the semiconductor film, both high stability of electrical characteristics and high field-effect mobility in a low-gate-voltage region can be achieved.

<2-7. Proportion of Crystal Part>

The proportion of crystal parts in an oxide semiconductor film can be estimated by analyzing its cross-sectional TEM image.

A method for analyzing the image is described. An image is analyzed as follows. First, a high-resolution TEM image is subjected to two-dimensional fast Fourier transform (FFT), whereby an FFT image is obtained. The obtained FFT image is subjected to a mask processing so that a region other than a region having a periodic structure is removed. After the mask processing, the FFT image is subjected to two-dimensional inverse fast Fourier transform (IFFT), whereby an FFT filtering image is obtained.

In this manner, a real-space image in which only crystal parts are extracted can be obtained. Then, the proportion of crystal parts can be estimated from the proportion of the area of the remaining image. Moreover, the proportion of the area other than the crystal parts can be estimated by subtracting the remaining region from the area of the region used for calculation (also referred to as the area of an original image).

FIG. 29A1 shows a cross-sectional TEM image of Sample X1. FIG. 29A2 shows an image obtained through the analysis of the cross-sectional TEM image of Sample X1. FIG. 29B1 shows a cross-sectional TEM image of Sample X2. FIG. 29B2 shows an image obtained through the analysis of the cross-sectional TEM image of Sample X2. FIG. 29C1 shows a cross-sectional TEM image of Sample X3. FIG. 29C2 shows an image obtained through the analysis of the cross-sectional TEM image of Sample X3.

White regions in the oxide semiconductor film in the images obtained through the analysis correspond to regions including crystal parts having orientation. Black regions correspond to regions including crystal parts having no orientation or crystal parts with random orientation.

From the result shown in FIG. 29A2, the proportion of the area other than the region including crystal parts having orientation is approximately 43.1% in Sample X1. From the result shown in FIG. 29B2, the proportion of the area other than the region including crystal parts having orientation is approximately 61.7% in Sample X2. From the result shown in FIG. 29C2, the proportion of the area other than the region including crystal parts having orientation is approximately 89.5% in Sample X3.

The proportion of the region other than crystal parts having orientation in an oxide semiconductor film, which is estimated in the above manner, is preferably greater than or equal to 5% and less than 40% because the oxide semiconductor film has extremely high crystallinity and extremely high stability of electrical characteristics and hardly generates oxygen vacancies. In contrast, when the proportion of the region other than crystal parts having orientation in an oxide semiconductor film is higher than or equal to 40% and lower than 100%, preferably higher than or equal to 60% and lower than or equal to 90%, the oxide semiconductor film includes both the crystal parts having orientation and the crystal parts having no orientation at an appropriate ratio and thus can achieve both high stability of electrical characteristics and high mobility.

Here, a region other than the crystal parts that can be easily observed in a cross-sectional TEM image or a cross-sectional TEM image obtained through analysis can be referred to as a lateral growth buffer region (LGBR).

<2-8. Oxygen Diffusion to Oxide Semiconductor Film>

Next, the evaluation results of ease of oxygen diffusion to oxide semiconductor films are described.

The following three samples (Samples Y1 to Y3) were fabricated.

[Sample Y1]

First, an approximately 50-nm-thick oxide semiconductor film was formed over a glass substrate in a manner similar to that of Sample X1. Next, an approximately 30-nm-thick silicon oxynitride film, an approximately 100-nm-thick silicon oxynitride film, and an approximately 20-nm-thick silicon oxynitride film were stacked over the oxide semiconductor film by a PECVD method. Note that in the following description, an oxide semiconductor film and a silicon oxynitride film are referred to as OS and GI, respectively, in some cases.

Then, heat treatment was performed at 350° C. in a nitrogen atmosphere for one hour.

Next, a 5-nm-thick In—Sn—Si oxide film was formed by a sputtering method.

Next, oxygen was added to the silicon oxynitride film. The oxygen addition treatment was performed with an ashing apparatus under the conditions where the substrate temperature was 40° C., an oxygen gas ($^{16}$O) at a flow rate of 150 sccm and an oxygen gas ($^{18}$O) at a flow rate of 100 sccm were introduced into a chamber, the pressure was 15 Pa, and an RF power of 4500 W was supplied for 600 sec. between parallel-plate electrodes provided in the ashing apparatus so that a bias would be applied to the substrate side. Since the silicon oxynitride film contained oxygen ($^{16}$O) at a main component level, an oxygen gas ($^{18}$O) was used to exactly measure the amount of oxygen added by the oxygen addition treatment.

Then, an approximately 100-nm-thick silicon nitride film was formed by a PECVD method.

[Sample Y2]

Sample Y2 is a sample whose oxide semiconductor film was formed in different conditions from those of Sample Y1. In Sample Y2, an approximately 50-nm-thick oxide semiconductor film was formed in a manner similar to that of Sample X2.

[Sample Y3]

Sample Y3 is a sample whose oxide semiconductor film was formed in different conditions from those of Sample Y1. In Sample Y3, an approximately 50-nm-thick oxide semiconductor film was formed in a manner similar to that of Sample X3.

Through the above process, Samples Y1 to Y3 were fabricated.

[SIMS Analysis]

The concentration of $^{18}$O in Samples Y1 to Y3 was measured by secondary ion mass spectrometry (SIMS) analysis. The SIMS analysis was performed under three conditions: a condition in which Samples Y1 to Y3 were not subjected to heat treatment; a condition in which Samples Y1 to Y3 were subjected to heat treatment at 350° C. in a nitrogen atmosphere for one hour; and a condition in which Samples Y1 to Y3 were subjected to heat treatment at 450° C. in a nitrogen atmosphere for one hour.

Figure 30A:
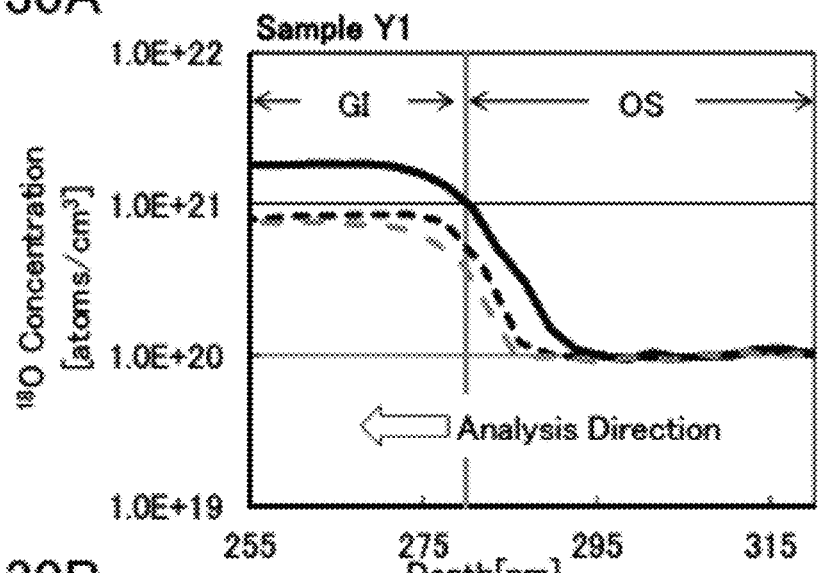
FIGS. 30A to 30C show SIMS measurement results of oxide semiconductor films.
Figure 30B:
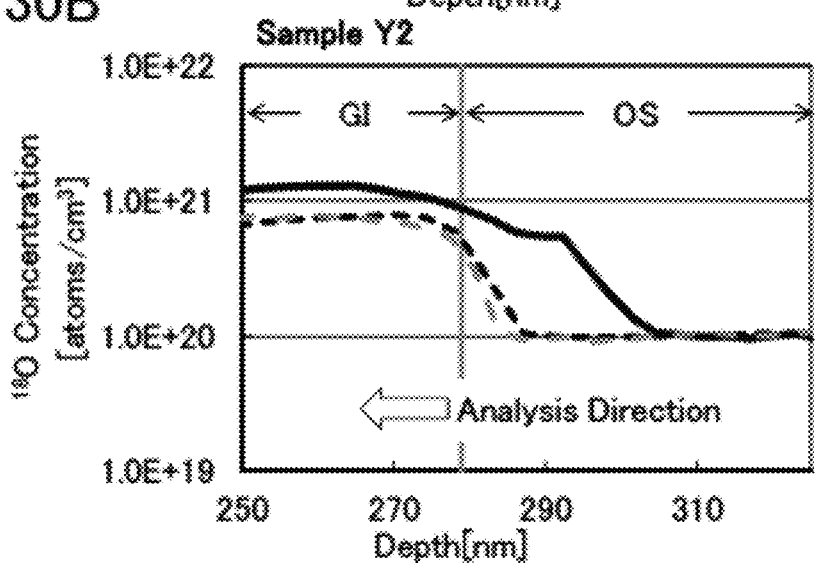
Figure 30C:
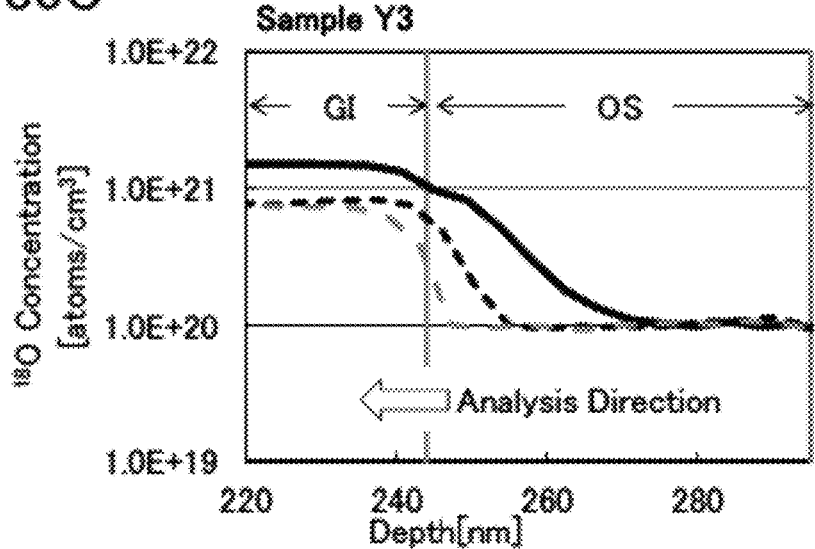

FIGS. 30A to 30C show SIMS measurement results. FIG. 30A, FIG. 30B, and FIG. 30C show SIMS measurement results of Sample Y1, Sample Y2, and Sample Y3, respectively.

FIGS. 30A to 30C show the analysis results of a region including GI and OS. Note that FIGS. 30A to 30C show results of SIMS (also referred to as substrate side depth profile (SSDP)-SIMS) analysis performed from the substrate side.

In FIGS. 30A to 30C, a gray dashed line indicates a profile of the sample in which heat treatment was not performed, a black dashed line indicates a profile of the sample in which heat treatment was performed at 350° C., and a black solid line indicates a profile of the sample in which heat treatment was performed at 450° C.

In each of Samples Y1 to Y3, it is found that $^{18}$O was diffused to GI and also to OS. Furthermore, the position where $^{18}$O was diffused was deeper in the order of Sample Y1, Sample Y2, and Sample Y3. In addition, when heat treatment was performed at 350° C. or 450° C., $^{18}$O was more deeply diffused.

From the above results, it is found that an oxide semiconductor film including both crystal parts having orientation and crystal parts having no orientation and a low proportion of crystal parts having orientation is a film which easily transmits oxygen, in other words, a film in which oxygen is easily diffused. In addition, when heat treatment is performed at 350° C. or 450° C., oxygen in a GI film is diffused to OS.

The above results show that the higher the proportion (density) of crystal parts having orientation is, the more difficult it is for oxygen to be diffused in the thickness direction, and the lower the density is, the easier it is for oxygen to be diffused in the thickness direction. The ease of oxygen diffusion to the oxide semiconductor film can be considered as follows.

In an oxide semiconductor film containing both crystal parts having orientation and submicroscopic crystal parts having no orientation, a region other than the crystal parts which can be obviously observed in a cross-sectional observation image (LGBR) can be a region in which oxygen is easily diffused, that is, can serve as an oxygen diffusion path. As a result, in the case where a source which supplies sufficient oxygen is provided in the vicinity of the oxide semiconductor film, oxygen can be easily supplied through the LGBR to the crystal parts having orientation, and the amount of oxygen vacancies in the film can be reduced.

For example, an oxide film which easily releases oxygen is formed to be in contact with the oxide semiconductor film and heat treatment is performed, so that oxygen released from the oxide film is diffused to the oxide semiconductor film in the thickness direction through the LGBR. Through the LGBR, oxygen can be supplied laterally to crystal parts having orientation. Accordingly, oxygen is easily supplied sufficiently to the crystal parts having orientation and a region other than the crystal parts in the oxide semiconductor film, which leads to an effective reduction of oxygen vacancy in the film.

For example, when a hydrogen atom which is not bonded to a metal atom exists in the oxide semiconductor film, an oxygen atom is bonded to the hydrogen atom, and then OH is formed and fixed in some cases. The state in which a certain amount (e.g., approximately $1 \times 10^{17}$ cm$^{-3}$) of hydrogen atoms trapped in oxygen vacancy (Vo) in the oxide semiconductor film (such a hydrogen atom is referred to as VoH) is formed in the deposition at a low temperature, whereby generation of OH is inhibited. A certain amount of carriers exists in the oxide semiconductor film because VoH generates a carrier. Thus, the oxide semiconductor film with an increased carrier density can be formed. Although an oxygen vacancy is formed concurrently with the deposition, the oxygen vacancy can be reduced by introducing oxygen through the LGBR as described above. In this manner, the oxide semiconductor film with a relatively high carrier density and a sufficiently reduced amount of oxygen vacancies can be formed.

By introducing oxygen into an oxide semiconductor film in a favorable manner, the amount of oxygen vacancies (Vo) in the oxide semiconductor film can be reduced. That is, the oxygen vacancies (Vo) in the oxide semiconductor film are compensated when the oxygen vacancies (Vo) are filled with oxygen. Accordingly, diffusion of oxygen into the oxide semiconductor film can reduce the amount of oxygen vacancies (Vo) in a transistor and improve the reliability of the transistor.

A clear grain boundary cannot be observed in the oxide semiconductor film because submicroscopic crystal parts having no orientation at the time of the deposition is formed in a region other than crystal parts having orientation. The submicroscopic crystal part is positioned between a plurality of crystal parts having orientation. The submicroscopic crystal part is bonded to an adjacent crystal part having orientation by growing in the lateral direction with heat at the time of the deposition. The submicroscopic crystal part functions as a region where a carrier is generated. The oxide semiconductor film with such a structure is expected to improve field-effect mobility considerably when used in a transistor.

In addition, plasma treatment in an oxygen atmosphere is preferably performed after the oxide semiconductor film is formed and an oxide insulating film such as a silicon oxide film is formed over the oxide semiconductor film. The treatment can supply oxygen to the film and reduce the hydrogen concentration. For example, during plasma treatment, fluorine which remains in the chamber is doped at the same time to the oxide semiconductor film in some cases. Fluorine exists as a fluorine atom with negative charges and is bonded to a hydrogen atom with positive charges by Coulomb force, and then HF is generated. HF is released to the outside of the oxide semiconductor film during the plasma treatment, and as a result, the hydrogen concentration in the oxide semiconductor film can be reduced. In the plasma treatment, $H_2O$ in which an oxygen atom and hydrogen atoms are bonded is released to the outside of the film in some cases.

A structure in which a silicon oxide film (or a silicon oxynitride film) is stacked over the oxide semiconductor film is considered. Fluorine in the silicon oxide film does not affect electrical characteristics of the oxide semiconductor film because fluorine is bonded to hydrogen in the film and can exist as HF which is electrically neutral. Note that Si—F bond is generated in some cases, which is also electrically neutral. Furthermore, HF in the silicon oxide film does not affect the diffusion of oxygen.

According to the above mechanism, oxygen vacancies in the oxide semiconductor film can be reduced and hydrogen which is not bonded to a metal atom in the film can be reduced, which leads to the improvement of reliability. The electrical characteristics are expected to be improved because the carrier density of the oxide semiconductor film is greater than or equal to a certain amount.

<2-9. Deposition Method of Oxide Semiconductor Film>

Next, a deposition method of the oxide semiconductor film of one embodiment of the present invention is described.

The oxide semiconductor film of one embodiment of the present invention can be formed by a sputtering method under an atmosphere containing oxygen.

An oxide target that can be used for forming the oxide semiconductor film is not limited to an In—Ga—Zn-based oxide; for example, an In-M-Zn-based oxide (M is Al, Ga, Y, or Sn) can be used.

When an oxide semiconductor film containing crystal parts is formed as the oxide semiconductor film using a sputtering target containing a polycrystalline oxide having a plurality of crystal grains, an oxide semiconductor film with crystallinity is more likely to be obtained than in the case of using a sputtering target not containing a polycrystalline oxide.

The consideration of the deposition mechanism of the oxide semiconductor film is made below.

In the case where a sputtering target contains a plurality of crystal grains each of which has a layered structure and an interface at which the crystal grain is easily cleaved, ion collision with the sputtering target might cleave crystal grains to make plate-like or pellet-like sputtering particles. The obtained plate-like or pellet-like sputtering particles are deposited on a substrate, which probably results in formation of an oxide semiconductor film containing nanocrystals. An oxide semiconductor film containing crystal parts having orientation is likely to be formed when the substrate is heated because the nanocrystals are then bonded to each other or rearranged at a substrate surface.

Note that the above consideration is made on the assumption that a sputtering method is used; a sputtering method is particularly preferable because the crystallinity can be easily adjusted. Instead of a sputtering method, a pulsed laser deposition (PLD) method, a plasma-enhanced chemical vapor deposition (PECVD) method, a thermal chemical vapor deposition (CVD) method, an atomic layer deposition (ALD) method, a vacuum evaporation method, or the like may be used. As an example of the thermal CVD method, a metal organic chemical vapor deposition (MOCVD) method can be given.

At least part of this embodiment can be implemented in combination with any of the other embodiments described in this specification as appropriate.

Embodiment 3

In this embodiment, examples of a display device that includes the transistor described in the above embodiments are described below with reference to FIG. 31, FIG. 32, FIG. 33, FIG. 34, FIG. 35, FIG. 36, and FIG. 37.

Figure 31:
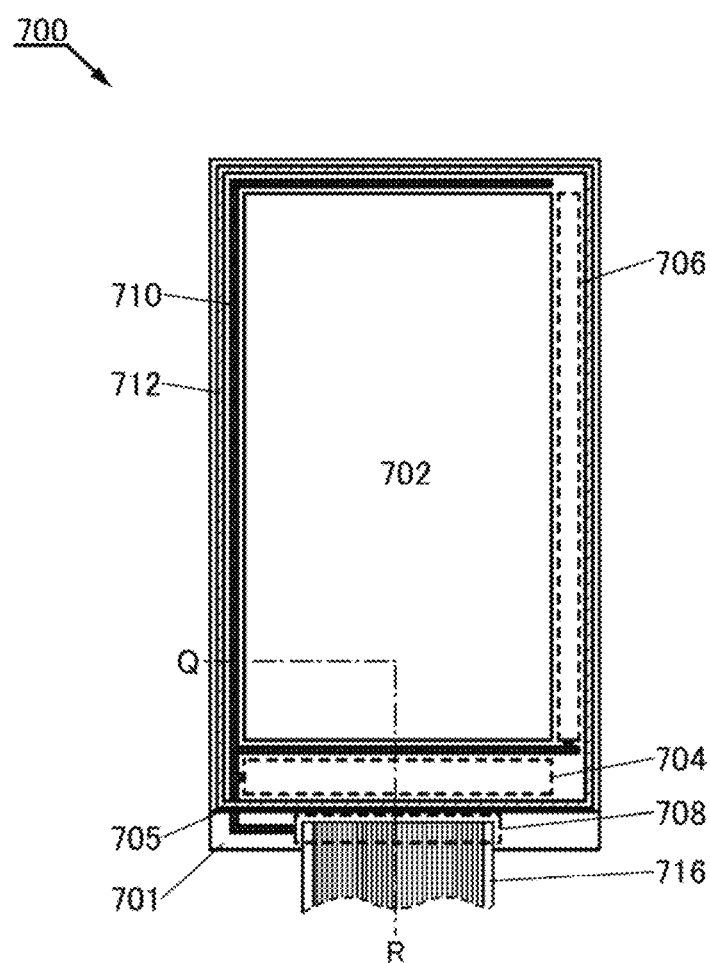
FIG. 31 is a top view illustrating one mode of a display device.

FIG. 31 is a top view illustrating an example of a display device. A display device 700 in FIG. 31 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 31, a display element is provided between the first substrate 701 and the second substrate 705.

In the display device 700, a flexible printed circuit (FPC) terminal portion 708 that is electrically connected to the pixel portion 702, the source driver circuit portion 704, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single crystal semiconductor film or a polycrystalline semiconductor film) may be formed on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used.

The display device 700 can include a variety of elements. As examples of the elements, electroluminescent (EL) element (e.g., an EL element containing organic and inorganic materials, an organic EL element, an inorganic EL element, or an LED), a light-emitting transistor element (a transistor that emits light depending on current), an electron emitter, a liquid crystal element, an electronic ink display, an electrophoretic element, an electrowetting element, a plasma display panel (PDP), micro electro mechanical systems (MEMS) display (e.g., a grating light valve (GLV), a digital micromirror device (DMD), a digital micro shutter (DMS) element, or an interferometric modulator display (IMOD) element), a piezoelectric ceramic display, and the like can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink display or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ depending on the color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and approximately 20% to 30% of power consumption can be reduced in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

Figure 32:
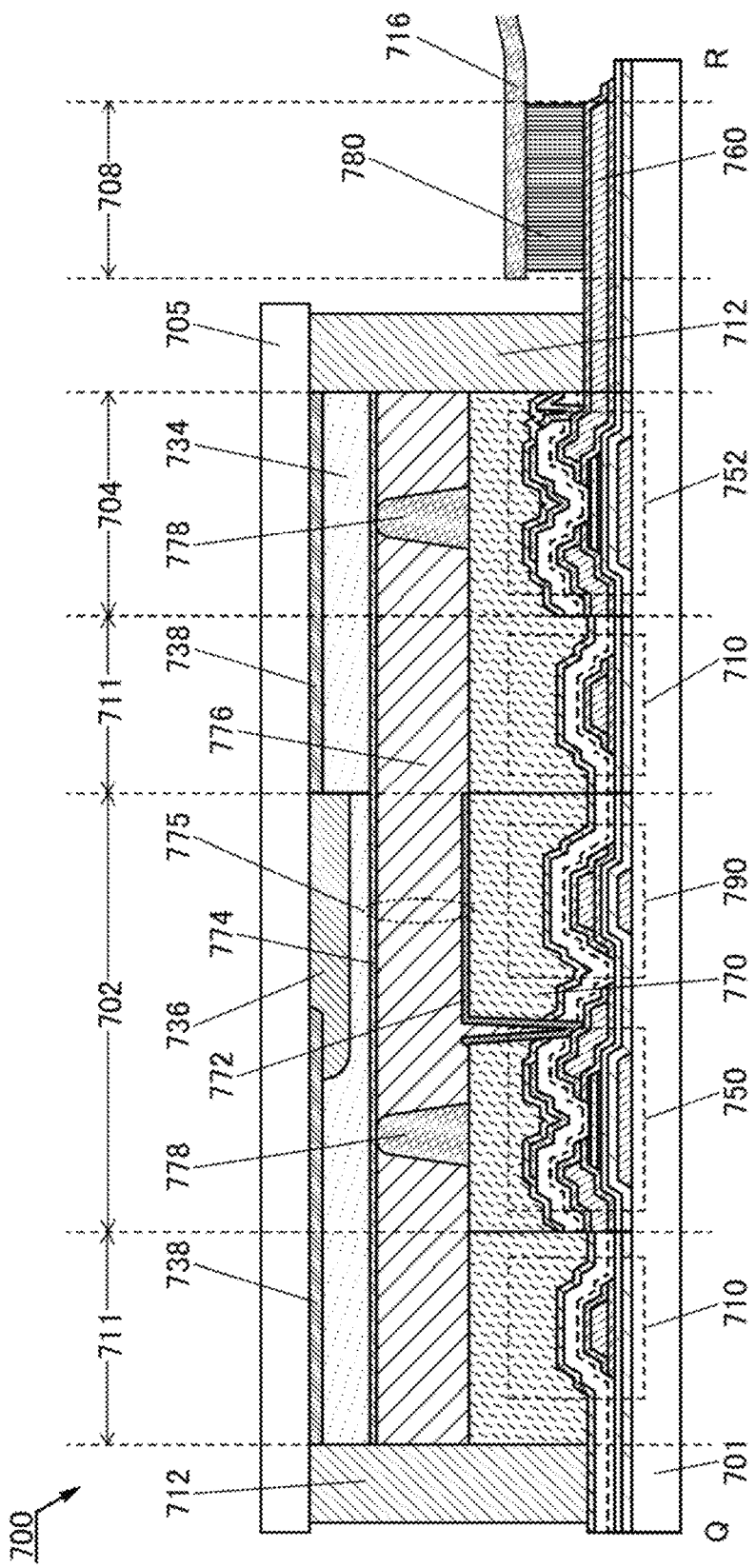
FIG. 32 is a cross-sectional view illustrating one mode of a display device.
Figure 34:
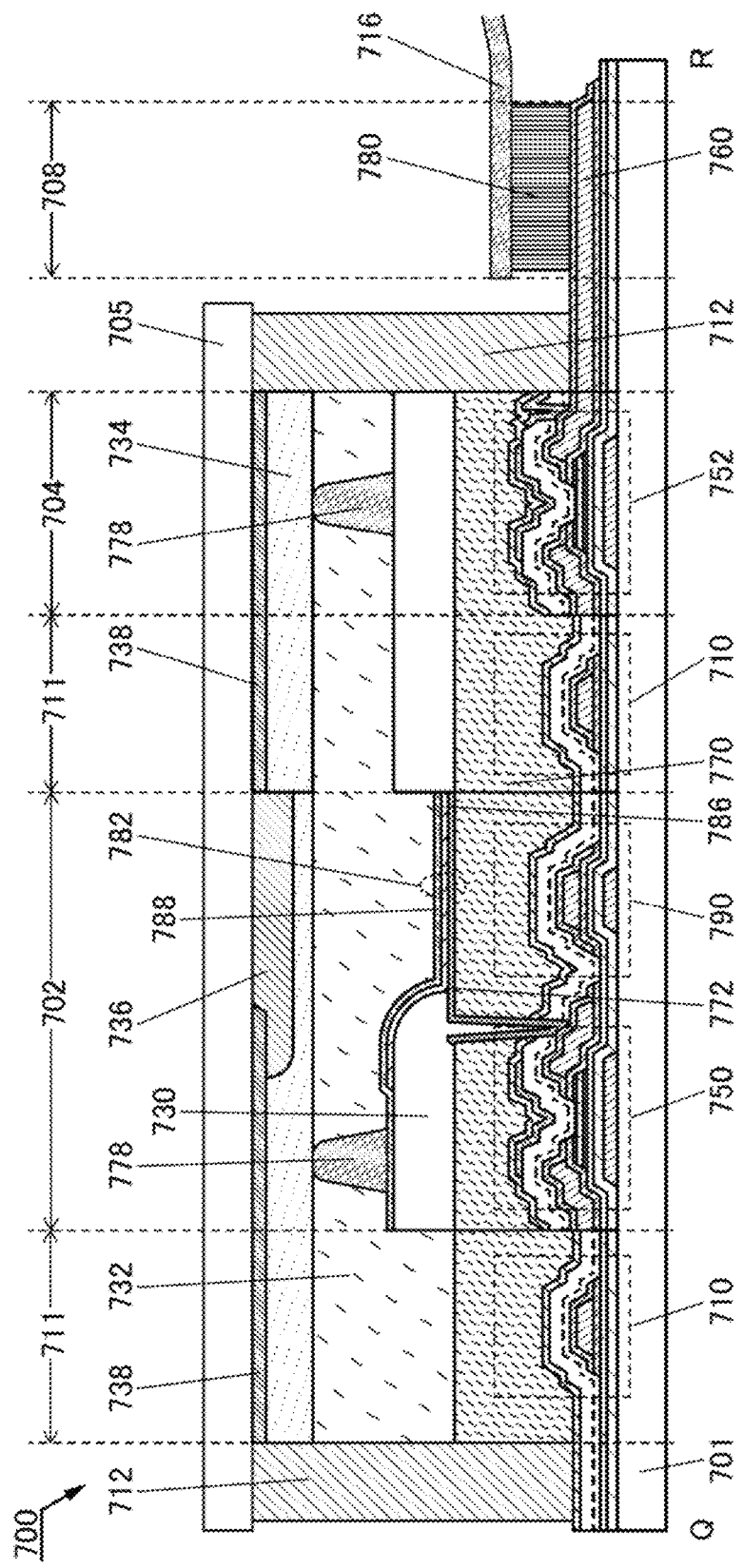
FIG. 34 is a cross-sectional view illustrating one mode of a display device.

In this embodiment, a structure including a liquid crystal element as a display element and a structure including an EL element as a display element are described with reference to FIG. 32 and FIG. 34. FIG. 32 is a cross-sectional view taken along dashed-dotted line Q-R in FIG. 31 and illustrates the structure including a liquid crystal element as a display element. FIG. 34 is a cross-sectional view taken along dashed-dotted line Q-R in FIG. 31 and illustrates the structure including an EL element as a display element.

Portions common to FIG. 32 and FIG. 34 are described first, and then, different portions are described.

<3-1. Portions Common to Display Devices>

The display device 700 in FIG. 32 and FIG. 34 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100D described above. Note that the transistor 750 and the transistor 752 may each have the structure of any of the other transistors described in the above embodiments.

The transistor used in this embodiment includes an oxide semiconductor film that is highly purified and in which formation of oxygen vacancies is inhibited. The transistor can have low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, in a liquid crystal display device that includes such a transistor capable of high-speed operation, a switching transistor in a pixel portion and a driver transistor in a driver circuit portion can be formed over one substrate. That is, no additional semiconductor device formed using a silicon wafer or the like is needed as a driver circuit; therefore, the number of components of the semiconductor device can be reduced. In addition, by using the transistor capable of high-speed operation in the pixel portion, a high-quality image can be provided.

The capacitor 790 includes a lower electrode and an upper electrode. The lower electrode is formed through a step of processing the conductive film to be the conductive film functioning as a first gate electrode of the transistor 750. The upper electrode is formed through a step of processing the conductive film to be the conductive film functioning as a source electrode or a drain electrode of the transistor 750. Between the lower electrode and the upper electrode, an insulating film formed through a step of forming the insulating film to be the insulating film functioning as a first gate insulating film of the transistor 750 is provided. That is, the capacitor 790 has a stacked-layer structure in which an insulating film functioning as a dielectric film is positioned between the pair of electrodes.

In FIG. 32 and FIG. 34, a planarization insulating film 770 is provided over the transistor 750, the transistor 752, and the capacitor 790.

The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

Although FIG. 32 and FIG. 34 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a staggered transistor is used in the pixel portion 702 and the inverted staggered transistor described in Embodiment 1 is used in the source driver circuit portion 704, or a structure in which the inverted staggered transistor described in Embodiment 1 is used in the pixel portion 702 and a staggered transistor is used in the source driver circuit portion 704 may be employed. Note that the term "source driver circuit portion 704" can be replaced by the term "gate driver circuit portion".

The signal line 710 is formed through the same process as the conductive films functioning as source electrodes and drain electrodes of the transistors 750 and 752. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, glass substrates can be used as the first substrate 701 and the second substrate 705. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer obtained by selective etching of an insulating film and is provided to control the distance (cell gap) between the first substrate 701 and the second substrate 705. Alternatively, a spherical spacer may also be used as the structure 778.

A light-blocking film 738 functioning as a black matrix, a coloring film 736 functioning as a color filter, and an insulating film 734 in contact with the light-blocking film 738 and the coloring film 736 are provided on the second substrate 705 side.

<3-2. Structure Example of Display Device Including Liquid Crystal Element>

The display device 700 in FIG. 32 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 32 can display an image in such a manner that transmission or non-transmission of light is controlled by the alignment state in the liquid crystal layer 776 that is changed depending on the voltage applied between the conductive film 772 and the conductive film 774.

The conductive film 772 is electrically connected to the conductive film functioning as the source electrode or the drain electrode of the transistor 750. The conductive film 772 is formed over the planarization insulating film 770 and functions as a pixel electrode, that is, one electrode of the display element. The conductive film 772 has a function of a reflective electrode. The display device 700 in FIG. 32 is what is called a reflective color liquid crystal display device in which external light is reflected by the conductive film 772 to display an image through the coloring film 736.

A conductive film that transmits visible light or a conductive film that reflects visible light can be used as the conductive film 772. For example, a material containing an element selected from indium (In), zinc (Zn), and tin (Sn) is preferably used for the conductive film that transmits visible light. For example, a material containing aluminum or silver is preferably used for the conductive film that reflects visible light. In this embodiment, a conductive film that reflects visible light is used as the conductive film 772.

Figure 33:
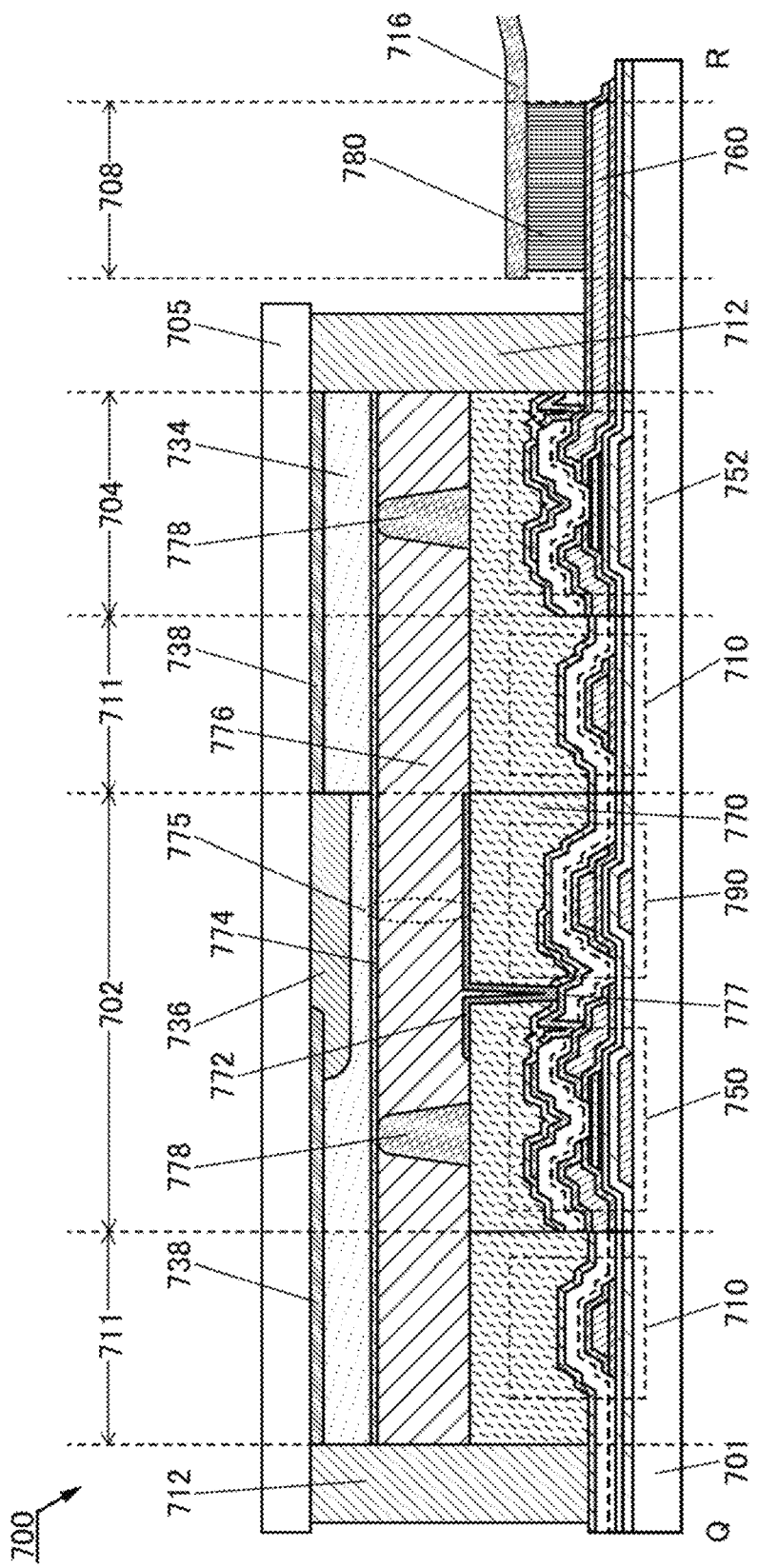
FIG. 33 is a cross-sectional view illustrating one mode of a display device.

Although FIG. 32 illustrates an example in which the conductive film 772 is connected to the conductive film functioning as the drain electrode of the transistor 750, one embodiment of the present invention is not limited to this example. For example, as illustrated in FIG. 33, the conductive film 772 may be electrically connected to the conductive film functioning as the drain electrode of the transistor 750 through a conductive film 777 functioning as a connection electrode. Note that the conductive film 777 is formed by a step of processing the conductive film to be the conductive film functioning as a second gate electrode of the transistor 750 and thus can be formed without adding a manufacturing step.

Note that the display device 700 is not limited to the example in FIG. 32, which illustrates a reflective color liquid crystal display device, and may be a transmissive color liquid crystal display device in which a conductive film that transmits visible light is used as the conductive film 772. Alternatively, the display device 700 may be what is called a transflective color liquid crystal display device in which a reflective color liquid crystal display device and a transmissive color liquid crystal display device are combined.

Figure 35:
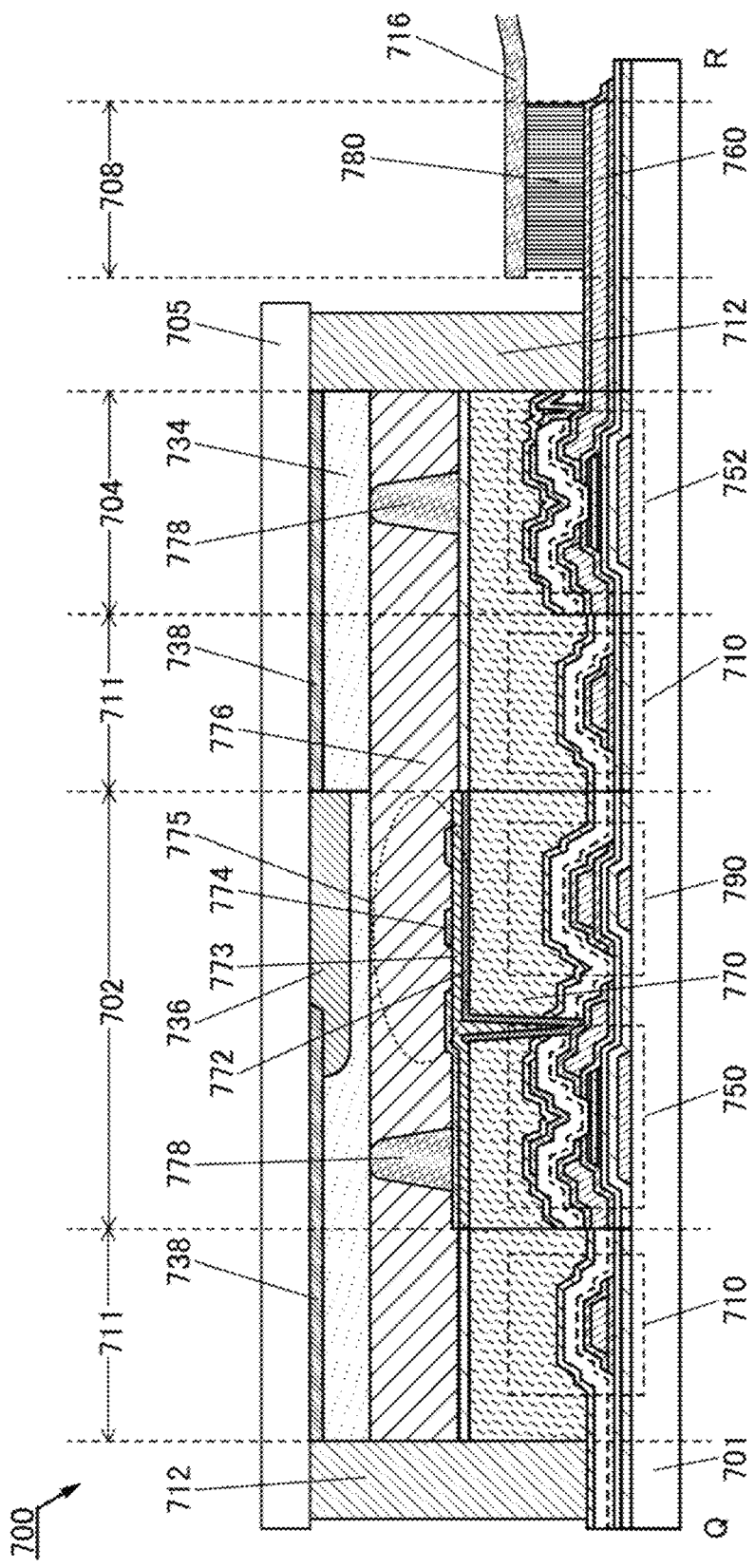
FIG. 35 is a cross-sectional view illustrating one mode of a display device.

FIG. 35 illustrates an example of a transmissive color liquid crystal display device. FIG. 35 is a cross-sectional view taken along dashed-dotted line Q-R in FIG. 31 and illustrates the structure including a liquid crystal element as a display element. The display device 700 illustrated in FIG. 35 is an example of employing a horizontal electric field mode (e.g., an FFS mode) as a driving mode of the liquid crystal element. In the structure illustrated in FIG. 35, an insulating film 773 is provided over the conductive film 772 functioning as the pixel electrode, and the conductive film 774 is provided over the insulating film 773. In such a structure, the conductive film 774 functions as a common electrode, and an electric field generated between the conductive film 772 and the conductive film 774 through the insulating film 773 can control the alignment state in the liquid crystal layer 776.

Although not illustrated in FIG. 32 and FIG. 35, the conductive film 772 and/or the conductive film 774 may be provided with an alignment film on a side in contact with the liquid crystal layer 776. Although not illustrated in FIG. 32 and FIG. 35, an optical member (optical substrate) or the like, such as a polarizing member, a retardation member, or an anti-reflection member, may be provided as appropriate. For example, circular polarization may be obtained by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

In the case where a liquid crystal element is used as a display element, a twisted nematic (TN) mode, an in-plane switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display device such as a vertical alignment (VA) mode transmissive liquid crystal display device may also be used. There are some examples of a vertical alignment mode; for example, a multi-domain vertical alignment (MVA) mode, a patterned vertical alignment (PVA) mode, and an ASV mode, or the like can be employed.

<3-3. Display Device including Light-Emitting Element>

The display device 700 illustrated in FIG. 34 includes a light-emitting element 782. The light-emitting element 782 includes a conductive film 772, an EL layer 786, and a conductive film 788. The display device 700 illustrated in FIG. 34 can display an image by utilizing light emission from the EL layer 786 of the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

In the display device 700 in FIG. 34, the insulating film 730 is provided over the planarization insulating film 770 and the conductive film 772. The insulating film 730 covers part of the conductive film 772. Note that the light-emitting element 782 has a top-emission structure. Thus, the conductive film 788 has a light-transmitting property and transmits light emitted from the EL layer 786. Although the top-emission structure is described as an example in this embodiment, the structure is not limited thereto. For example, a bottom-emission structure in which light is emitted to the conductive film 772 side or a dual-emission structure in which light is emitted to both the conductive film 772 side and the conductive film 788 side may also be employed.

The coloring film 736 is provided to overlap with the light-emitting element 782, and the light-blocking film 738 is provided in the lead wiring portion 711 and the source driver circuit portion 704 to overlap with the insulating film 730. The coloring film 736 and the light-blocking film 738 are covered with the insulating film 734. A space between the light-emitting element 782 and the insulating film 734 is filled with a sealing film 732. The structure of the display device 700 is not limited to the example in FIG. 34, in which the coloring film 736 is provided. For example, a structure without the coloring film 736 may also be employed in the case where the EL layer 786 is formed by separate coloring.

<3-4. Structure Example of Display Device Provided with Input/Output Device>

An input/output device may be provided in the display device 700 illustrated in FIG. 34 and FIG. 35. As an example of the input/output device, a touch panel or the like can be given.

Figure 36:
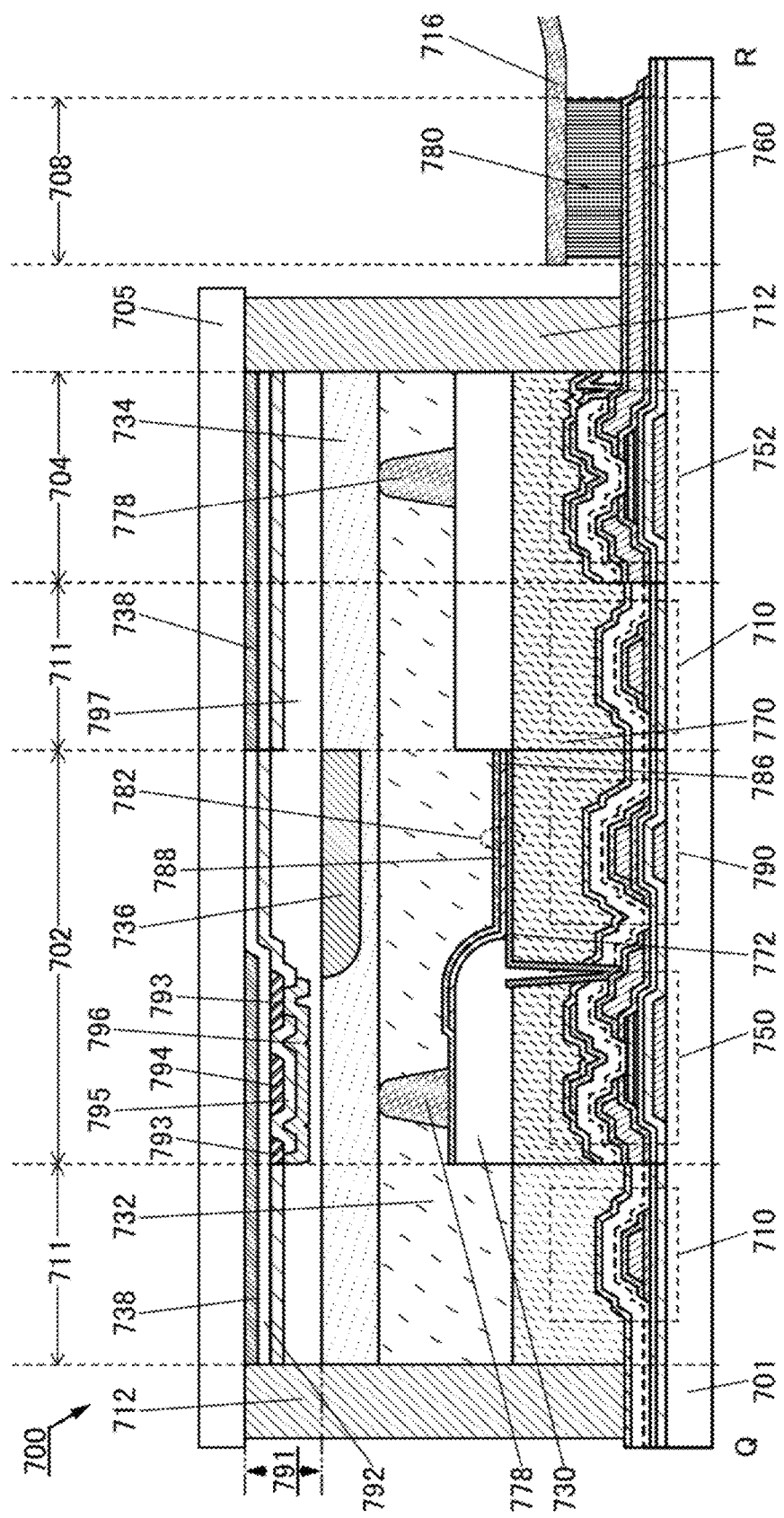
FIG. 36 is a cross-sectional view illustrating one mode of a display device.
Figure 37:
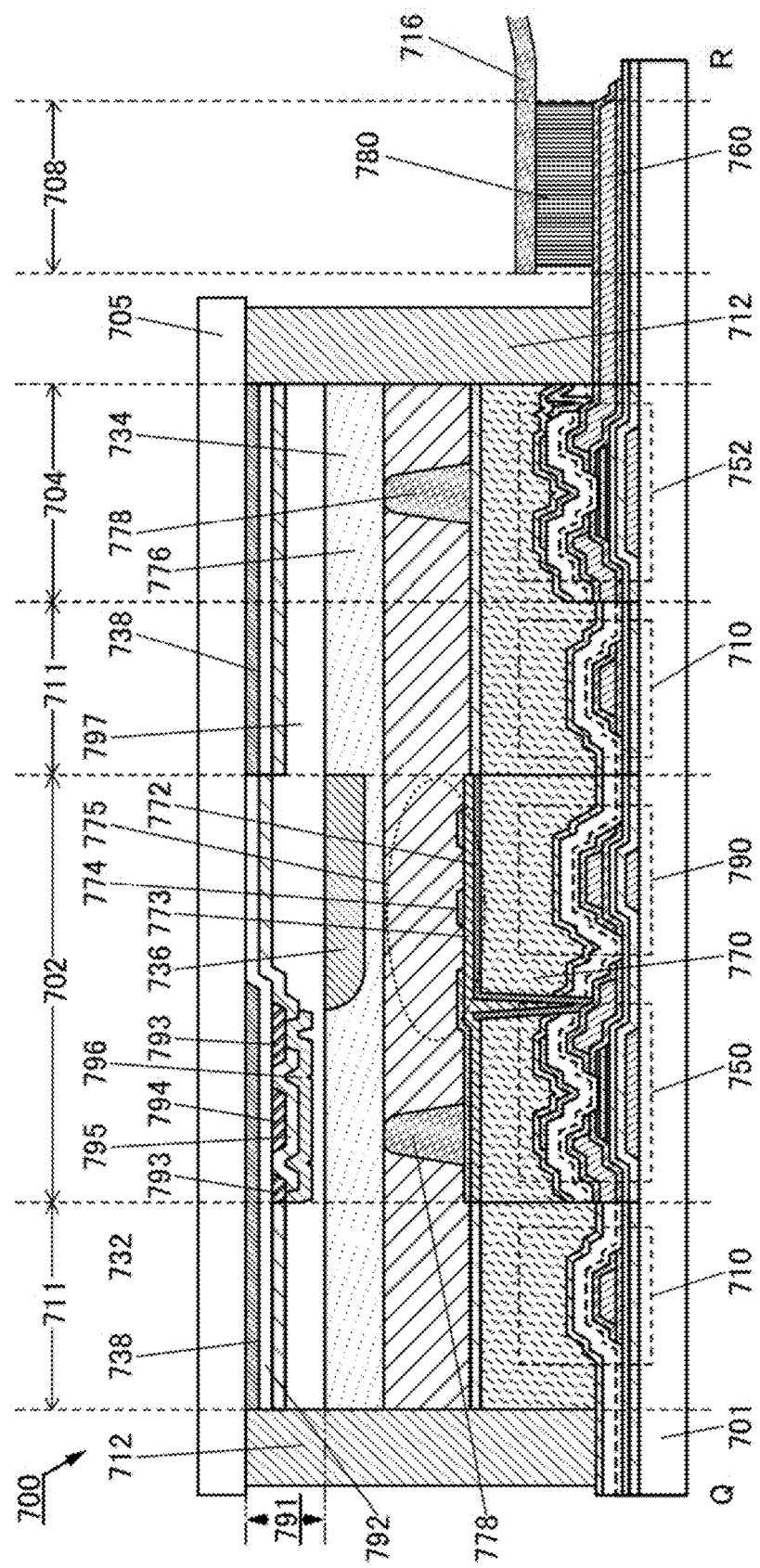
FIG. 37 is a cross-sectional view illustrating one mode of a display device.

FIG. 36 illustrates a structure in which the display device 700 in FIG. 34 includes a touch panel 791, and FIG. 37 illustrates a structure in which the display device 700 in FIG. 35 includes the touch panel 791.

FIG. 36 is a cross-sectional view of the structure in which the touch panel 791 is provided in the display device 700 illustrated in FIG. 34, and FIG. 37 is a cross-sectional view of the structure in which the touch panel 791 is provided in the display device 700 illustrated in FIG. 35.

First, the touch panel 791 illustrated in FIG. 36 and FIG. 37 is described below.

The touch panel 791 illustrated in FIG. 36 and FIG. 37 is what is called an in-cell touch panel provided between the second substrate 705 and the coloring film 736. The touch panel 791 is formed on the second substrate 705 side before the coloring film 736 is formed.

Note that the touch panel 791 includes the light-blocking film 738, an insulating film 792, an electrode 793, an electrode 794, an insulating film 795, an electrode 796, and an insulating film 797. Changes in the mutual capacitance in the electrodes 793 and 794 can be detected when an object such as a finger or a stylus approaches, for example.

A portion in which the electrode 793 intersects with the electrode 794 is illustrated in the upper portion of the transistor 750 illustrated in FIG. 36 and FIG. 37. The electrode 796 is electrically connected to the two electrodes 793 between which the electrode 794 is sandwiched through openings provided in the insulating film 795. Note that a structure in which a region where the electrode 796 is provided is provided in the pixel portion 702 is illustrated in FIG. 36 and FIG. 37 as an example; however, one embodiment of the present invention is not limited thereto. For example, the region where the electrode 796 is provided may be provided in the source driver circuit portion 704.

The electrode 793 and the electrode 794 are provided in a region overlapping with the light-blocking film 738. As illustrated in FIG. 36, it is preferable that the electrode 793 not overlap with the light-emitting element 782. As illustrated in FIG. 37, it is preferable that the electrode 793 not overlap with the liquid crystal element 775. In other words, the electrode 793 has an opening in a region overlapping with the light-emitting element 782 and the liquid crystal element 775. That is, the electrode 793 has a mesh shape. With such a structure, the electrode 793 does not block light emitted from the light-emitting element 782, or alternatively the electrode 793 does not block light transmitted through the liquid crystal element 775. Thus, since luminance is hardly reduced even when the touch panel 791 is provided, a display device with high visibility and low power consumption can be obtained. Note that the electrode 794 can have a structure similar to that of the electrode 793.

Since the electrode 793 and the electrode 794 do not overlap with the light-emitting element 782, a metal material having low transmittance with respect to visible light can be used for the electrode 793 and the electrode 794. Furthermore, since the electrode 793 and the electrode 794 do not overlap with the liquid crystal element 775, a metal material having low transmittance with respect to visible light can be used for the electrode 793 and the electrode 794.

Thus, as compared with the case of using an oxide material whose transmittance of visible light is high, resistance of the electrodes 793 and 794 can be reduced, whereby sensitivity of the sensor of the touch panel can be increased.

For example, a conductive nanowire may be used for the electrodes 793, 794, and 796. The nanowire may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of electrodes 793, 794, and 796, the transmittance of visible light can be greater than or equal to 89% and the sheet resistance can be greater than or equal to 40 $\Omega$/sq. and less than or equal to 100 $\Omega$/sq.

Although the structure of the in-cell touch panel is illustrated in FIG. 36 and FIG. 37, one embodiment of the present invention is not limited thereto. For example, a touch panel formed over the display device 700, what is called an on-cell touch panel, or a touch panel attached to the display device 700, what is called an out-cell touch panel may be used.

In this manner, the display device of one embodiment of the present invention can be combined with various types of touch panels.

At least part of this embodiment can be implemented in combination with any of the other embodiments described in this specification as appropriate.

Embodiment 4

In this embodiment, a display device including a semiconductor device of one embodiment of the present invention is described with reference to FIGS. 38A to 38C.

<4. Circuit Configuration of Display Device>

A display device illustrated in FIG. 38A includes a region including pixels of display elements (hereinafter referred to as a pixel portion 502), a circuit portion that is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X (X is a natural number of 2 or more) rows and Y (Y is a natural number of 2 or more) columns (hereinafter, the circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, another signal can be supplied from the gate driver 504a.

The source driver 504b includes a shift register or the like. The source driver 504b receives a signal (image signal) from which a data signal is generated, as well as a signal for driving the shift register, through the terminal portion 507. The source driver 504b has a function of generating a data signal to be written to the pixel circuit 501 from the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter referred to as data lines DL_1 to DL_Y). Alternatively, the source driver 504b has a function of supplying an initialization signal. Without being limited thereto, another signal can be supplied from the source driver 504b.

The source driver 504b includes a plurality of analog switches, for example. The source driver 504b can output, as data signals, time-divided image signals obtained by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal in each of the plurality of pixel circuits 501 are controlled by the gate driver 504a. For example, to the pixel circuit 501 in the m-th row and the n-th column (m is a natural number of X or less, and n is a natural number of Y or less), a pulse signal is input from the gate driver 504a through the scan line GL_m, and a data signal is input from the source driver 504b through the data line DL_n in accordance with the potential of the scan line GL_m.

Figure 38A:
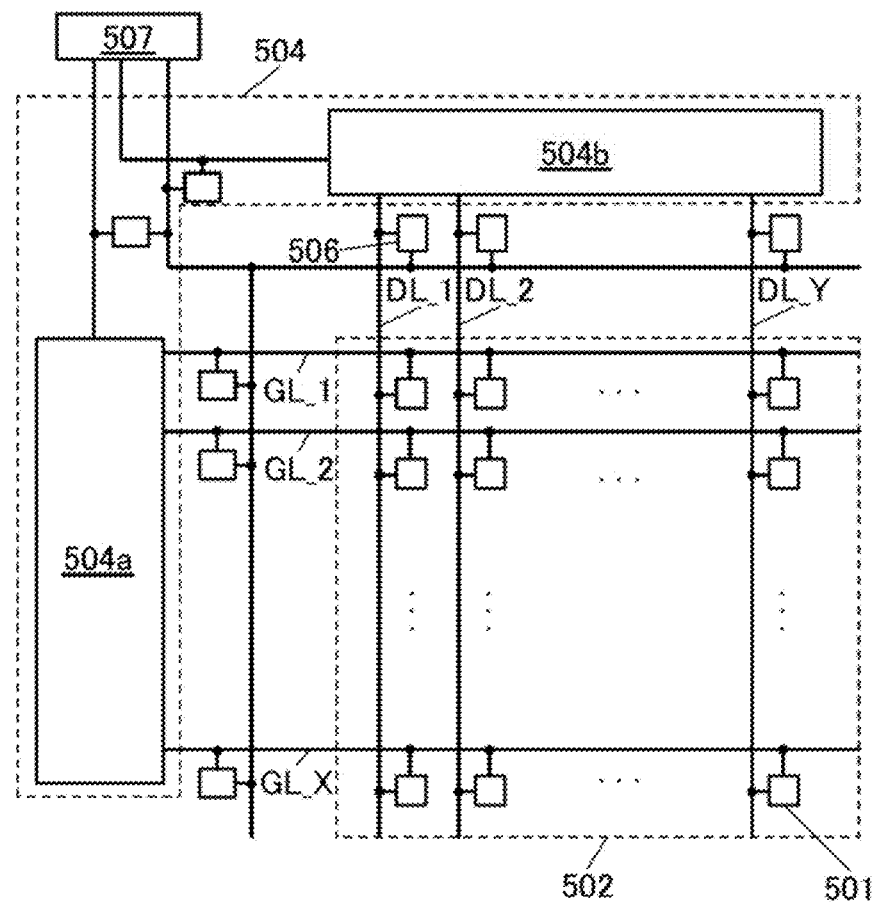
FIGS. 38A to 38C are a block diagram and circuit diagrams illustrating a display device.

The protection circuit 506 in FIG. 38A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion having terminals for inputting power, control signals, and image signals from external circuits to the display device.

The protection circuit 506 electrically connects a wiring connected to the protection circuit to another wiring when a potential out of a certain range is supplied to the wiring connected to the protection circuit.

As illustrated in FIG. 38A, the protection circuits 506 provided for the pixel portion 502 and the driver circuit portion 504 can improve the resistance of the display device to overcurrent generated by electrostatic discharge (ESD) or the like. Note that the configuration of the protection circuits 506 is not limited thereto; for example, the protection circuit 506 can be connected to the gate driver 504a or the source driver 504b. Alternatively, the protection circuit 506 can be connected to the terminal portion 507.

One embodiment of the present invention is not limited to the example in FIG. 38A, in which the driver circuit portion 504 includes the gate driver 504a and the source driver 504b. For example, only the gate driver 504a may be formed, and a separately prepared substrate over which a source driver circuit is formed (e.g., a driver circuit board formed using a single crystal semiconductor film or a polycrystalline semiconductor film) may be mounted.

Figure 38B:
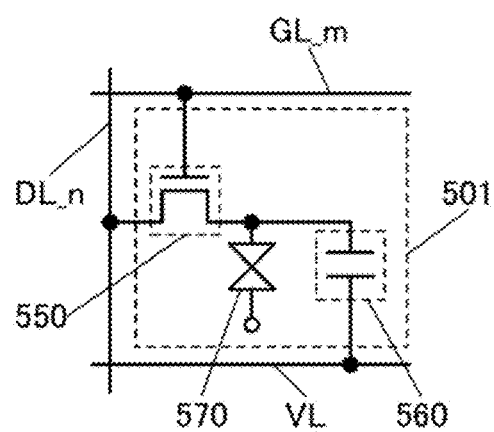

Each of the plurality of pixel circuits 501 in FIG. 38A can have the configuration illustrated in FIG. 38B, for example.

The pixel circuit 501 in FIG. 38B includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 depends on data written thereto. A common potential may be supplied to the one of the pair of electrodes of the liquid crystal element 570 included in each of the plurality of pixel circuits 501. The potential supplied to the one of the pair of electrodes of the liquid crystal element 570 in the pixel circuit 501 may differ between rows.

Examples of a method for driving the display device including the liquid crystal element 570 include a TN mode, an STN mode, a VA mode, an axially symmetric aligned micro-cell (ASM) mode, an optically compensated birefringence (OCB) mode, a ferroelectric liquid crystal (FLC) mode, an anti-ferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC)

mode, and a guest-host mode. Without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other of the source electrode and the drain electrode of the transistor 550 is electrically connected to the other of the pair of electrodes of the liquid crystal element 570. A gate electrode of the transistor 550 is electrically connected to the scan line GL_m. The transistor 550 is configured to be turned on or off to control whether a data signal is written.

One of a pair of electrodes of the capacitor 560 is electrically connected to a wiring through which a potential is supplied (hereinafter referred to as a potential supply line VL), and the other of the pair of electrodes of the capacitor 560 is electrically connected to the other of the pair of electrodes of the liquid crystal element 570. The potential of the potential supply line VL is set as appropriate in accordance with the specifications of the pixel circuit 501. The capacitor 560 functions as a storage capacitor for storing written data.

For example, in the display device including the pixel circuits 501 in FIG. 38B, the gate driver 504a in FIG. 38A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 38C:
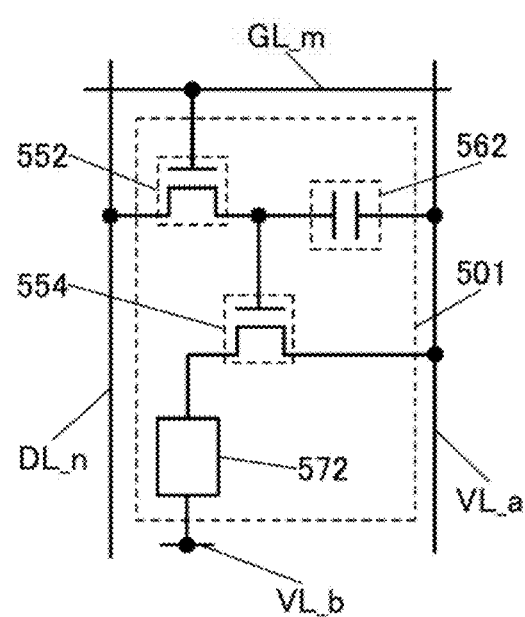

Alternatively, each of the plurality of pixel circuits 501 in FIG. 38A can have the configuration illustrated in FIG. 38C, for example.

The pixel circuit 501 in FIG. 38C includes transistors 552 and 554, a capacitor 562, and a light-emitting element 572. The transistor described in the above embodiment can be used as the transistor 552 and/or the transistor 554.

One of a source electrode and a drain electrode of the transistor 552 is electrically connected to a wiring through which a data signal is supplied (hereinafter referred to as a data line DL_n). A gate electrode of the transistor 552 is electrically connected to a wiring through which a gate signal is supplied (hereinafter referred to as a scan line GL_m).

The transistor 552 is configured to be turned on or off to control whether a data signal is written.

One of a pair of electrodes of the capacitor 562 is electrically connected to a wiring through which a potential is supplied (hereinafter referred to as a potential supply line VL_a), and the other of the pair of electrodes of the capacitor 562 is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other of the anode and the cathode of the light-emitting element 572 is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

A high power supply potential $V_{DD}$ is supplied to one of the potential supply line VL_a and the potential supply line VL_b, and a low power supply potential $V_{SS}$ is supplied to the other of the potential supply line VL_a and the potential supply line VL_b.

In the display device including the pixel circuits 501 in FIG. 38C, the gate driver 504a in FIG. 38A sequentially selects the pixel circuits 501 row by row to turn on the transistors 552, and data signals are written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

At least part of this embodiment can be implemented in combination with any of the other embodiments described in this specification as appropriate.

Embodiment 5

In this embodiment, a display module and electronic devices, each of which includes a semiconductor device of one embodiment of the present invention, are described with reference to FIG. 39, FIGS. 40A to 40E, FIGS. 41A to 41G, and FIGS. 42A and 42B.

<5-1. Display Module>

Figure 39:
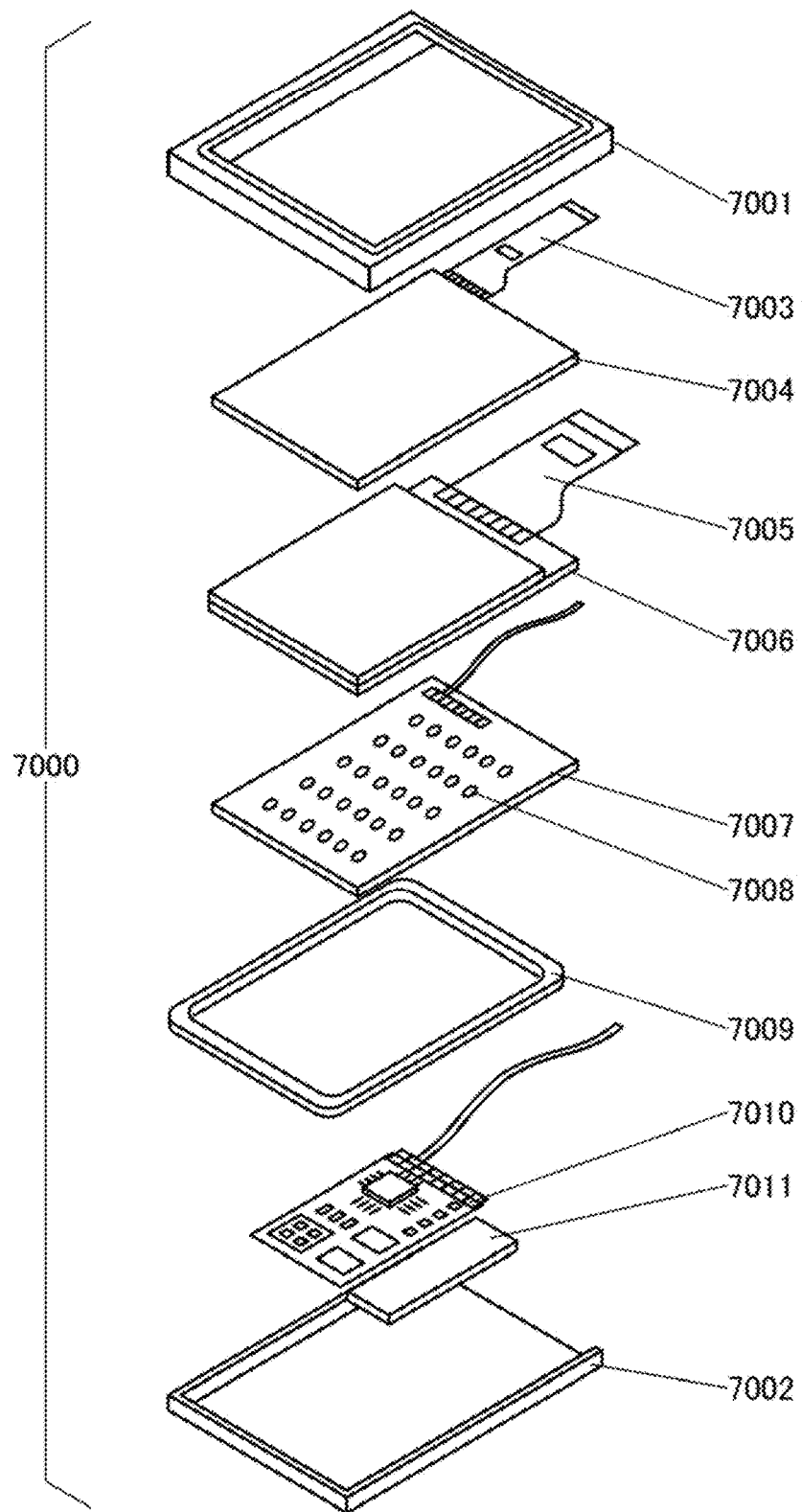
FIG. 39 illustrates a display module.

In a display module 7000 illustrated in FIG. 39, a touch panel 7004 connected to an FPC 7003, a display panel 7006 connected to an FPC 7005, a backlight 7007, a frame 7009, a printed-circuit board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive touch panel or a capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. One embodiment of the present invention is not limited to the structure in FIG. 39, in which the light source 7008 is provided over the backlight 7007. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 protects the display panel 7006 and functions as an electromagnetic shield for blocking electromagnetic waves generated by the operation of the printed-circuit board 7010. The frame 7009 may also function as a radiator plate.

The printed-circuit board 7010 includes a power supply circuit and a signal processing circuit for outputting a video signal and a clock signal. As a power source for supplying power to the power supply circuit, an external commercial power source or the separate battery 7011 may be used. The battery 7011 can be omitted in the case where a commercial power source is used.

The display module 7000 may be additionally provided with a member such as a polarizing plate, a retardation plate, or a prism sheet.

<5-2. Electronic Device 1>

Next, FIGS. 40A to 40E illustrate examples of electronic devices.

Figure 40A:
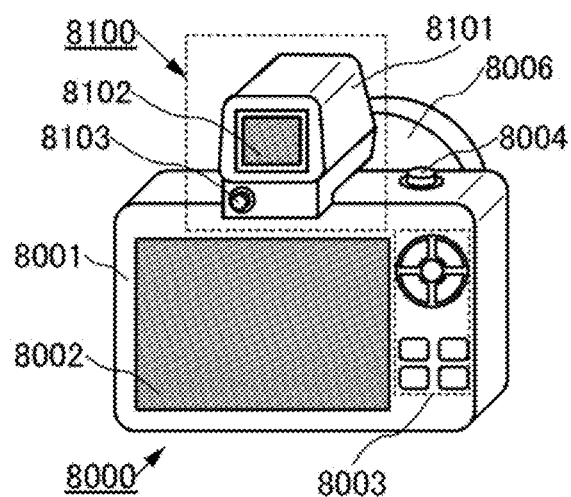
FIGS. 40A to 40E illustrate electronic devices.

FIG. 40A is an external view of a camera 8000 to which a finder 8100 is attached.

The camera 8000 includes a housing 8001, a display portion 8002, an operation button 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 that serves as a touch panel.

The housing 8001 of the camera 8000 includes a mount including an electrode, so that the finder 8100, a strobo-scope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 serves as a power button. The display portion 8102 can be turned on and off with the button 8103.

A display device of one embodiment of the present invention can be used in the display portion 8002 of the camera 8000 and the display portion 8102 of the finder 8100.

Although the camera 8000 and the finder 8100 are separate and detachable electronic devices in FIG. 40A, the housing 8001 of the camera 8000 may include a finder having a display device.

Figure 40B:
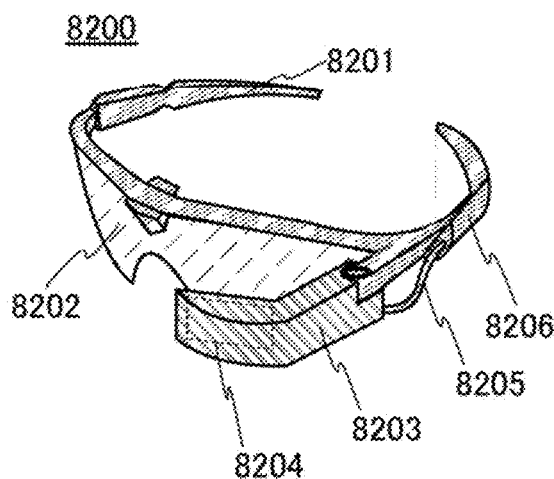

FIG. 40B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 40C:
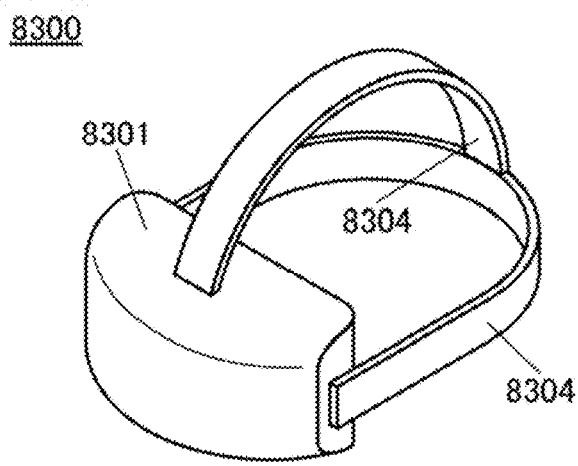
Figure 40D:
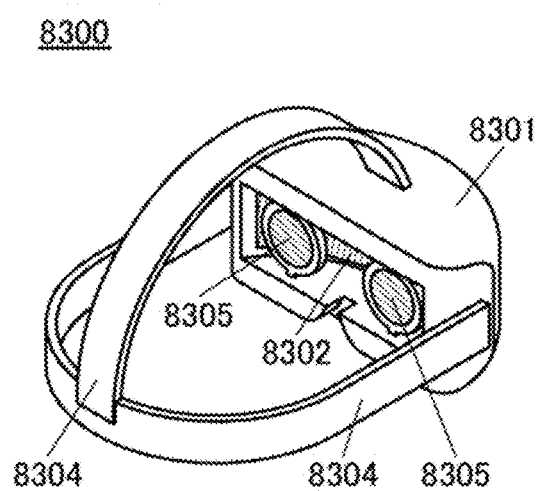
Figure 40E:
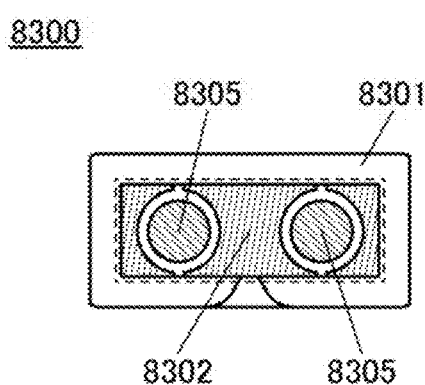

FIGS. 40C to 40E are external views of a head-mounted display 8300. The head-mounted display 8300 includes a housing 8301, a display portion 8302, an object for fixing, such as a band, 8304, and a pair of lenses 8305.

A user can see display on the display portion 8302 through the lenses 8305. It is favorable that the display portion 8302 be curved. When the display portion 8302 is curved, a user can feel high realistic sensation of images. Although the structure described in this embodiment as an example has one display portion 8302, the number of the display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 40E, the user does not perceive pixels, and thus a more realistic image can be displayed.

<5-3. Electronic Device 2>

Next, FIGS. 41A to 41G illustrate examples of electronic devices that are different from those illustrated in FIGS. 40A to 40E.

Electronic devices illustrated in FIGS. 41A to 41G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIGS. 41A to 41G have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices in FIGS. 41A to 41G are not limited thereto, and the electronic devices can have a variety of functions. Although not illustrated in FIGS. 41A to 41G, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 41A to 41G are described in detail below.

Figure 41A:
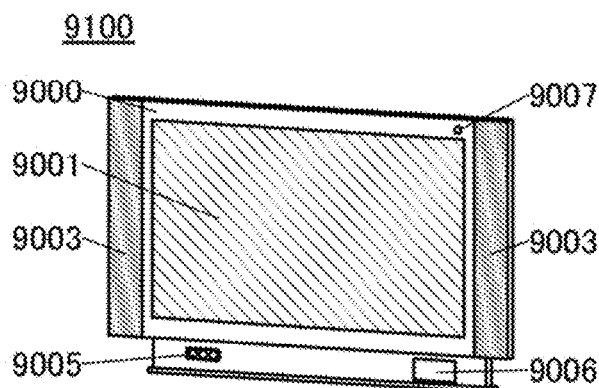
FIGS. 41A to 41G illustrate electronic devices.

FIG. 41A is a perspective view illustrating a television device 9100. The television device 9100 can include the display portion 9001 having a large screen size of, for example, 50 inches or more, or 100 inches or more.

Figure 41D:
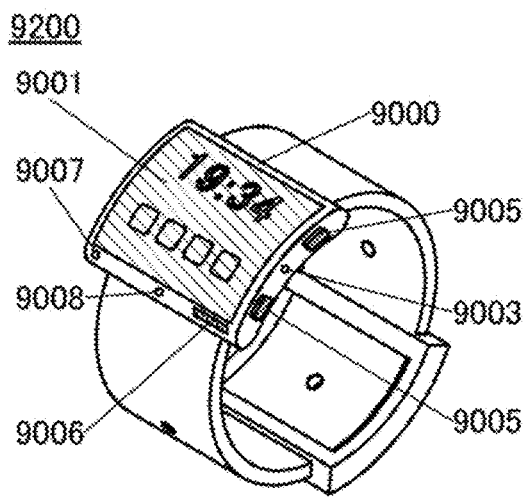
Figure 41B:
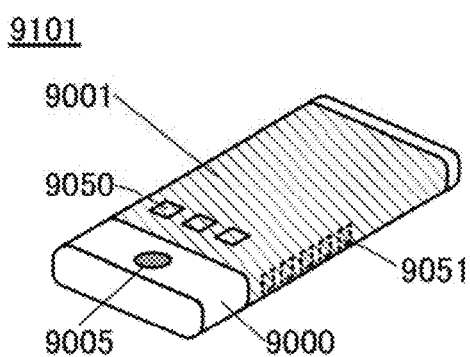

FIG. 41B is a perspective view of a portable information terminal 9101. The portable information terminal 9101 functions as, for example, one or more of a telephone set, a notebook, and an information browsing system. Specifically, the portable information terminal 9101 can be used as a smartphone. Note that the portable information terminal 9101 may include a speaker, a connection terminal, a sensor, or the like. The portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Examples of the information 9051 include display indicating reception of an e-mail, a social networking service (SNS) message, or a telephone call, the title and sender of an e-mail or an SNS message, date, time, remaining battery, and reception strength of an antenna. Alternatively, the operation buttons 9050 or the like may be displayed in place of the information 9051.

Figure 41E:
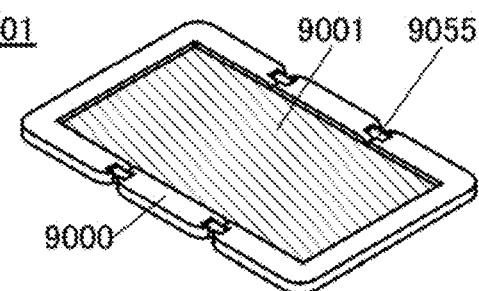
Figure 41C:
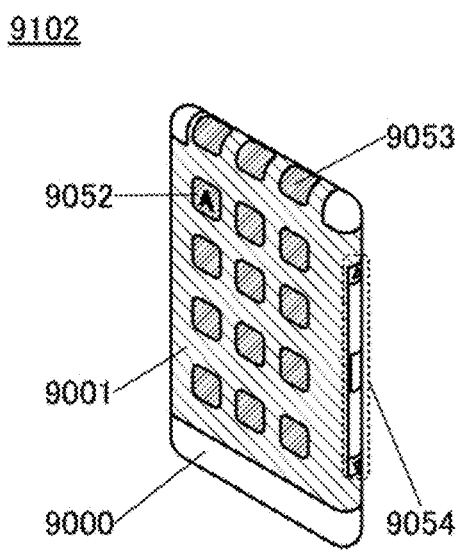

FIG. 41C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) on the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 41D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved, and display can be performed on the curved display surface. The portable information terminal 9200 can employ near field communication conformable to a communication standard. For example, hands-free calling can be achieved by mutual communication between the portable information terminal 9200 and a headset capable of wireless communication. Moreover, the portable information terminal 9200 includes the connection terminal 9006 and can perform direct data communication with another information terminal via a connector. Charging through the connection terminal 9006 is also possible. Note that the charging operation may be performed by wireless power feeding without using the connection terminal 9006.

Figure 41F:
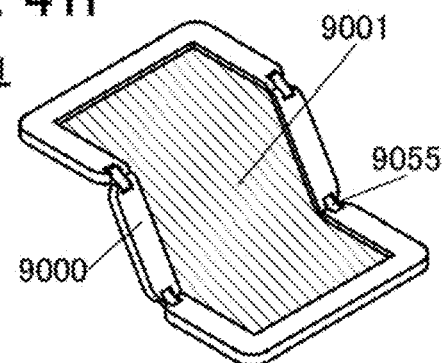
Figure 41G:
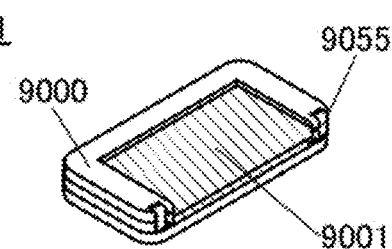

FIGS. 41E, 41F, and 41G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region is highly browsable. The display portion 9001 of the portable information terminal 9201 is supported by three housings 9000 joined by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

Figure 42A:
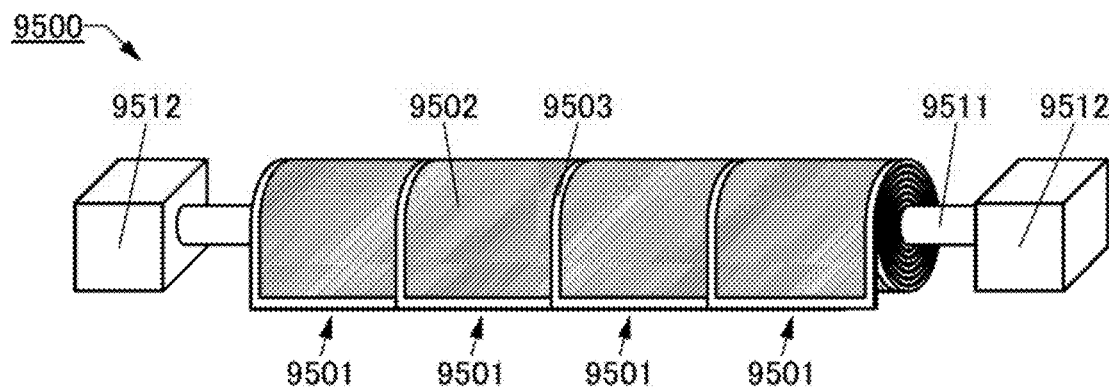
FIGS. 42A and 42B are perspective views illustrating a display device.
Figure 42B:
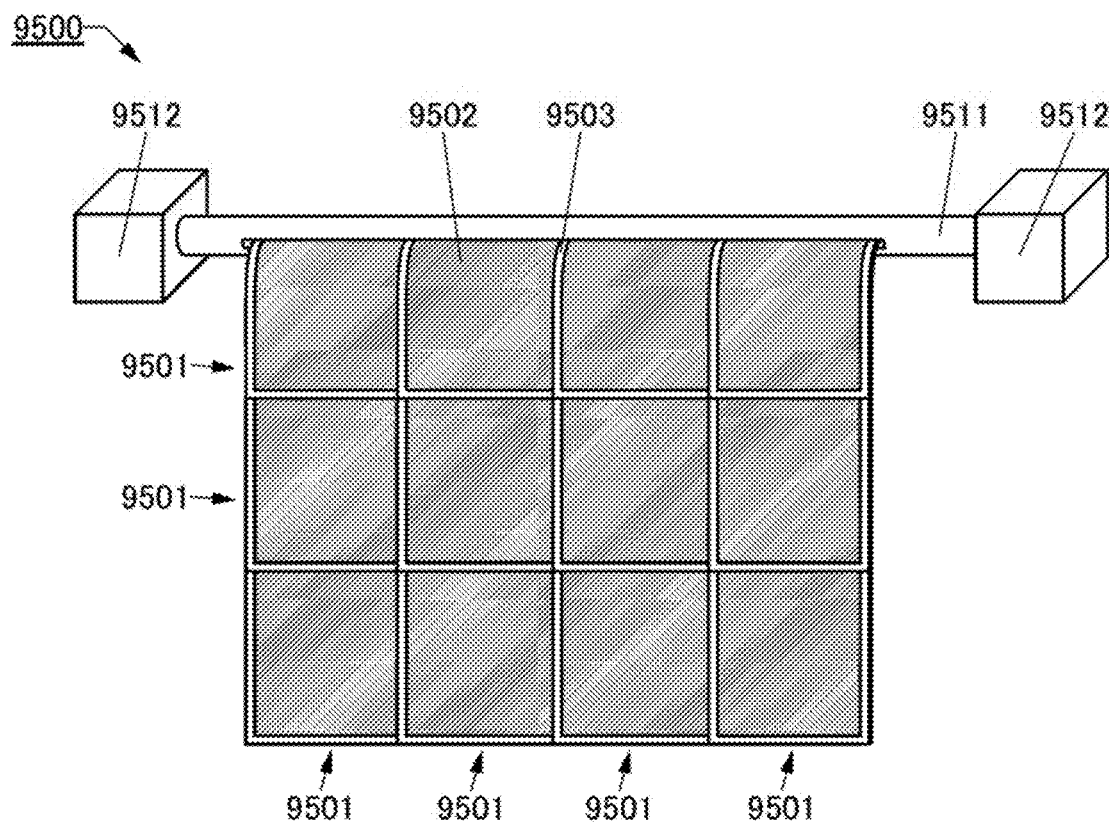

Next, an example of an electronic device that is different from the electronic devices illustrated in FIGS. 40A to 40E and FIGS. 41A to 41G is illustrated in FIGS. 42A and 42B. FIGS. 42A and 42B are perspective views of a display device including a plurality of display panels. The plurality of display panels are wound in the perspective view in FIG. 42A and are unwound in the perspective view in FIG. 42B.

A display device 9500 illustrated in FIGS. 42A and 42B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can overlap with each other. A display device having a large screen can be obtained with the plurality of display panels 9501. The display device is highly versatile because the display panels 9501 can be wound depending on its use.

Although the display regions 9502 of the adjacent display panels 9501 are separated from each other in FIGS. 42A and 42B, without limitation to this structure, the display regions 9502 of the adjacent display panels 9501 may overlap with each other without any space so that a continuous display region 9502 is obtained, for example.

The electronic devices described in this embodiment are characterized by having a display portion for displaying some sort of information. Note that the semiconductor device of one embodiment of the present invention can also be used for an electronic device that does not have a display portion.

At least part of this embodiment can be implemented in combination with any of the other embodiments described in this specification as appropriate.

Example 1

In this example, the crystallinity of an oxide semiconductor film that can be used for a semiconductor device of one embodiment of the present invention was evaluated. In this example, Sample A1 and Sample A2 were fabricated.

[Sample A1]

In Sample A1, a 100-nm-thick oxide semiconductor film was provided over a glass substrate. The oxide semiconductor film of Sample A1 was formed under the following conditions: the substrate temperature was room temperature; an argon gas with a flow rate of 180 sccm and an oxygen gas with a flow rate of 20 sccm were introduced into a chamber of a sputtering apparatus; the pressure was set to 0.6 Pa; and an AC power of 2.5 kW was applied to a metal oxide target containing indium, gallium, and zinc (with an atomic ratio of In:Ga:Zn=4:2:4.1). The proportion of gas flow rate may be represented by a percentage of oxygen flow rate which indicates the proportion of the oxygen flow rate with respect to the total gas flow rate. The percentage of oxygen flow rate under the fabrication conditions for Sample A1 was 10%.

[Sample A2]

In Sample A2, a 100-nm-thick oxide semiconductor film was provided over a glass substrate. The oxide semiconductor film of Sample A2 was formed under the following conditions: the substrate temperature was room temperature; an oxygen gas with a flow rate of 200 sccm was introduced into a chamber of a sputtering apparatus; the pressure was set to 0.6 Pa; and an AC power of 2.5 kW was applied to a metal oxide target containing indium, gallium, and zinc (with an atomic ratio of In:Ga:Zn=4:2:4.1). The percentage of oxygen flow rate under the fabrication conditions for Sample A2 was 100%.

As described above, Sample A1 and Sample A2 are different from each other in the percentage of oxygen flow rate at the time of forming the oxide semiconductor film. Note that the glass substrates used for Sample A1 and Sample A2 were each a large glass substrate with a size of 600 mm×720 mm and a thickness of 0.7 mm.

[XRD Measurement]

Then, the crystallinity of the oxide semiconductor films formed in Sample A1 and Sample A2 fabricated was evaluated by XRD measurement.

Figure 43A:
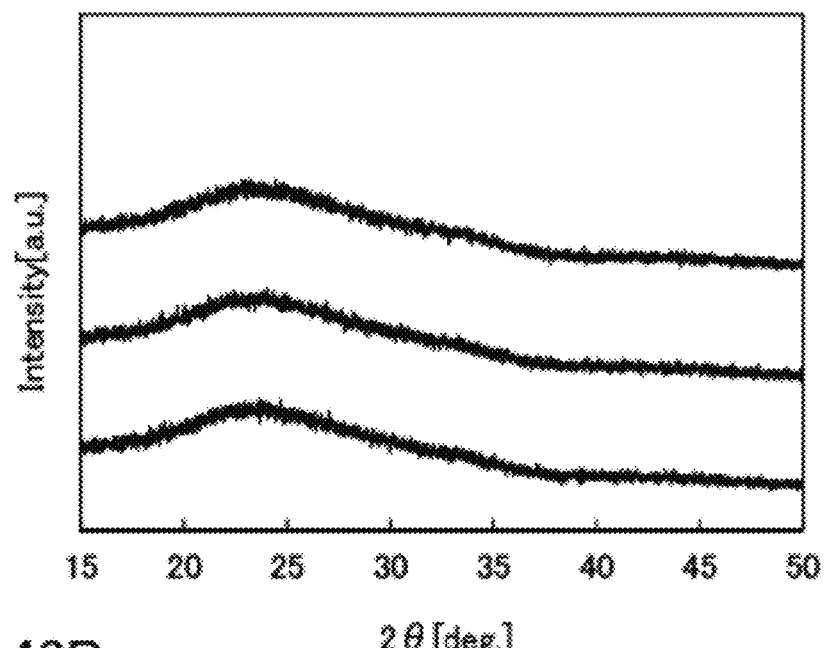
FIGS. 43A and 43B show XRD measurement results of oxide semiconductor films.
Figure 43B:
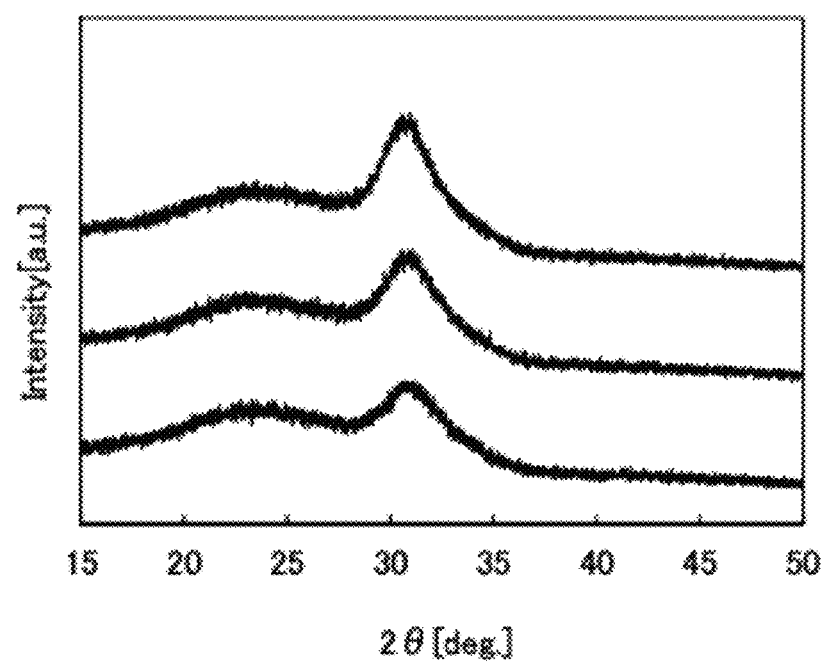

The XRD measurement results of Sample A1 are shown in FIG. 43A and those of Sample A2 are shown in FIG. 43B. The XRD measurement was performed at three points within the glass substrate of each sample.

A powder method (also referred to as a θ-2θ method) which is a kind of an out-of-plane method was used for the XRD measurement. In a θ-2θ method, X-ray diffraction intensity is measured while an incident angle of an X-ray is changed and the angle of a detector facing an X-ray source is equal to the incident angle. In FIGS. 43A and 43B, the vertical axis represents the diffraction intensity in an arbitrary unit and the horizontal axis represents the angle 2θ. In addition, in FIGS. 43A and 43B, three XRD profiles are shown together in each graph.

As shown in FIG. 43A, from Sample A1, a diffraction intensity peak at around 2θ=31° is not clearly observed, or an extremely low diffraction intensity peak at around 2θ=31° is observed, or no diffraction intensity peak at around 2θ=31° is observed. In contrast, as can be seen in FIG. 43B, from Sample A2, the diffraction intensity peak at around 2θ=31° is clearly observed.

The diffraction angle (at around 2θ=31°) at which the diffraction intensity peak was observed corresponds to a diffraction angle on the (009) plane of the structure model of single crystal $InGaZnO_4$. Therefore, since the above peak is observed in the measurement results of Sample A2, it is shown that Sample A2 includes a crystal part where the c-axes are aligned in the thickness direction. In contrast, it is difficult to determine whether or not Sample A1 includes a crystal part having c-axis alignment, by XRD measurement.

These results show that the crystallinity of an oxide semiconductor film can be changed by changing the percentage of the oxygen flow rate in forming the oxide semiconductor film. It is suggested that the higher the percentage of the oxygen flow rate in forming an oxide semiconductor film, the higher the crystallinity of the oxide semiconductor film.

Note that the structure described in this example can be combined with the other example or any of the above embodiments as appropriate.

Example 2

In this example, results of elemental analysis and crystallinity evaluation of In—Ga—Zn oxide films (hereinafter referred to as IGZO films) formed by any of the methods described in the above embodiments will be described.

An IGZO film of Sample B1 of this example was formed over a glass substrate with the intended thickness set to 100 nm by a sputtering method using an In—Ga—Zn oxide target (with an atomic ratio of In:Ga:Zn=4:2:4.1). The IGZO film was formed in an atmosphere including an argon gas at 180 sccm and an oxygen gas at 20 sccm, where the pressure was controlled to 0.6 Pa, the substrate temperature was room temperature, and an alternating-current power of 2.5 kW was applied.

A cross section of the IGZO film of Sample B1 was subjected to measurement using energy dispersive X-ray spectroscopy (EDX). The EDX measurement was performed using an atomic resolution analytical electron microscope JEM-ARM200F manufactured by JEOL Ltd. under conditions where the acceleration voltage was 200 kV, and irradiation with an electron beam with a diameter of approximately 0.1 nmφ was performed. An energy dispersive X-ray spectrometer JED-2300T was used as an elemental analysis apparatus. A Si drift detector was used to detect X-rays emitted from Sample B1.

In the EDX measurement, an EDX spectrum of a point is obtained in such a manner that electron beam irradiation is performed on the point in an analysis target region of Sample B1, and the energy of characteristic X-rays of the sample generated by the irradiation and its frequency are measured. In this example, peaks of an EDX spectrum of the point were attributed to electron transitions in an In atom, a Ga atom, a Zn atom, and an O atom, and the proportions of the atoms in the point were calculated. An EDX mapping image indicating distributions of proportions of the atoms can be obtained through this process in an analysis target region of Sample B1.

Figure 44:
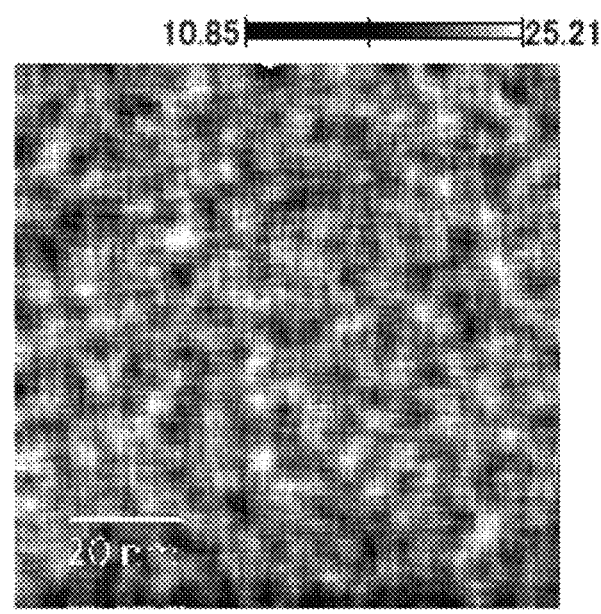
FIG. 44 shows an EDX mapping image of a cross section of a sample of Example.

FIG. 44 shows an EDX mapping image of In atoms in the cross section of the IGZO film of Sample B1. The EDX mapping image in FIG. 44 shows the proportions [atomic %] of In atoms in some points of the IGZO film. The proportions of In atoms in relatively dark regions in FIG. 44 are low, and the lowest proportion is 10.85 atomic %. The proportions of In atoms in relatively light regions in FIG. 44 are high, and the highest proportion is 25.21 atomic %.

The EDX mapping image in FIG. 44 shows the distribution of light and dark, indicating segregation of In atoms in the cross section of the IGZO film. Here, many of the relatively light regions in the EDX mapping image have a substantially circular or elliptical shape. In addition, regions formed by connection of a plurality of regions having a substantially circular or elliptical shape are observed. In other words, regions having a substantially circular or elliptical shape are formed in a net-like manner. As described above, the relatively light regions are regions where In exists at a high concentration, and correspond to Regions A described in the above embodiment. Note that each of Regions A is not so large as to cross the analysis target region longitudinally or transversely, and is formed in an island-like manner and surrounded by a relatively dark region (corresponding to Region B described in the above embodiment). Regions with an intermediate shade are also formed between Regions A and Region B, and in some portions, the boundary between Regions A and B is not clear. Many of Regions A having a substantially circular or elliptical shape have a size in the range from approximately 0.1 nm to 5 nm.

As described above, the IGZO film of Sample B1 is a composite oxide semiconductor where In-rich Regions A and In-poor Region B are formed. Regions A contribute to the on-state current and field-effect mobility of a transistor, and Region B contributes to the switching characteristics of a transistor. Therefore, with the use of the composite oxide semiconductor, a transistor with favorable electrical characteristics can be manufactured.

Furthermore, since Regions A are formed in an island-like manner and surrounded by Region B, it is possible to suppress an increase in off-state current due to connection of a source and a drain of a transistor to each other through Regions A.

Unlike the IGZO film of Sample B1, an IGZO film of Sample C1 was formed in an atmosphere including an argon gas at 140 sccm and an oxygen gas at 60 sccm, where the substrate temperature was 170° C. Note that the other conditions for forming the IGZO film of Sample C1 are similar to those for the IGZO film of Sample B1.

Figure 45A:
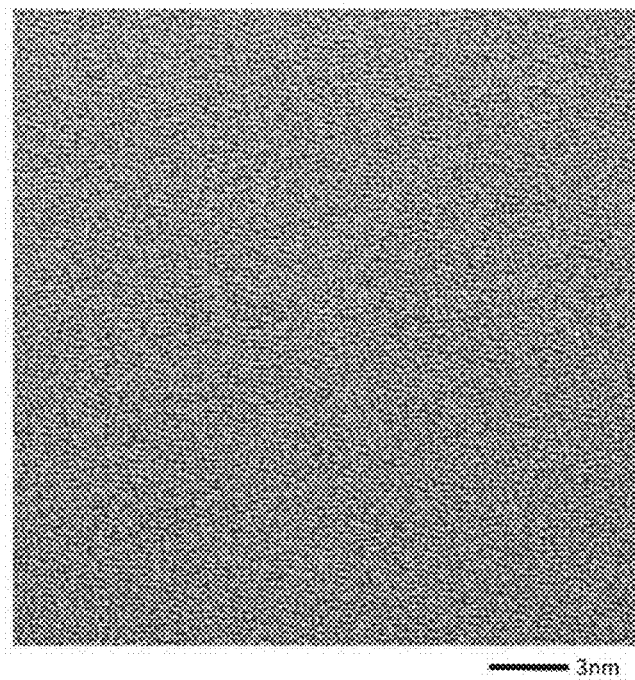
FIGS. 45A and 45B show BF-STEM images of cross sections of samples of Example.
Figure 45B:
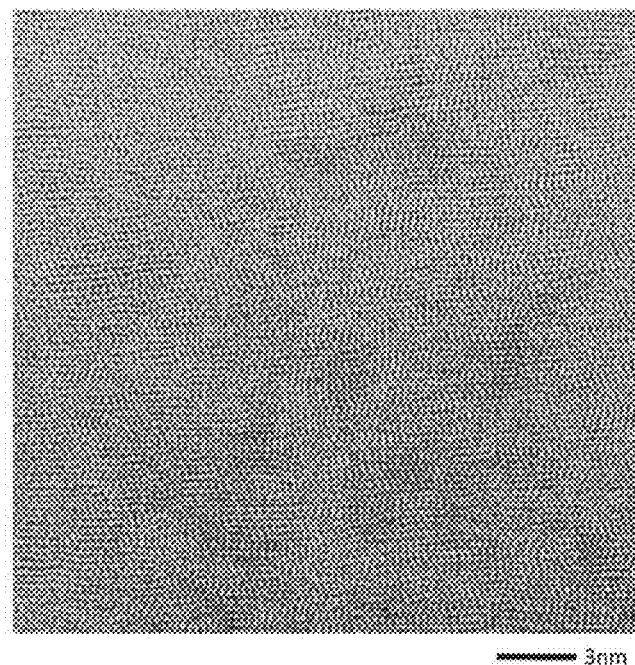

Bright-field scanning transmission electron microscopy (BF-STEM) images of cross sections of Samples B1 and C1 were taken at a magnification of 2000000 times. FIG. 45A shows the BF-STEM image of Sample B1, and FIG. 45B shows the BF-STEM image of Sample C1.

As shown in FIG. 45A, although the area is small, a layered crystal part is formed and a crystal part with c-axis alignment is also observed in the IGZO film of Sample B1. In contrast, in the IGZO film of Sample C1 shown in FIG. 45B, a layered crystal part is formed in a larger area than in the IGZO film of Sample B1. Thus, such a layered crystal part is also observed in the IGZO film of Sample B1, which shows segregation of In atoms. It is also suggested that the crystallinity of an IGZO film can possibly be improved by increasing the flow rate ratio of oxygen and increasing the substrate temperature during formation of the IGZO film.

More samples were fabricated by forming IGZO films at different oxygen flow rates and different substrate temperatures, and were subjected to crystallinity evaluation. The IGZO films of these samples were each formed at an oxygen flow rate ratio of 10% (an oxygen gas at 20 sccm and an argon gas at 180 sccm), 30% (an oxygen gas at 60 sccm and an argon gas at 140 sccm), 50% (an oxygen gas at 100 sccm and an argon gas at 100 sccm), 70% (an oxygen gas at 140 sccm and an argon gas at 60 sccm), or 100% (an oxygen gas at 200 sccm) and a substrate temperature of room temperature, 130° C., or 170° C. Note that the other conditions for forming the IGZO film of each sample are similar to those for the IGZO film of Sample B1.

The crystallinity of the IGZO film of each sample was evaluated by XRD measurement. The XRD measurement was performed using a powder method (also referred to as a θ-2θ method), which is a kind of an out-of-plane method. In a θ-2θ method, X-ray diffraction intensity is measured while an incident angle of an X-ray is changed and the angle of a detector facing an X-ray source is equal to the incident angle.

Figure 46B:
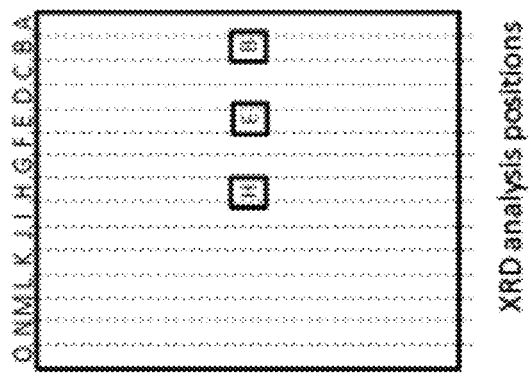
FIGS. 46A and 46B show XRD measurement results of samples of Example and XRD analysis positions.
Figure 46A:
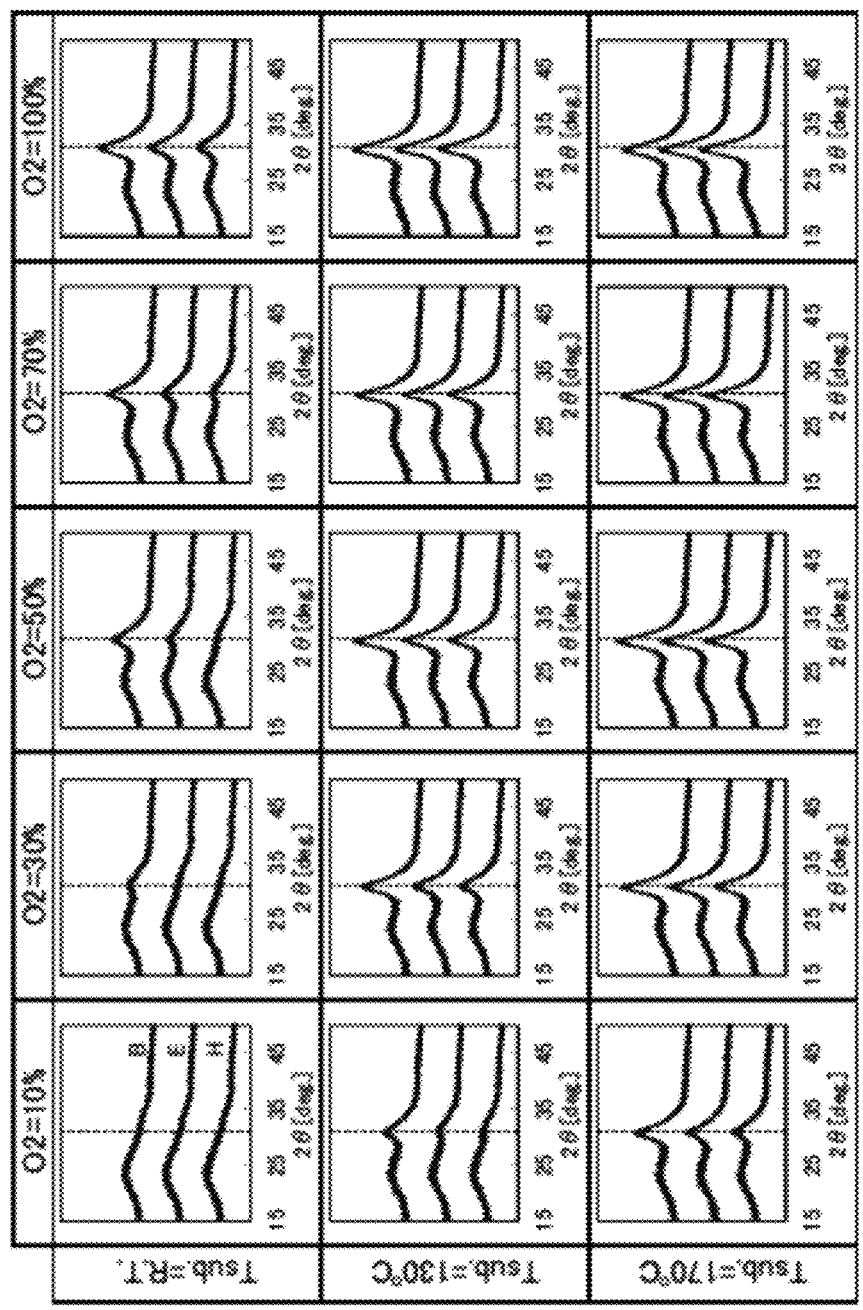

FIG. 46A shows XRD measurement results of the samples. As shown in FIG. 46B, the measurement was performed at three points within the glass substrate of each sample.

In FIG. 46A, the vertical axis represents the diffraction intensity in an arbitrary unit, and the horizontal axis represents the angle 2θ. In addition, in FIG. 46A, three XRD profiles corresponding to the three points in FIG. 46B are shown together in each graph.

As shown in FIG. 46A, from the IGZO film formed under conditions similar to those for the IGZO film of Sample B1, a diffraction intensity peak at around 2θ=31° is not clearly observed, an extremely low diffraction intensity peak at around 2θ=31° is observed, or no diffraction intensity peak at around 2θ=31° is observed. In contrast, from the IGZO film formed under conditions similar to those for the IGZO film of Sample C1, a diffraction intensity peak at around 2θ=31° is clearly observed.

Note that the diffraction angle (at around 2θ=31°) at which the diffraction intensity peak is observed corresponds to a diffraction angle on the (009) plane of the structure model of single crystal $InGaZnO_4$. Accordingly, the above-described peak observed from the IGZO film formed under conditions similar to those for the IGZO film of Sample C1 confirms that the film includes a crystal part with c-axis alignment.

In contrast, it is difficult to determine whether or not the IGZO film formed under conditions similar to those for the IGZO film of Sample B1 includes a crystal part with c-axis alignment, by XRD measurement. However, a crystal part with c-axis alignment in a microscopic region can be observed by taking a BF-STEM image or the like as shown in FIG. 45A.

As shown in FIG. 46A, the higher the oxygen flow rate ratio or the substrate temperature is during the formation of the IGZO film, the sharper the peak of its XRD profile is. This suggests that an IGZO film with higher crystallinity can be formed when the oxygen flow rate ratio or the substrate temperature is higher during formation of the IGZO film.

Note that the structure described in this example can be combined with the other example or any of the above embodiments as appropriate.

REFERENCE NUMERALS

100: transistor, 100A: transistor, 100B: transistor, 100C: transistor, 100D: transistor, 102: substrate, 104: conductive film, 106: insulating film, 108: oxide semiconductor film, 108_1: oxide semiconductor film, 108_1_0: oxide semiconductor film, 108_2: oxide semiconductor film, 108_2_0: oxide semiconductor film, 108_3: oxide semiconductor film, 108_3_0: oxide semiconductor film, 112: conductive film, 112*a*: conductive film, 112*a*_1: conductive film, 112*a*_2: conductive film, 112*a*_3: conductive film, 112*b*: conductive film, 112*b*_1: conductive film, 112*b*_2: conductive film, 112*b*_3: conductive film, 114: insulating film, 116: insulating film, 118: insulating film, 120: conductive film, 120*a*: conductive film, 120*b*: conductive film, 141*a*: opening, 141*b*: opening, 142*a*: opening, 142*b*: opening, 191: target, 192: plasma, 193: target, 194: plasma, 501: pixel circuit, 502: pixel portion, 504: driver circuit portion, 504*a*: gate driver, 504*b*: source driver, 506: protection circuit, 507: terminal portion, 550: transistor, 552: transistor, 554: transistor, 560: capacitor, 562: capacitor, 570: liquid crystal element, 572: light-emitting element, 700: display device, 701: first substrate, 702: pixel portion, 704: source driver circuit portion, 705: second substrate, 706: gate driver circuit portion, 708: FPC terminal portion, 710: signal line, 711: lead wiring portion, 712: sealant, 716: FPC, 730: insulating film, 732: sealing film, 734: insulating film, 736: coloring film, 738: light-blocking film, 750: transistor, 752: transistor, 760: connection electrode, 770: planarization insulating film, 772: conductive film, 773: insulating film, 774: conductive film, 775: liquid crystal element, 776: liquid crystal layer, 777: conductive film, 778: structure, 780: anisotropic conductive film, 782: light-emitting element, 786: EL layer, 788: conductive film, 790: capacitor, 791: touch panel, 792: insulating film, 793: electrode, 794: electrode, 795: insulating film, 796: electrode, 797: insulating film, 2500a: target, 2500b: target, 2501: deposition chamber, 2510a: backing plate, 2510b: backing plate, 2520: target holder, 2520a: target holder, 2520b: target holder, 2530a: magnet unit, 2530b: magnet unit, 2530N1: magnet, 2530N2: magnet, 2530S: magnet, 2532: magnet holder, 2542: member, 2560: substrate, 2570: substrate holder, 2580a: magnetic line of force, 2580b: magnetic line of force, 7000: display module, 7001: upper cover, 7002: lower cover, 7003: FPC, 7004: touch panel, 7005: FPC, 7006: display panel, 7007: backlight, 7008: light source, 7009: frame, 7010: printed-circuit board, 7011: battery, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: object for fixing, 8305: lens, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television device, 9101: portable information terminal, 9102: portable information terminal, 9200: portable information terminal, 9201: portable information terminal, 9500: display device, 9501: display panel, 9502: display region, 9503: region, 9511: hinge, 9512: bearing.

This application is based on Japanese Patent Application serial no. 2016-041739 filed with Japan Patent Office on Mar. 4, 2016, Japanese Patent Application serial no. 2016-048706 filed with Japan Patent Office on Mar. 11, 2016, Japanese Patent Application serial no. 2016-125377 filed with Japan Patent Office on Jun. 24, 2016, and Japanese Patent Application serial no. 2016-125381 filed with Japan Patent Office on Jun. 24, 2016, the entire contents of which are hereby incorporated by reference.

What is claimed is:

1. A semiconductor device comprising:
a substrate;
a first conductive layer over the substrate;
a first insulating layer over the first conductive layer;
an oxide semiconductor layer over the first insulating layer;
a second conductive layer over the oxide semiconductor layer;
a third conductive layer over the oxide semiconductor layer; and
a second insulating layer over the second conductive layer and the third conductive layer,
wherein the oxide semiconductor layer comprises a first oxide semiconductor film and a second oxide semiconductor film,
wherein the second oxide semiconductor film comprises a region having lower crystallinity than the first oxide semiconductor film,
wherein the second oxide semiconductor film is a composite oxide semiconductor,
wherein the composite oxide semiconductor comprises:
a first region comprising $In_aM_bZn_cO_d$; and
a second region comprising $In_xZn_yO_z$,
wherein the a, b, c, d, x, y, and z each represent a given number,
wherein the M represents Al, Ga, Y, or Sn, and
wherein a concentration of indium in the second region is higher than a concentration of indium in the first region.

2. A semiconductor device comprising:
a substrate;
an oxide semiconductor layer over the substrate;
a first conductive layer electrically connected to the oxide semiconductor layer;
a second conductive layer electrically connected to the oxide semiconductor layer;
a first insulating layer over the oxide semiconductor layer;
a third conductive layer over the first insulating layer; and
a second insulating layer over the third conductive layer,
wherein the oxide semiconductor layer comprises a first oxide semiconductor film and a second oxide semiconductor film,
wherein the second oxide semiconductor film comprises a region having lower crystallinity than the first oxide semiconductor film,
wherein the second oxide semiconductor film is a composite oxide semiconductor,
wherein the composite oxide semiconductor comprises:
a first region comprising $In_aM_bZn_cO_d$; and
a second region comprising $In_xZn_yO_z$,
wherein the a, b, c, d, x, y, and z each represent a given number,
wherein the M represents Al, Ga, Y, or Sn,
wherein the first region and the second region have different compositions,
wherein the second region has an island-like shape, and
wherein the second region is surrounded by the first region.

3. A semiconductor device comprising:
a substrate;
a first conductive layer over the substrate;
a first insulating layer over the first conductive layer;
an oxide semiconductor layer over the first insulating layer;
a second conductive layer over the oxide semiconductor layer;
a third conductive layer over the oxide semiconductor layer; and
a second insulating layer over the second conductive layer and the third conductive layer,
wherein the oxide semiconductor layer comprises a first region and a second region, the first region having lower crystallinity than the second region,
wherein the oxide semiconductor layer is a composite oxide semiconductor,
wherein the composite oxide semiconductor comprises:
a third region comprising $In_aM_bZn_cO_d$; and
a plurality of fourth regions comprising $In_xZn_yO_z$,
wherein the a, b, c, d, x, y, and z each represent a given number,
wherein the M represents Al, Ga, Y, or Sn,
wherein a composition of the third region is different from compositions of the plurality of fourth regions, and
wherein the plurality of fourth regions is unevenly distributed in the third region.

4. The semiconductor device according to claim 1,
wherein at least part of the oxide semiconductor layer is formed with a target comprising In, the M, and Zn, and
wherein an atomic ratio of the In to the M to the Zn in the target is In:M:Zn=4:2:4.1.

5. The semiconductor device according to claim 2,
wherein at least part of the oxide semiconductor layer is formed with a target comprising In, the M, and Zn, and
wherein an atomic ratio of the In to the M to the Zn in the target is In:M:Zn=4:2:4.1.

6. The semiconductor device according to claim 3,
wherein at least part of the oxide semiconductor layer is formed with a target comprising In, the M, and Zn, and
wherein an atomic ratio of the In to the M to the Zn in the target is In:M:Zn=4:2:4.1.

7. The semiconductor device according to claim 1, further comprising:
a third insulating layer over the second insulating layer.

8. The semiconductor device according to claim 2, further comprising:
a third insulating layer over the second insulating layer.

9. The semiconductor device according to claim 3, further comprising:
a third insulating layer over the second insulating layer.

10. The semiconductor device according to claim 1,
wherein the first conductive layer functions as a gate electrode,
wherein the second conductive layer functions as one of a source and a drain, and
wherein the third conductive layer functions as the other of the source and the drain.

11. The semiconductor device according to claim 3,
wherein the first conductive layer functions as a gate electrode,
wherein the second conductive layer functions as one of a source and a drain, and
wherein the third conductive layer functions as the other of the source and the drain.

12. The semiconductor device according to claim 2,
wherein the third conductive layer functions as a gate electrode,
wherein the second conductive layer functions as one of a source and a drain, and
wherein the first conductive layer functions as the other of the source and the drain.

13. The semiconductor device according to claim 1,
wherein the second region has a size of greater than or equal to 0.1 nm and less than or equal to 5 nm in an EDX mapping image of a cross-sectional view of the oxide semiconductor layer.

14. The semiconductor device according to claim 2,
wherein the second region has a size of greater than or equal to 0.1 nm and less than or equal to 5 nm in an EDX mapping image of a cross-sectional view of the oxide semiconductor layer.

15. The semiconductor device according to claim 3,
wherein one of the plurality of fourth regions has a size of greater than or equal to 0.1 nm and less than or equal to 5 nm in an EDX mapping image of a cross-sectional view of the oxide semiconductor layer.

16. The semiconductor device according to claim 1,
wherein the second region has a size of greater than or equal to 0.3 nm and less than or equal to 3 nm in an EDX mapping image of a cross-sectional view of the oxide semiconductor layer.

17. The semiconductor device according to claim 2,
wherein the second region has a size of greater than or equal to 0.3 nm and less than or equal to 3 nm in an EDX mapping image of a cross-sectional view of the oxide semiconductor layer.

18. The semiconductor device according to claim 3,
wherein one of the plurality of fourth regions has a size of greater than or equal to 0.3 nm and less than or equal to 3 nm in an EDX mapping image of a cross-sectional view of the oxide semiconductor layer.

* * * * *